(12) United States Patent
Yamazaki et al.

(10) Patent No.: US 8,729,620 B2
(45) Date of Patent: *May 20, 2014

(54) NONVOLATILE SEMICONDUCTOR MEMORY DEVICE

(75) Inventors: Shunpei Yamazaki, Setagaya (JP); Yoshinobu Asami, Atsugi (JP); Tamae Takano, Atsugi (JP); Makoto Furuno, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 770 days.

This patent is subject to a terminal disclaimer.

(21) Appl. No.: 11/723,483

(22) Filed: Mar. 20, 2007

(65) Prior Publication Data

US 2007/0235793 A1    Oct. 11, 2007

(30) Foreign Application Priority Data

Mar. 21, 2006 (JP) ................................ 2006-077894

(51) Int. Cl.
*H01L 29/788* (2006.01)
(52) U.S. Cl.
USPC ........... 257/315; 257/314; 257/316; 257/324; 257/E29.3
(58) Field of Classification Search
USPC ................................. 257/314–316, 324, 319
See application file for complete search history.

(56) References Cited

U.S. PATENT DOCUMENTS

| | | | |
|---|---|---|---|
| 3,878,549 A | 4/1975 | Yamazaki et al. | |
| 3,996,657 A | 12/1976 | Simko et al. | |
| 4,630,086 A | 12/1986 | Sato et al. | |
| 4,794,565 A | * 12/1988 | Wu et al. | 365/185.15 |
| 4,809,056 A | 2/1989 | Shirato et al. | |
| 5,448,513 A | 9/1995 | Hu et al. | |

(Continued)

FOREIGN PATENT DOCUMENTS

| | | |
|---|---|---|
| CN | 1467815 | 1/2004 |
| CN | 1467851 | 1/2004 |

(Continued)

OTHER PUBLICATIONS

European Search Report (Application No. 07005513.2) dated Jul. 10, 2007.

(Continued)

*Primary Examiner* — Kenneth Parker
*Assistant Examiner* — Jose R Diaz
(74) *Attorney, Agent, or Firm* — Eric J. Robinson; Robinson Intellectual Property Law Office, P.C.

(57) ABSTRACT

It is an object to provide a nonvolatile semiconductor memory device having excellent writing property and charge-retention property. A semiconductor layer including a channel forming region between a pair of impurity regions which are formed to be apart from each other is provided. In an upper layer portion thereof, a first insulating layer, a floating gate, a second insulating layer, and a control gate are provided. The floating gate has at least a two-layer structure, and a first layer in contact with the first insulating layer preferably has a band gap smaller than that of the semiconductor layer. Furthermore, by setting an energy level at the bottom of the conduction band of the floating gate lower than that of the channel forming region of the semiconductor layer, injectability of carriers and a charge-retention property can be improved.

31 Claims, 46 Drawing Sheets

(56) References Cited

U.S. PATENT DOCUMENTS

| | | |
|---|---|---|
| 5,471,422 A | 11/1995 | Chang et al. |
| 5,508,543 A | 4/1996 | Hartstein et al. |
| 5,517,300 A | 5/1996 | Parker et al. |
| 5,808,336 A | 9/1998 | Miyawaki |
| 5,912,487 A * | 6/1999 | Hong .................. 257/315 |
| 6,090,666 A | 7/2000 | Ueda et al. |
| 6,287,988 B1 | 9/2001 | Nagamine et al. |
| 6,324,101 B1 | 11/2001 | Miyawaki |
| 6,384,448 B1 | 5/2002 | Forbes |
| 6,388,291 B1 | 5/2002 | Zhang et al. |
| 6,417,538 B1 | 7/2002 | Choi |
| 6,498,369 B1 | 12/2002 | Yamazaki et al. |
| 6,518,594 B1 | 2/2003 | Nakajima et al. |
| 6,551,948 B2 | 4/2003 | Ohmi et al. |
| 6,586,797 B2 | 7/2003 | Forbes et al. |
| 6,597,034 B2 | 7/2003 | Yamazaki et al. |
| 6,613,630 B2 | 9/2003 | Lee |
| 6,646,288 B2 | 11/2003 | Yamazaki et al. |
| 6,669,825 B2 | 12/2003 | Ohmi et al. |
| 6,686,623 B2 | 2/2004 | Yamazaki |
| 6,699,754 B2 | 3/2004 | Huang |
| 6,713,834 B2 | 3/2004 | Mori et al. |
| 6,756,640 B2 | 6/2004 | Yamazaki et al. |
| 6,774,430 B2 | 8/2004 | Horiguchi et al. |
| 6,812,086 B2 | 11/2004 | Murthy et al. |
| 6,828,623 B1 | 12/2004 | Guo et al. |
| 6,838,394 B2 | 1/2005 | Ohmi et al. |
| 6,846,753 B2 | 1/2005 | Ohmi et al. |
| 6,861,689 B2 | 3/2005 | Burnett |
| 6,864,124 B2 | 3/2005 | Lee et al. |
| 6,888,191 B2 | 5/2005 | Aoki |
| 6,914,302 B2 | 7/2005 | Ohtani et al. |
| 6,943,403 B2 | 9/2005 | Park |
| 6,955,968 B2 | 10/2005 | Forbes et al. |
| 6,984,863 B2 | 1/2006 | Miida |
| 6,998,354 B2 | 2/2006 | Ohmi et al. |
| 6,998,355 B2 | 2/2006 | Ohmi et al. |
| 7,001,855 B2 | 2/2006 | Ohmi et al. |
| 7,026,681 B2 | 4/2006 | Ohmi et al. |
| 7,071,512 B2 | 7/2006 | Nakagawa et al. |
| 7,098,147 B2 | 8/2006 | Nansei et al. |
| 7,098,504 B2 | 8/2006 | Kawashima et al. |
| 7,109,083 B2 | 9/2006 | Ohmi et al. |
| 7,157,773 B2 | 1/2007 | Kato et al. |
| 7,166,510 B2 * | 1/2007 | Lee .................. 438/257 |
| 7,189,624 B2 | 3/2007 | Ito |
| 7,221,029 B2 | 5/2007 | Miida |
| 7,245,010 B2 | 7/2007 | Powell et al. |
| 7,301,216 B2 | 11/2007 | Lee et al. |
| 7,391,075 B2 | 6/2008 | Jeon et al. |
| 7,465,677 B2 | 12/2008 | Isobe et al. |
| 7,482,651 B2 | 1/2009 | Bhattacharyya |
| 7,485,526 B2 | 2/2009 | Mouli et al. |
| 7,541,236 B2 | 6/2009 | Takahashi et al. |
| 7,541,676 B2 | 6/2009 | Lee et al. |
| 7,554,854 B2 | 6/2009 | Osame et al. |
| 7,560,767 B2 | 7/2009 | Yasuda et al. |
| 7,652,321 B2 | 1/2010 | Yamaguchi et al. |
| 7,760,552 B2 | 7/2010 | Miyake et al. |
| 7,842,992 B2 * | 11/2010 | Yamazaki et al. .......... 257/315 |
| 2002/0079533 A1 | 6/2002 | Horiguchi et al. |
| 2002/0093045 A1 | 7/2002 | Forbes |
| 2002/0093073 A1 | 7/2002 | Mori et al. |
| 2002/0094640 A1 | 7/2002 | Forbes |
| 2002/0113262 A1 | 8/2002 | Forbes |
| 2002/0153569 A1 | 10/2002 | Katayama |
| 2002/0175376 A1 | 11/2002 | Ohtani et al. |
| 2002/0179964 A1 | 12/2002 | Kato et al. |
| 2002/0185674 A1 | 12/2002 | Kawashima et al. |
| 2003/0049900 A1 | 3/2003 | Forbes et al. |
| 2003/0107077 A1 | 6/2003 | Yamazaki et al. |
| 2004/0043638 A1 | 3/2004 | Nansei et al. |
| 2004/0104426 A1 | 6/2004 | Forbes et al. |
| 2004/0119110 A1 | 6/2004 | Park |
| 2005/0023577 A1 | 2/2005 | Ito |
| 2005/0095786 A1 | 5/2005 | Chang et al. |
| 2005/0112820 A1 | 5/2005 | Chen et al. |
| 2005/0194645 A1 | 9/2005 | Yamaguchi et al. |
| 2005/0230743 A1 | 10/2005 | Nakagawa et al. |
| 2005/0263767 A1 | 12/2005 | Yamazaki et al. |
| 2006/0003531 A1 | 1/2006 | Chang et al. |
| 2006/0008995 A1 | 1/2006 | Takahashi et al. |
| 2006/0043463 A1 | 3/2006 | Liu et al. |
| 2006/0118858 A1 | 6/2006 | Jeon et al. |
| 2006/0186458 A1 | 8/2006 | Forbes et al. |
| 2006/0237770 A1 * | 10/2006 | Huang et al. .................. 257/315 |
| 2006/0246738 A1 | 11/2006 | Isobe et al. |
| 2006/0252205 A1 | 11/2006 | Kawashima et al. |
| 2007/0132004 A1 | 6/2007 | Yasuda et al. |
| 2007/0132010 A1 | 6/2007 | Bhattacharyya |
| 2007/0200167 A1 | 8/2007 | Yamazaki |
| 2007/0221971 A1 | 9/2007 | Yamazaki et al. |
| 2007/0221985 A1 | 9/2007 | Yamazaki et al. |
| 2007/0228448 A1 | 10/2007 | Yamazaki et al. |
| 2007/0228449 A1 | 10/2007 | Takano et al. |
| 2007/0228452 A1 | 10/2007 | Asami |
| 2007/0228453 A1 | 10/2007 | Yamazaki et al. |
| 2007/0230254 A1 | 10/2007 | Osame et al. |
| 2007/0235794 A1 * | 10/2007 | Yamazaki et al. ............ 257/314 |
| 2008/0220573 A1 | 9/2008 | Takahashi et al. |
| 2009/0194803 A1 | 8/2009 | Yamazaki et al. |
| 2009/0257283 A1 | 10/2009 | Osame et al. |
| 2010/0159661 A1 | 6/2010 | Yamazaki |

FOREIGN PATENT DOCUMENTS

| | | |
|---|---|---|
| CN | 1224104 | 10/2005 |
| EP | 0681333 A | 11/1995 |
| EP | 0 682 370 | 9/2000 |
| EP | 1265276 A | 12/2002 |
| EP | 1265279 A | 12/2002 |
| EP | 1349215 A | 10/2003 |
| EP | 1912253 A | 4/2008 |
| JP | 51-007036 | 3/1976 |
| JP | 52-023532 | 6/1977 |
| JP | 55-015869 | 4/1980 |
| JP | 03-119765 | 5/1991 |
| JP | 03-153085 A | 7/1991 |
| JP | 05-075136 A | 3/1993 |
| JP | 06-097454 | 4/1994 |
| JP | 06-244432 | 9/1994 |
| JP | 07-302848 A | 11/1995 |
| JP | 08-097307 | 4/1996 |
| JP | 2656986 | 9/1997 |
| JP | 10-135357 | 5/1998 |
| JP | 11-040682 | 2/1999 |
| JP | 2000-058685 | 2/2000 |
| JP | 2002-164536 A | 6/2002 |
| JP | 2002-198446 A | 7/2002 |
| JP | 2004-006658 A | 1/2004 |
| JP | 2004-221448 | 8/2004 |
| JP | 2005-294814 A | 10/2005 |
| JP | 2005-347328 | 12/2005 |
| JP | 2006-114905 | 4/2006 |
| KR | 2002-0041282 A | 6/2002 |
| WO | WO01/69665 | 9/2001 |

OTHER PUBLICATIONS

Chinese Office Action (Application No. 200710087894.2) Dated Jul. 20, 2011.

Taiwanese Office Action (Application No. 096108773) Dated Feb. 19, 2013.

Korean Office Action (Application No. 2007-0025563) Dated Jun. 11, 2013.

* cited by examiner

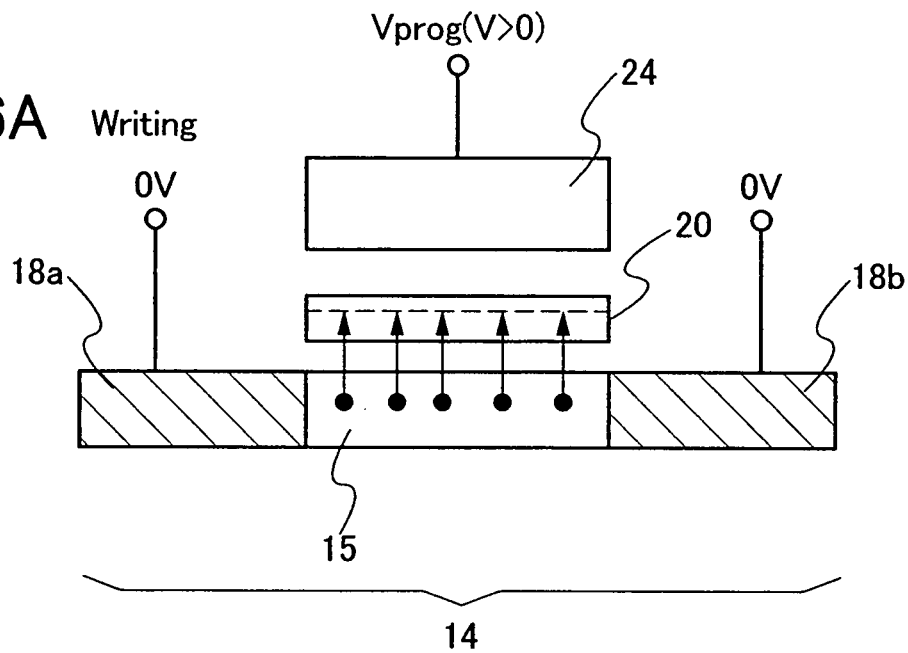
FIG. 6A Writing
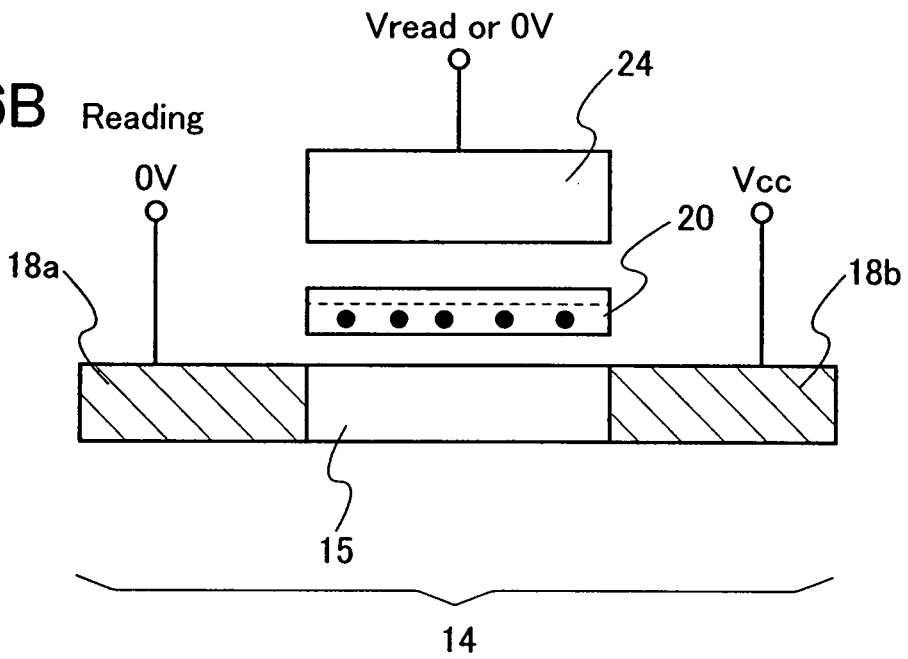
FIG. 6B Reading

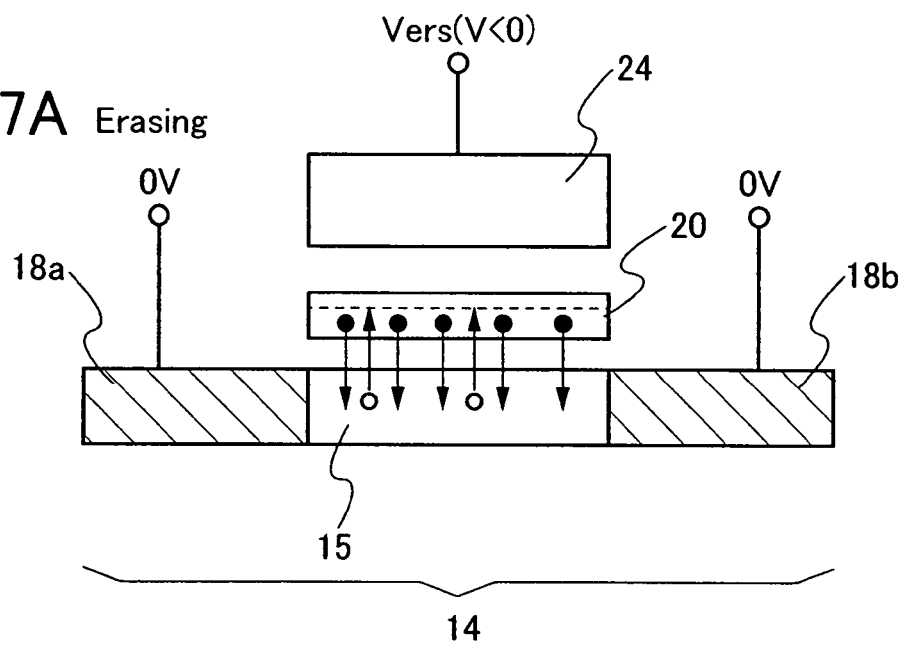
FIG. 7A Erasing
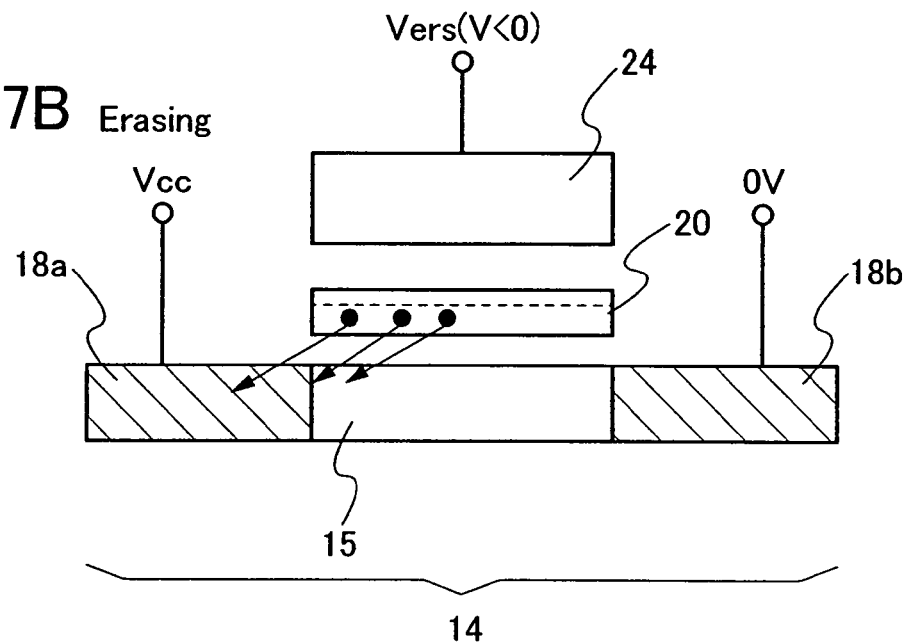
FIG. 7B Erasing

FIG. 8
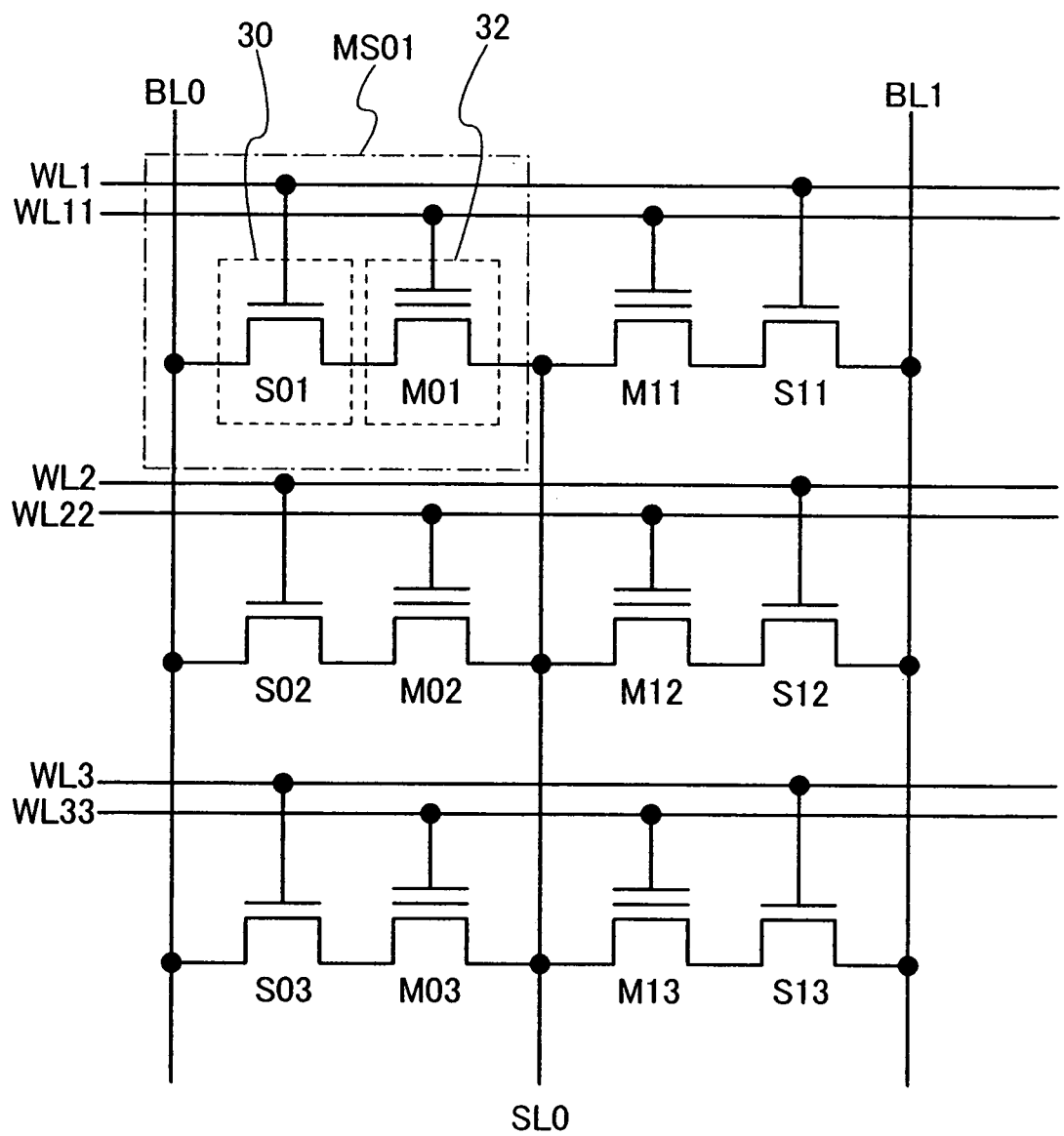
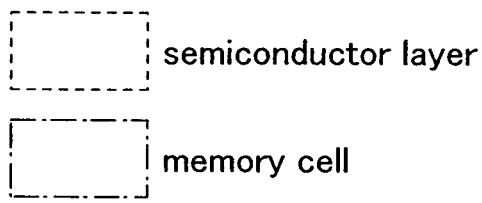

FIG. 9
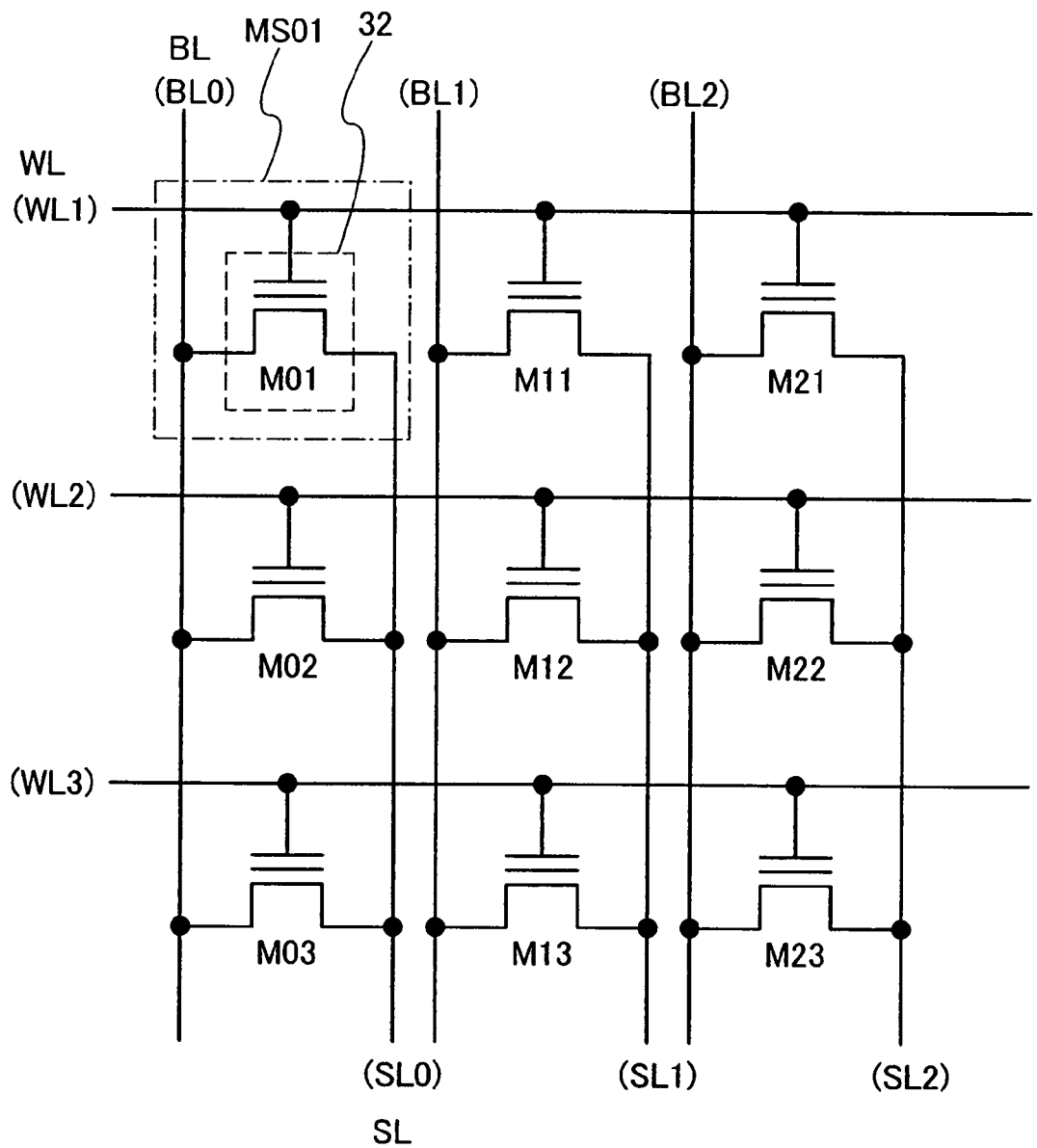
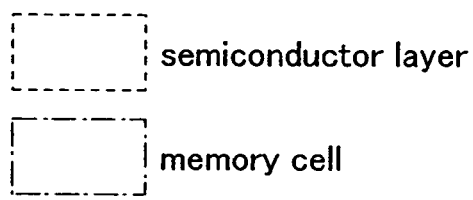

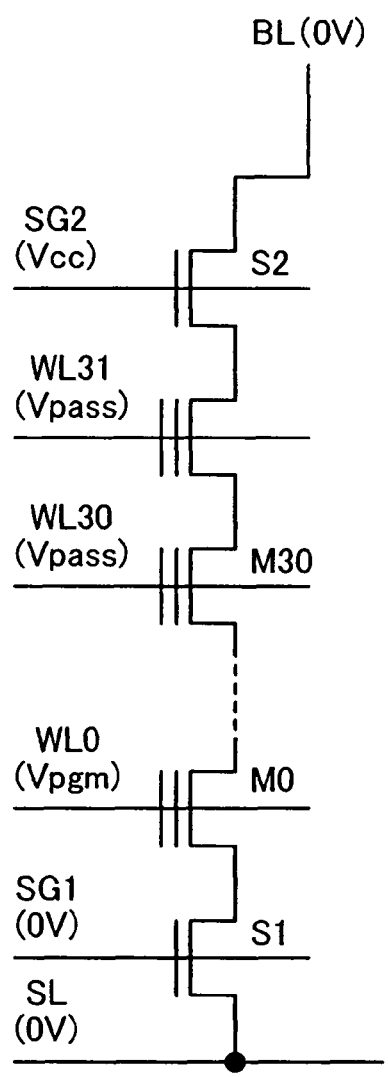
FIG. 11A "0" Writing
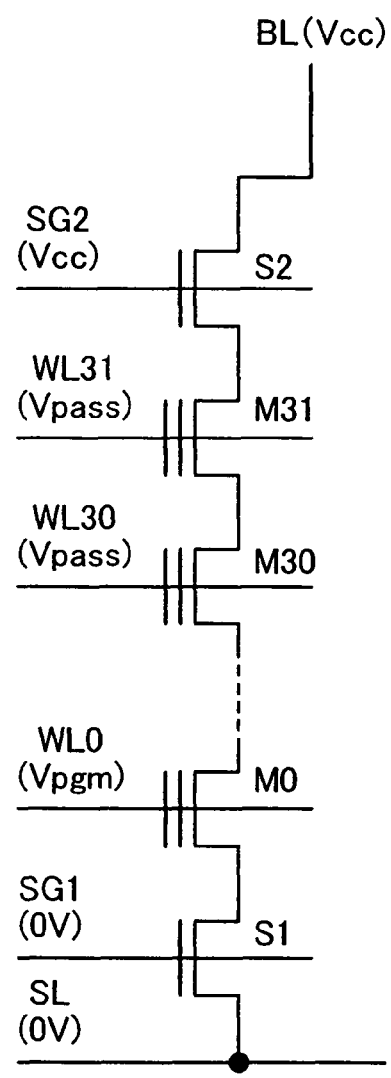
FIG. 11B "1" Writing

FIG. 12A  Erasing
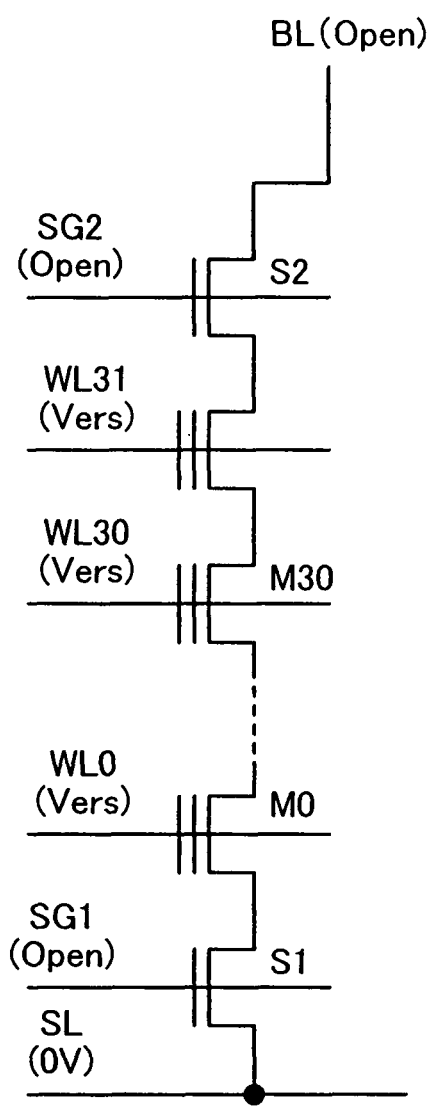
FIG. 12B  Reading
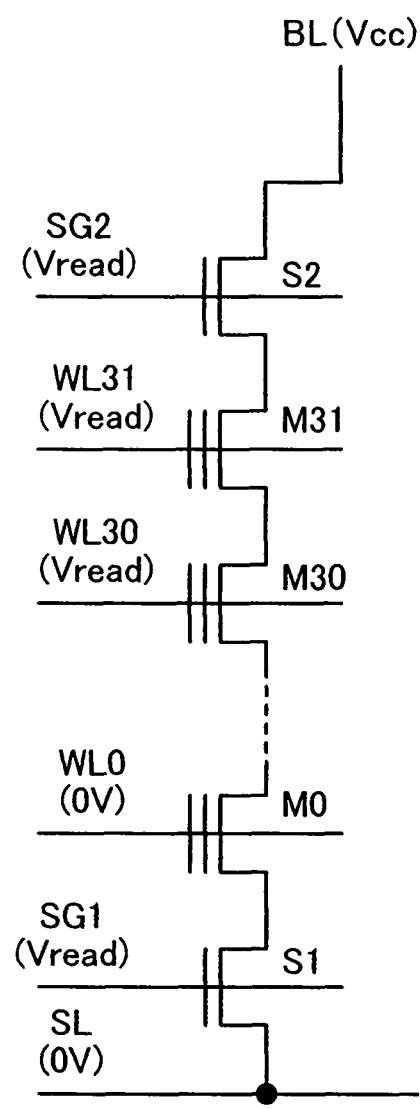

PRIOR ART

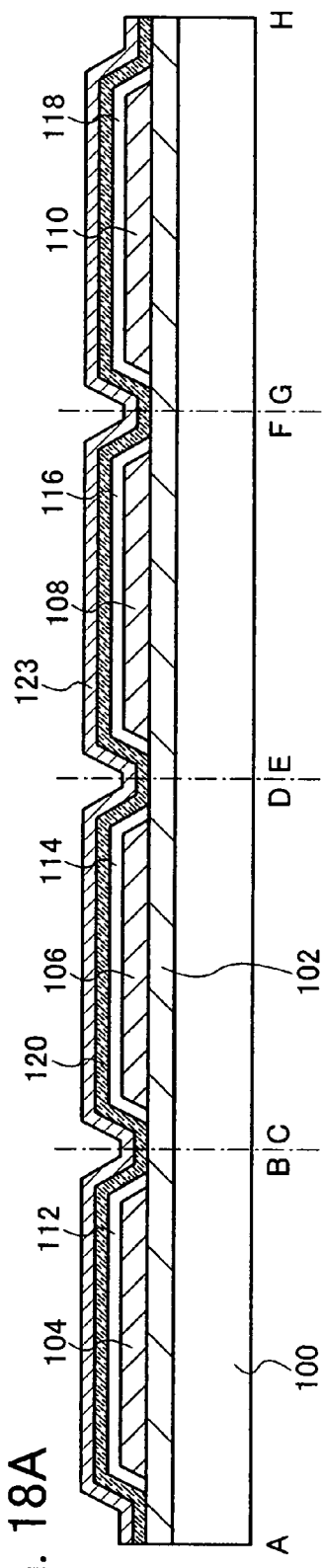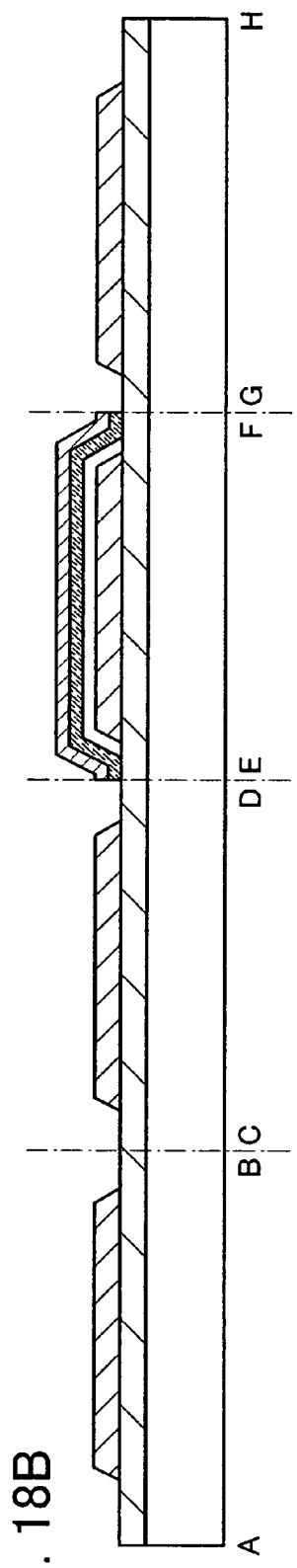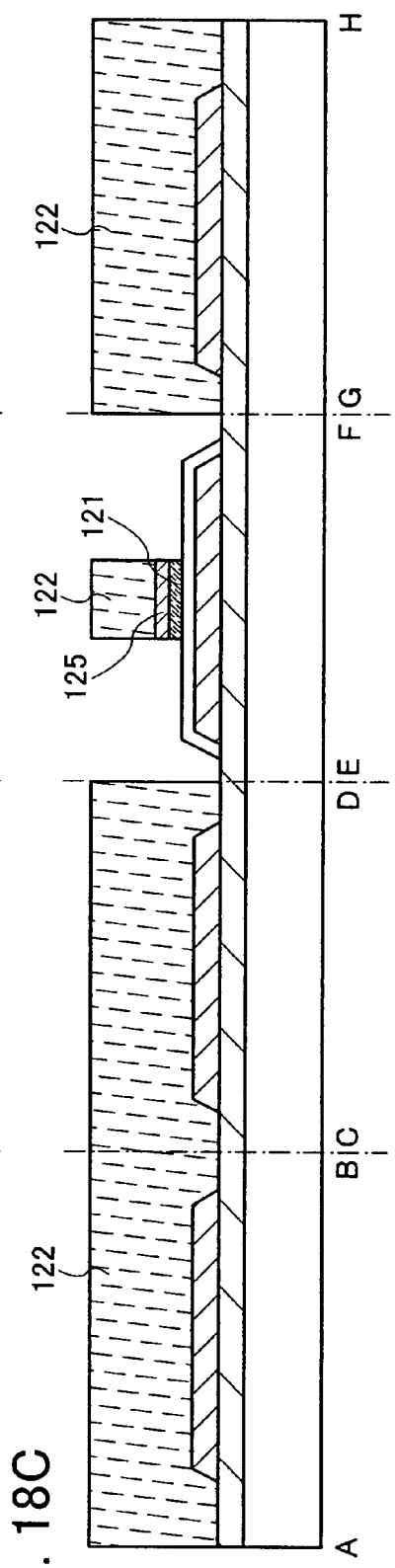

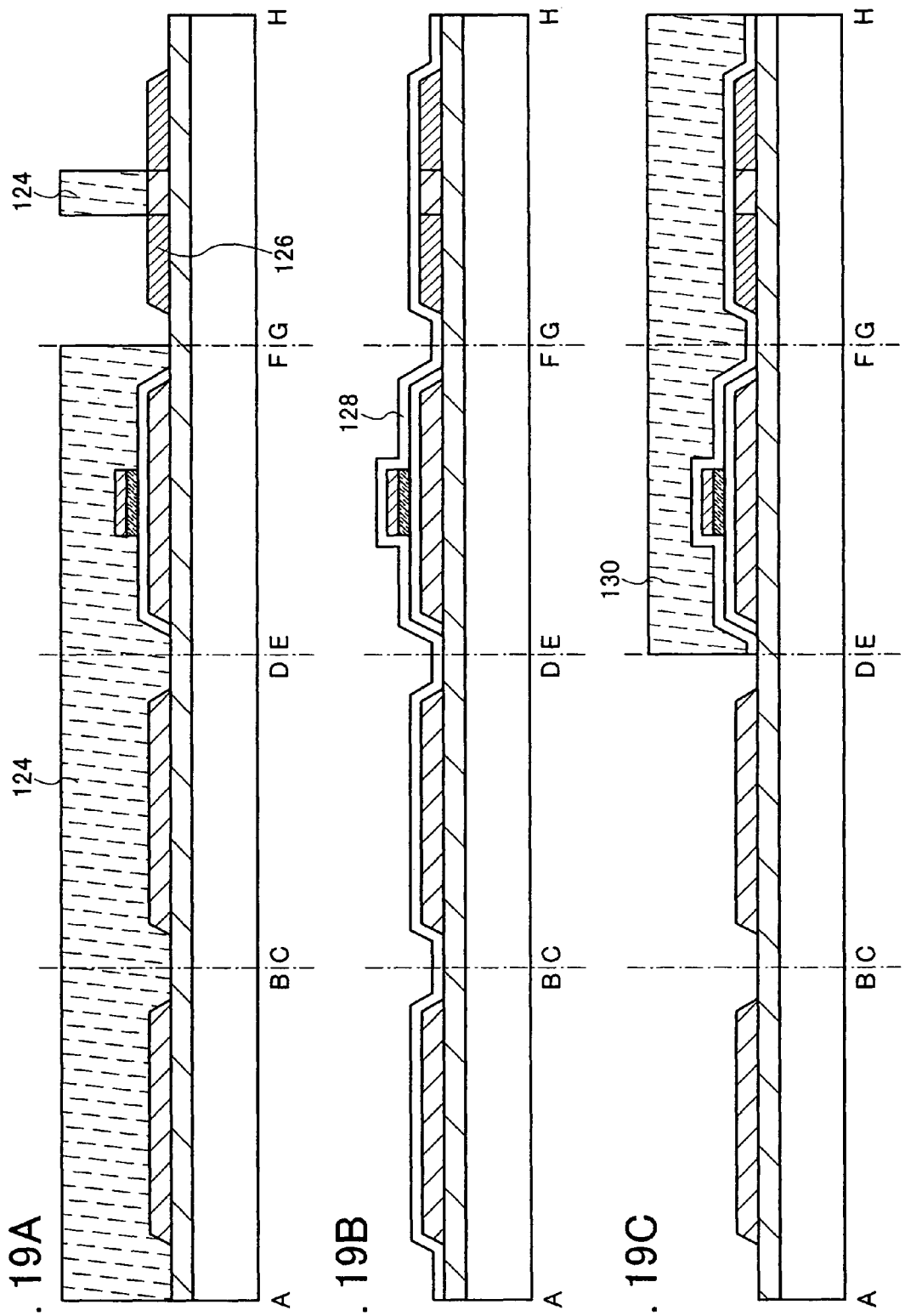

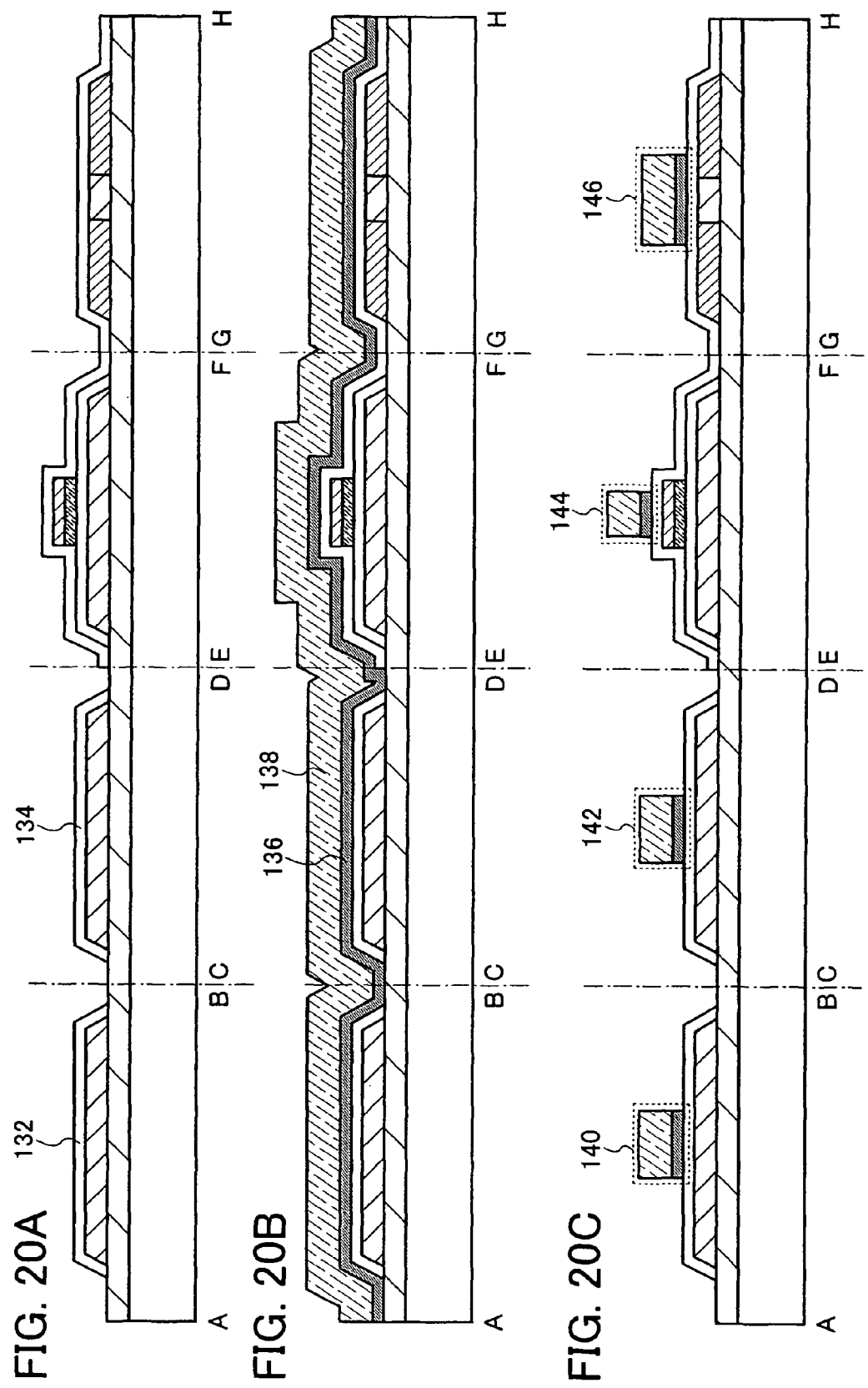

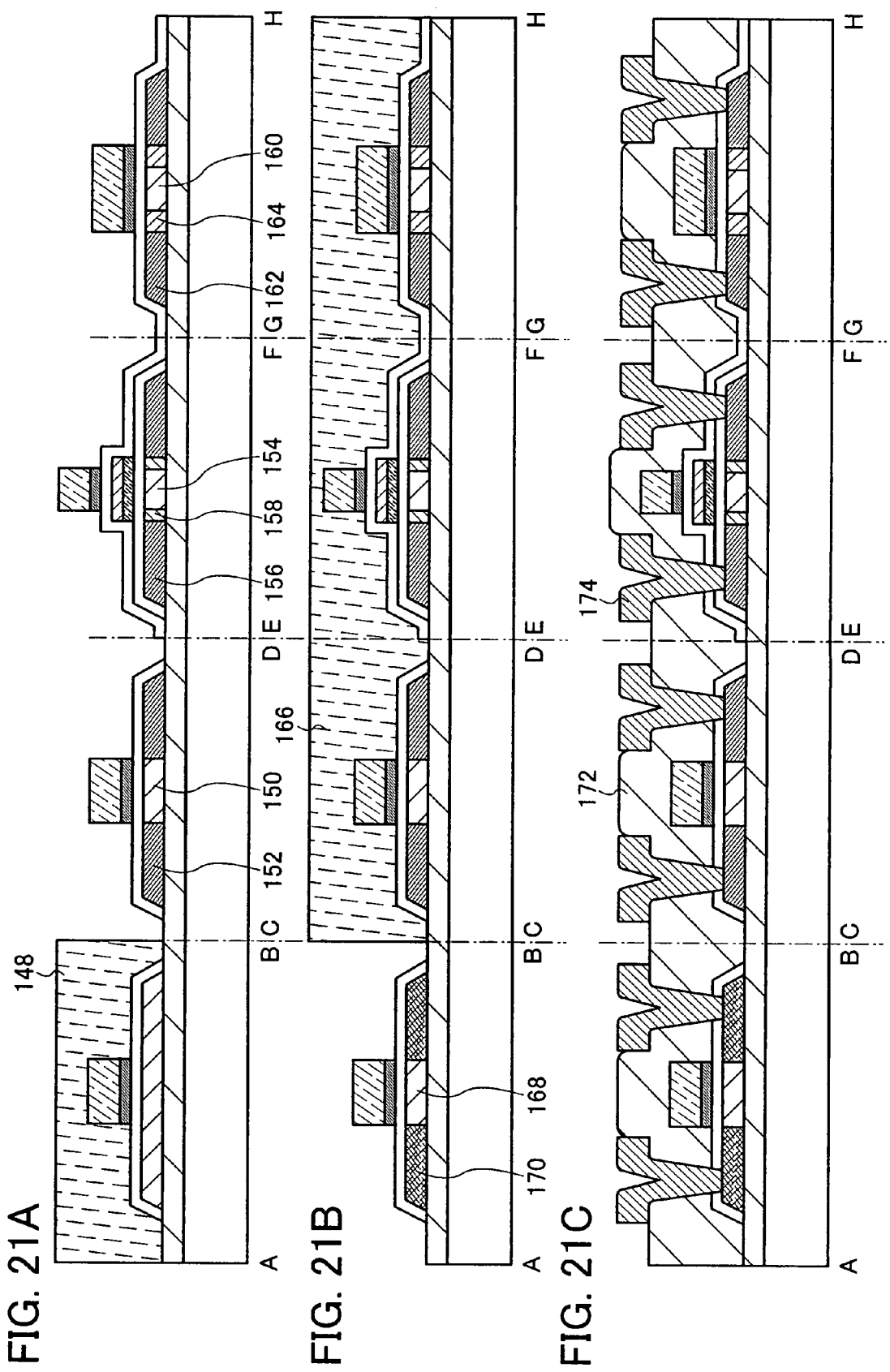

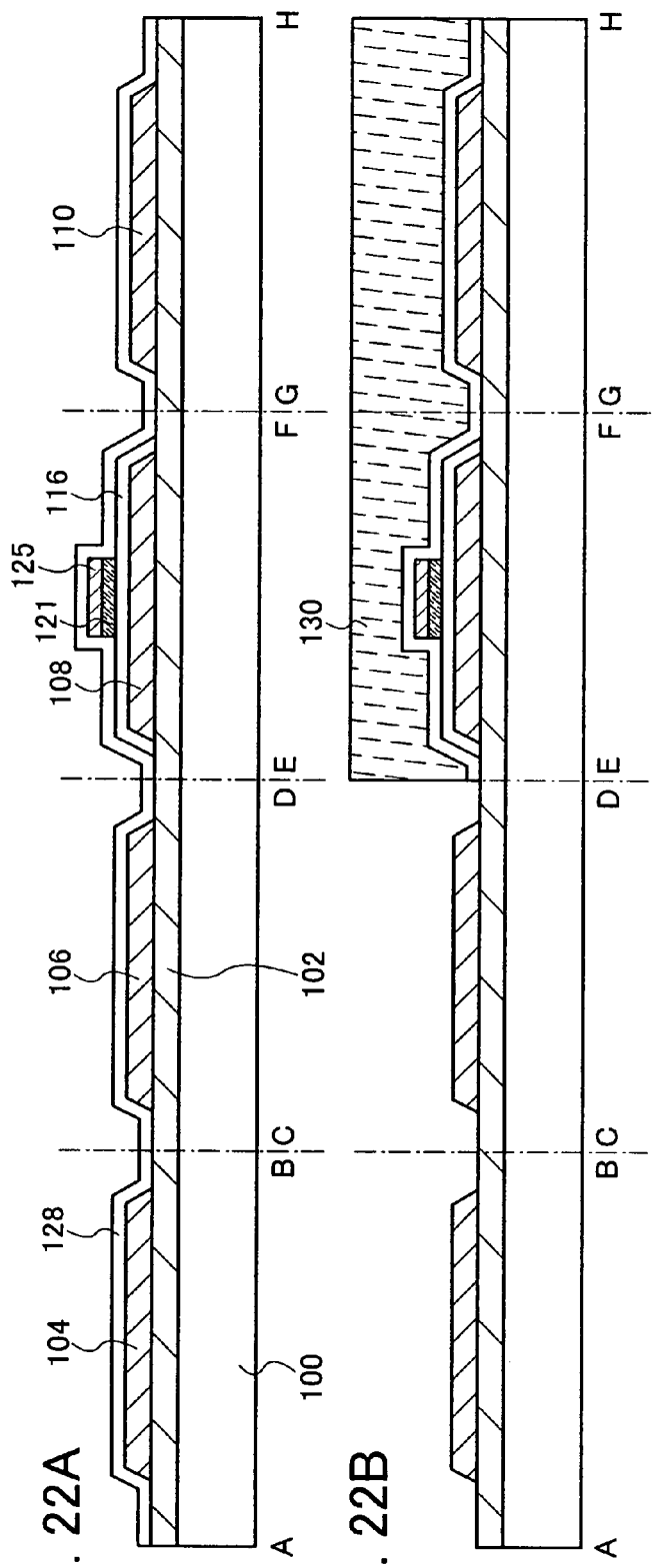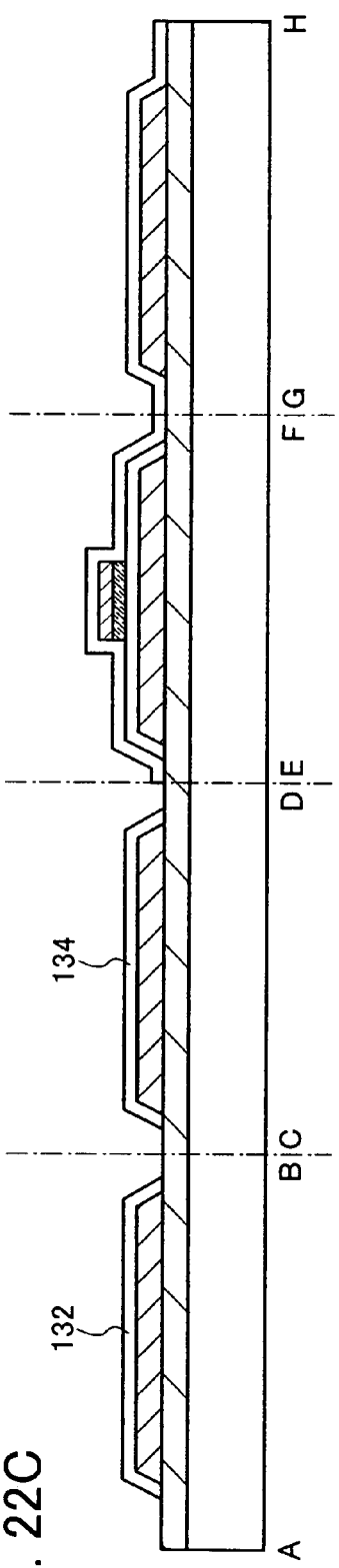

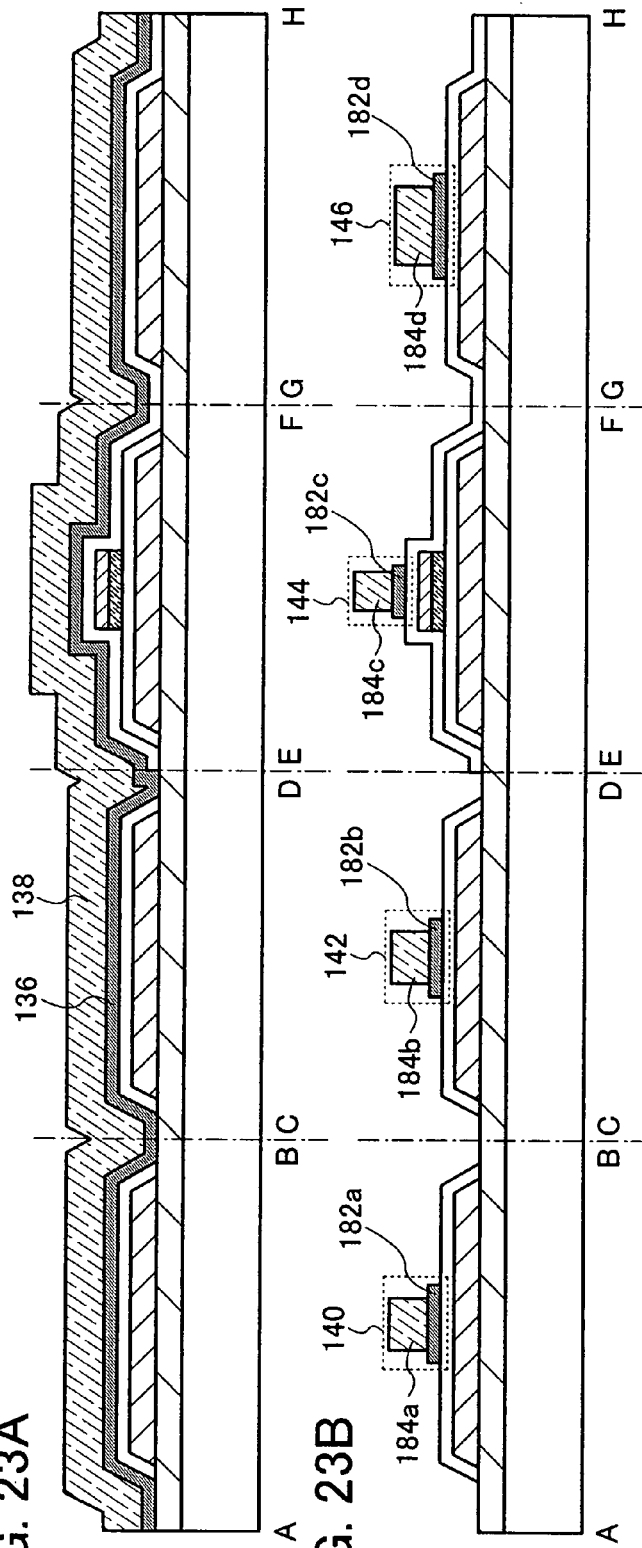

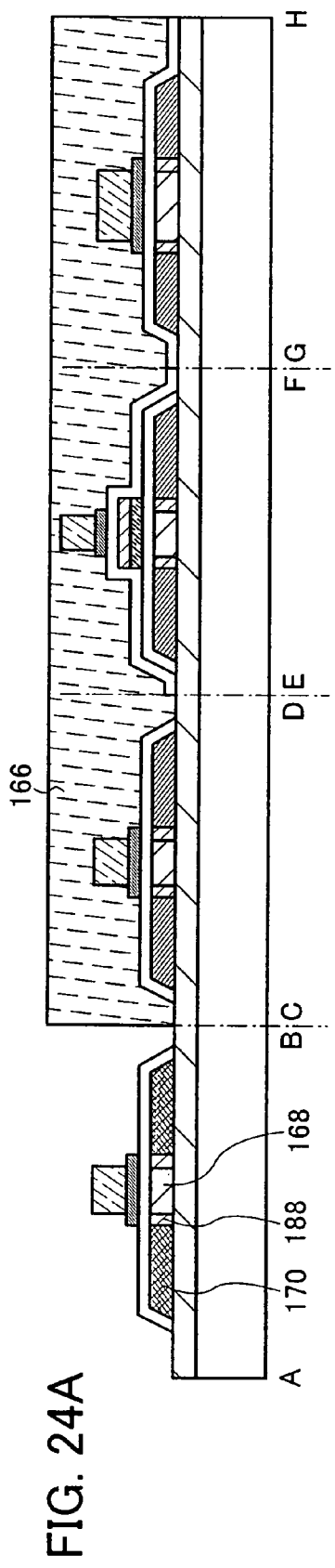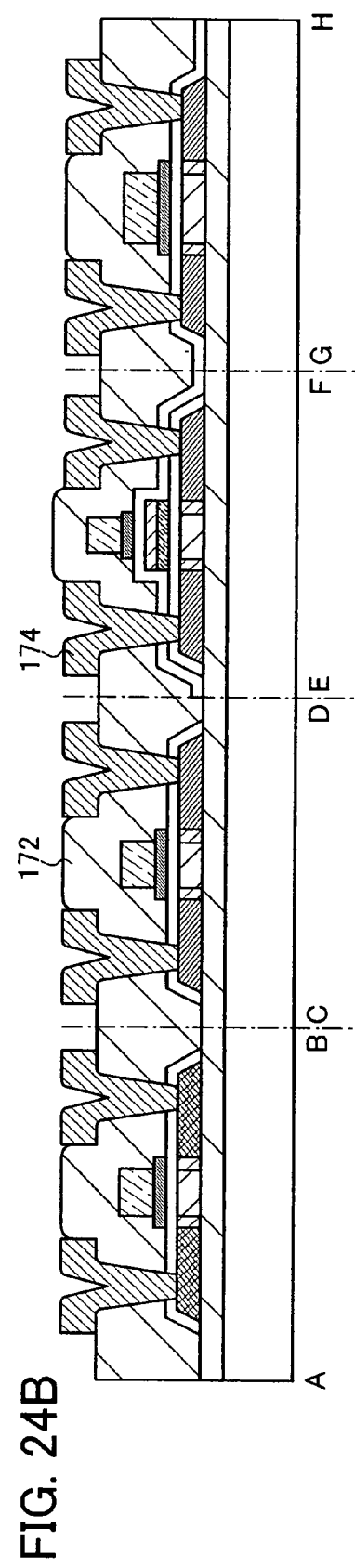

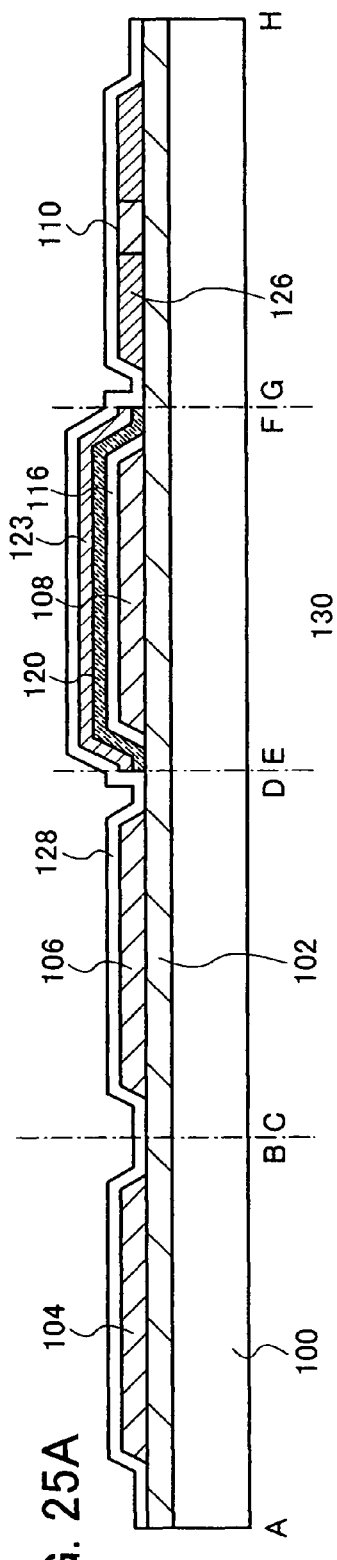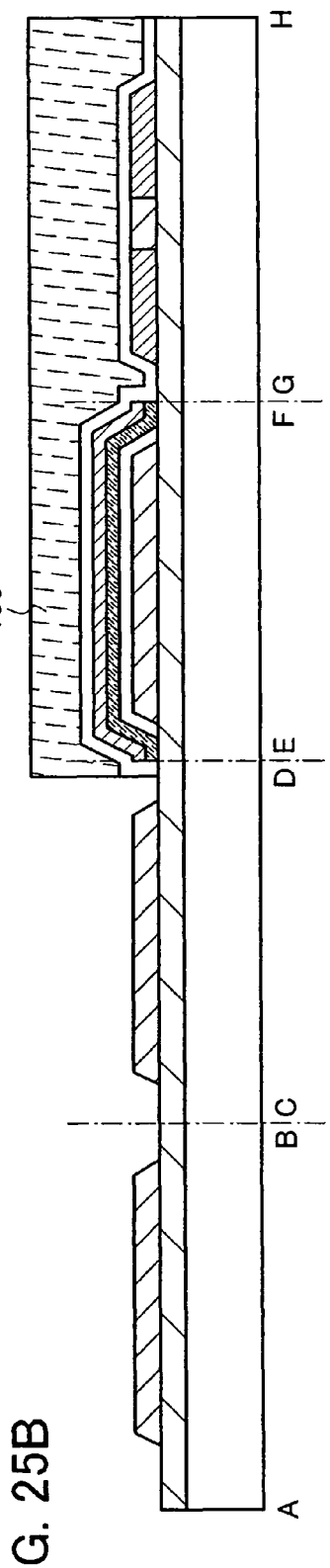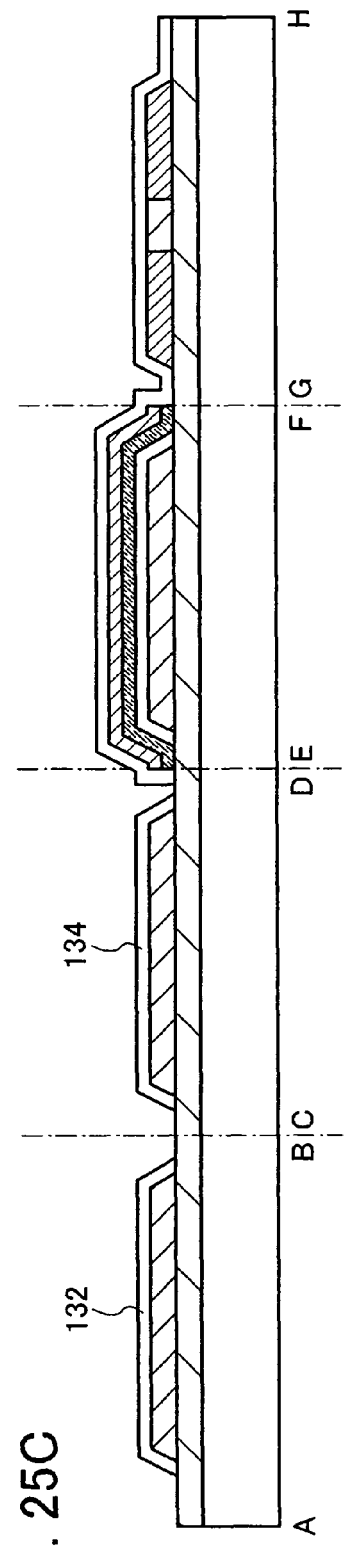

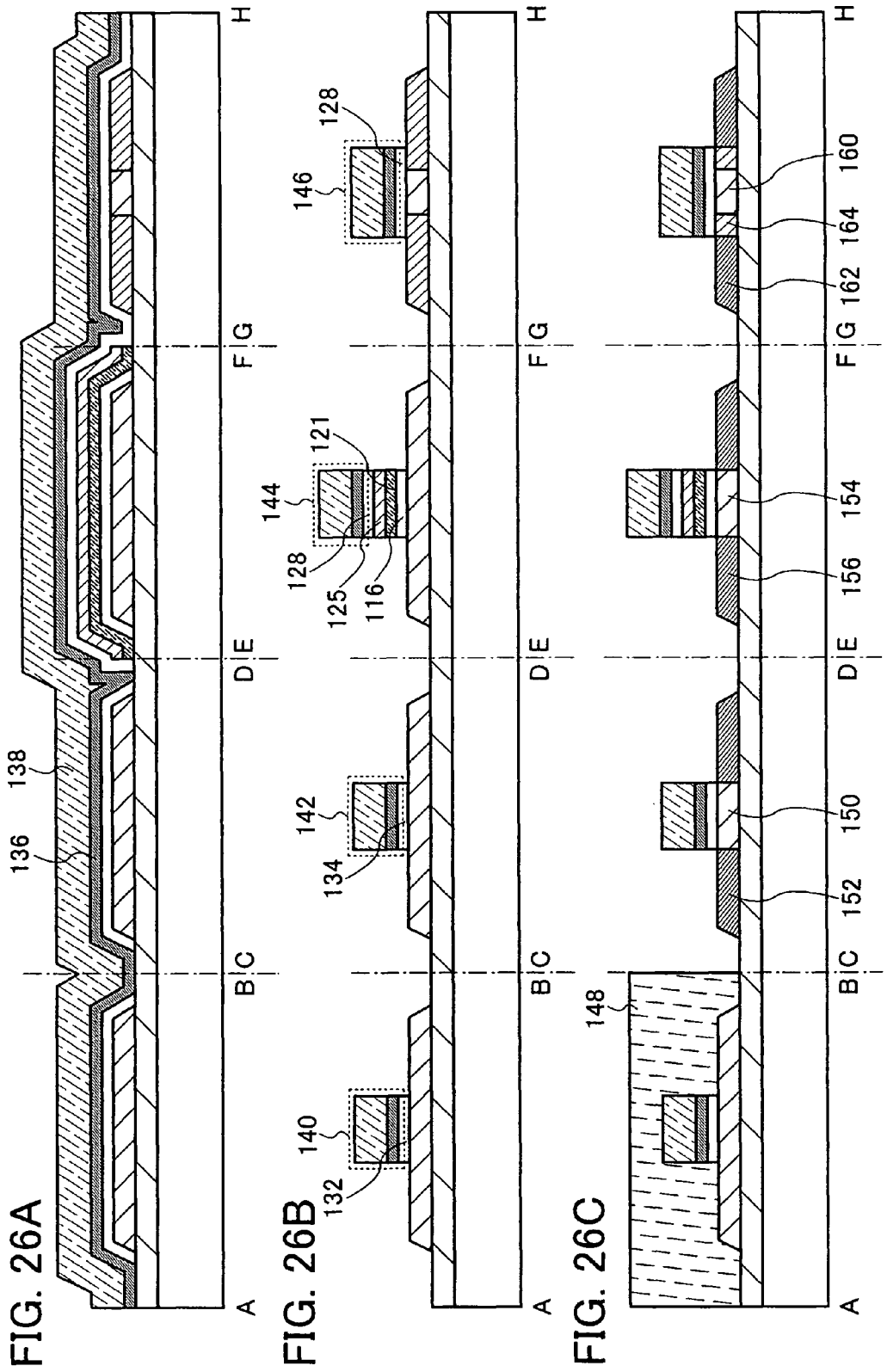

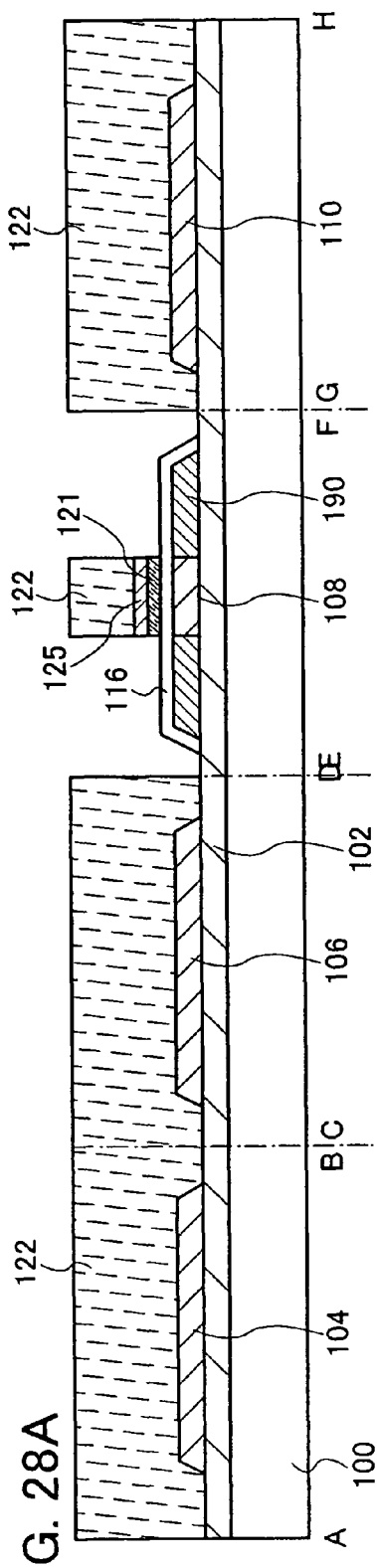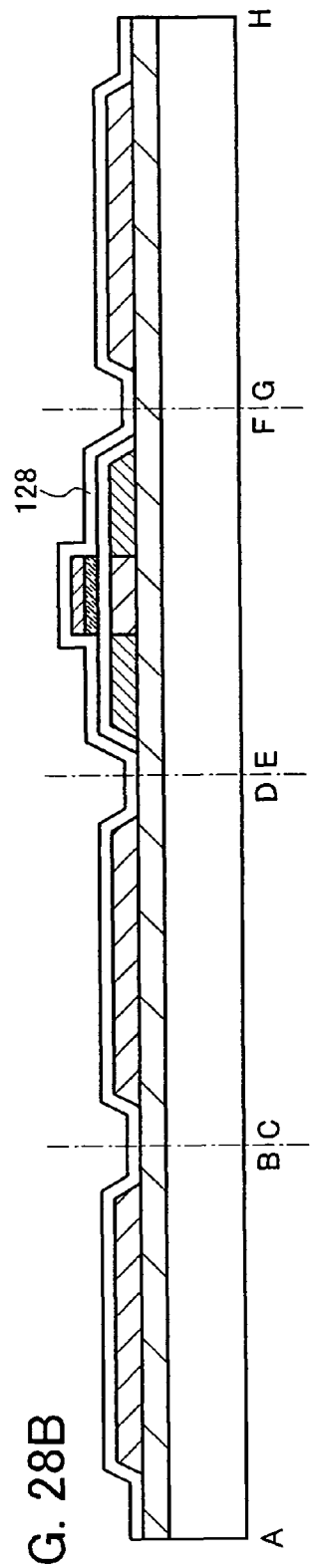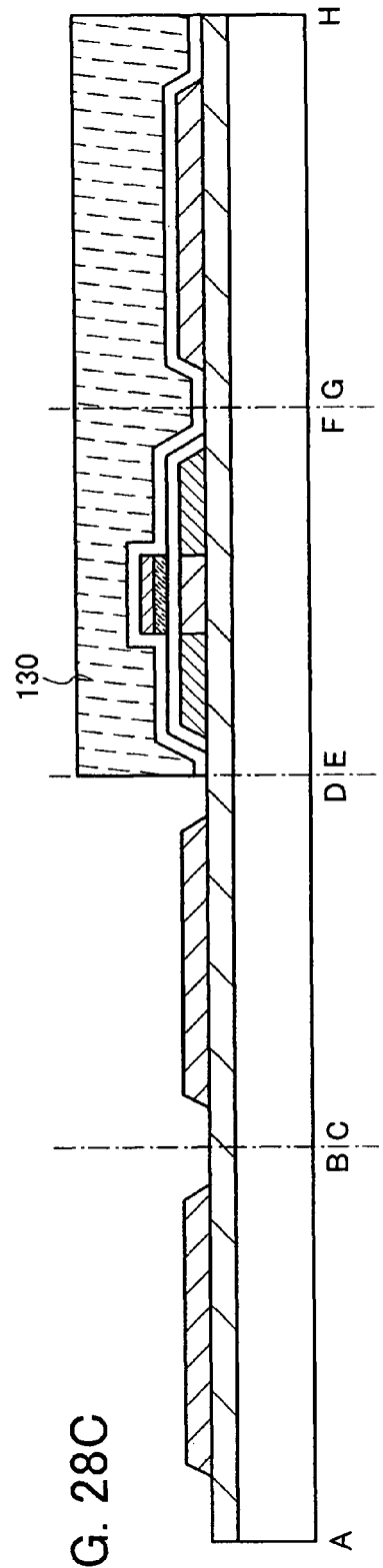

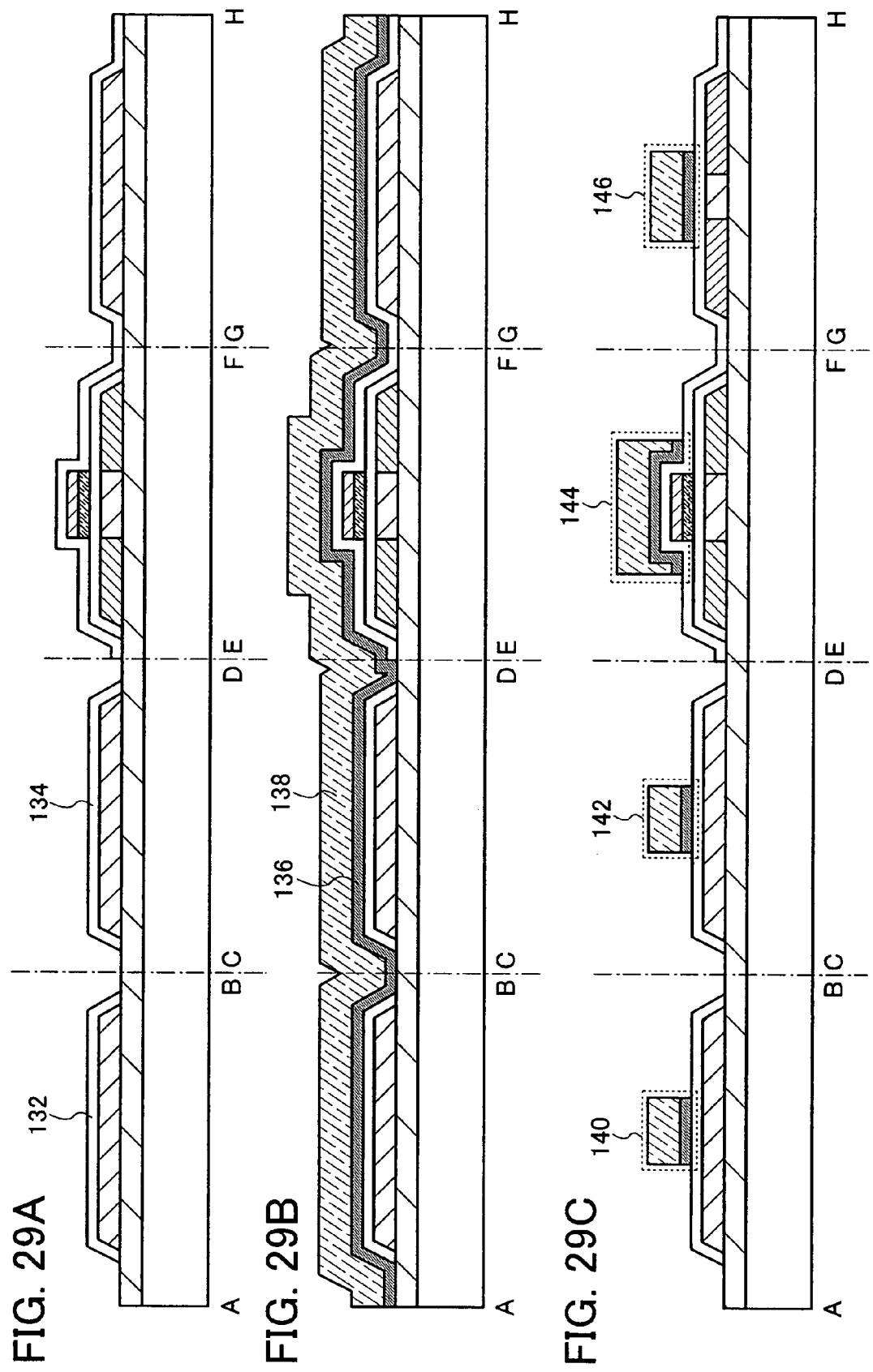

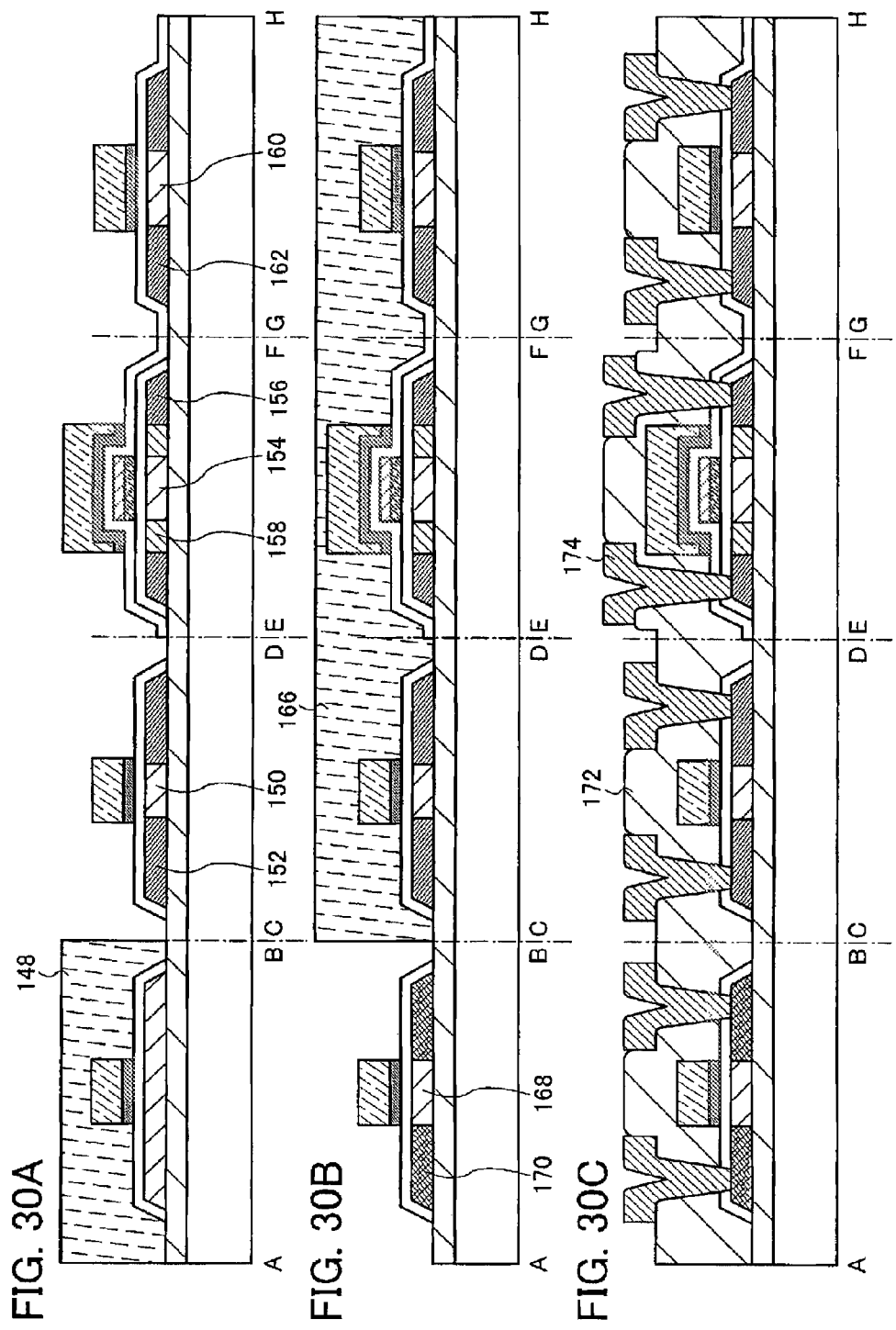

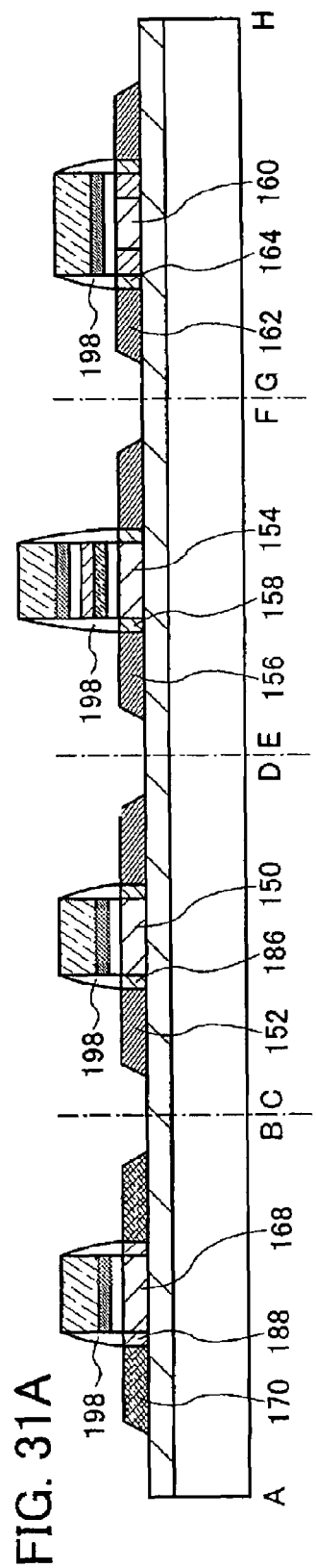
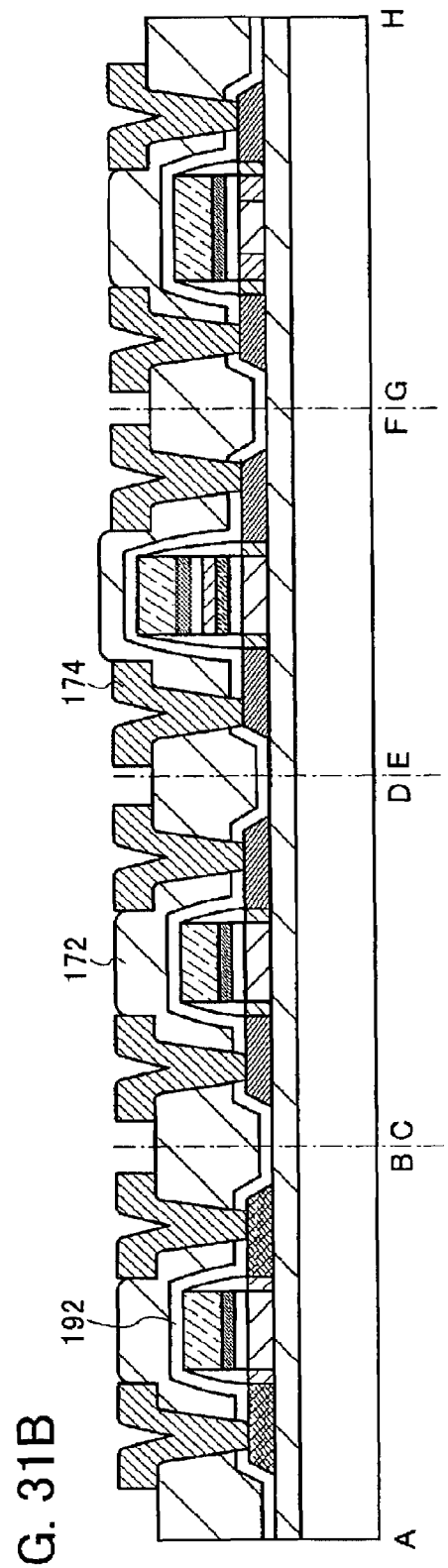
FIG. 31A
FIG. 31B

FIG. 34
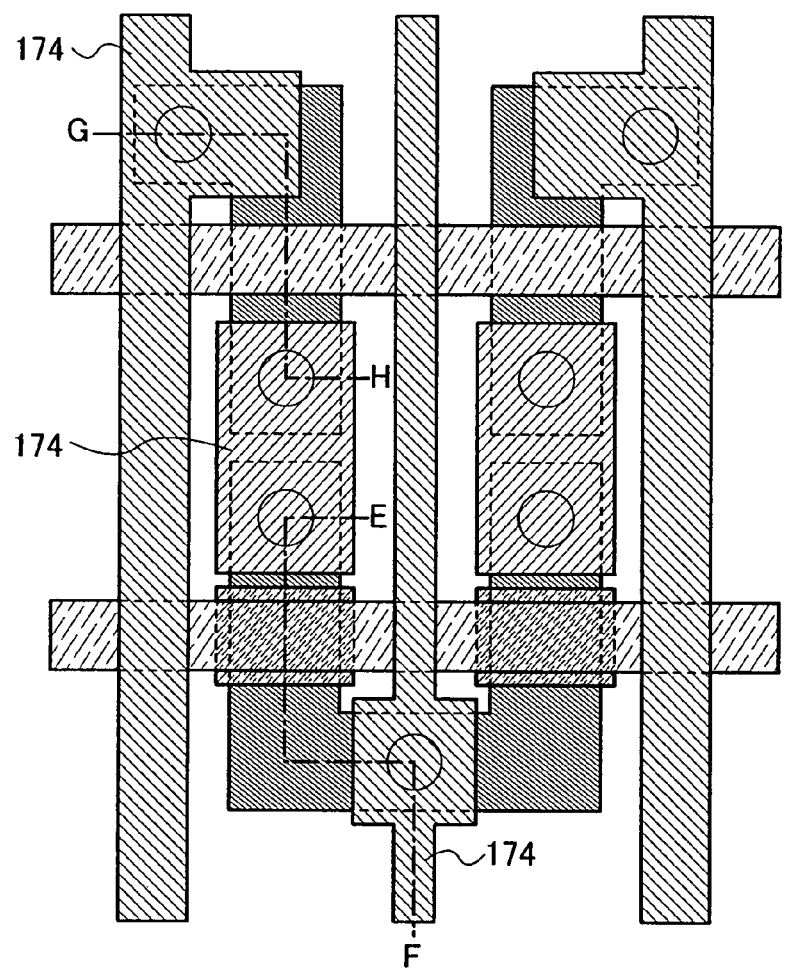
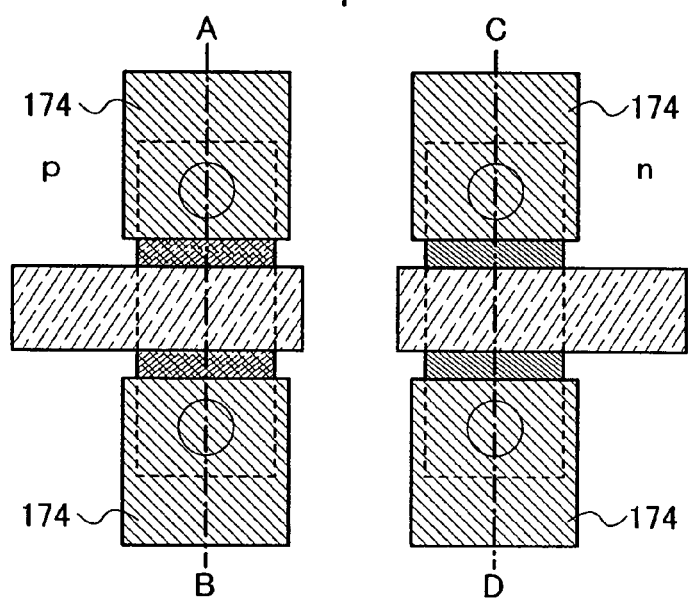

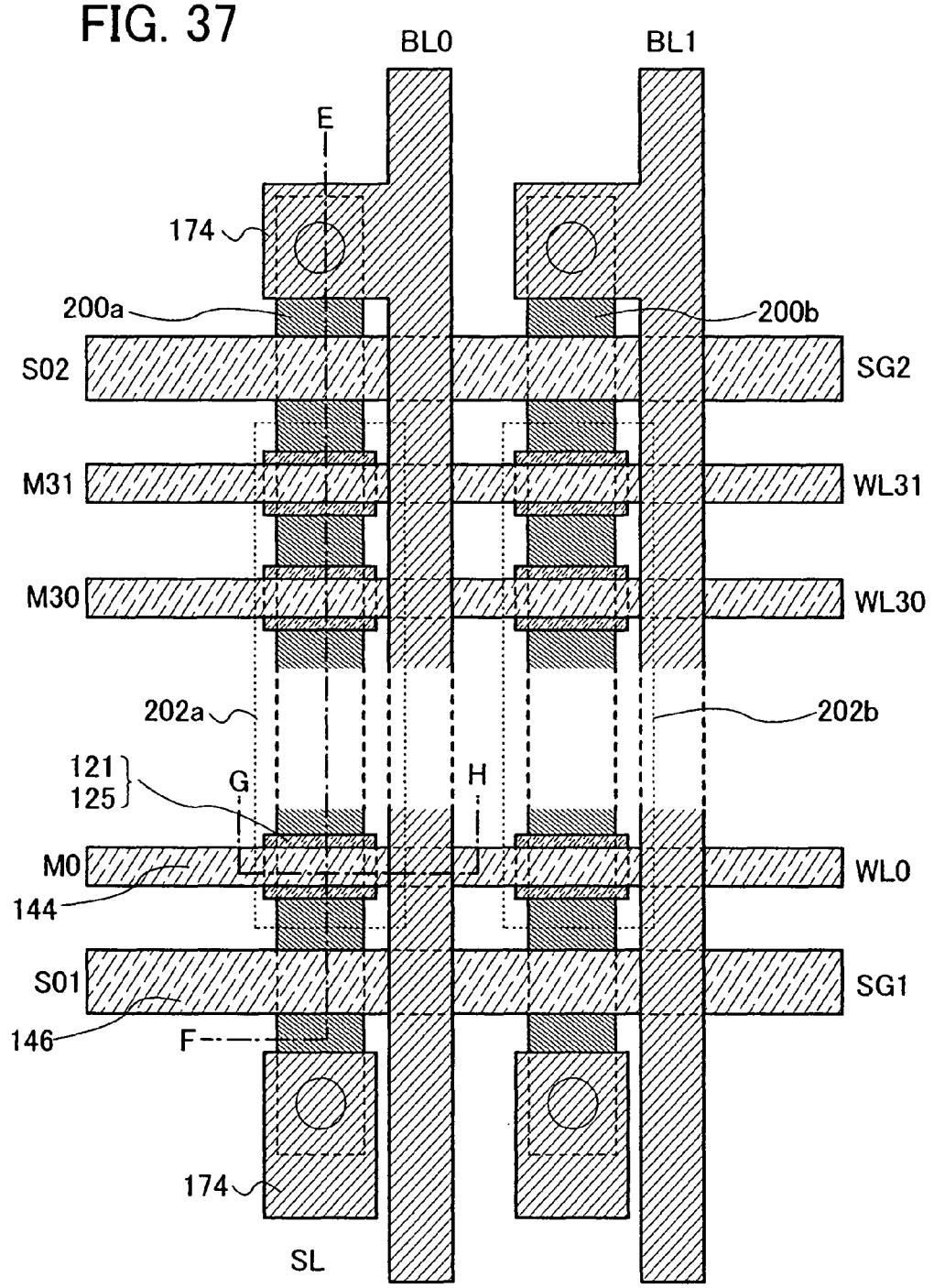

FIG. 41
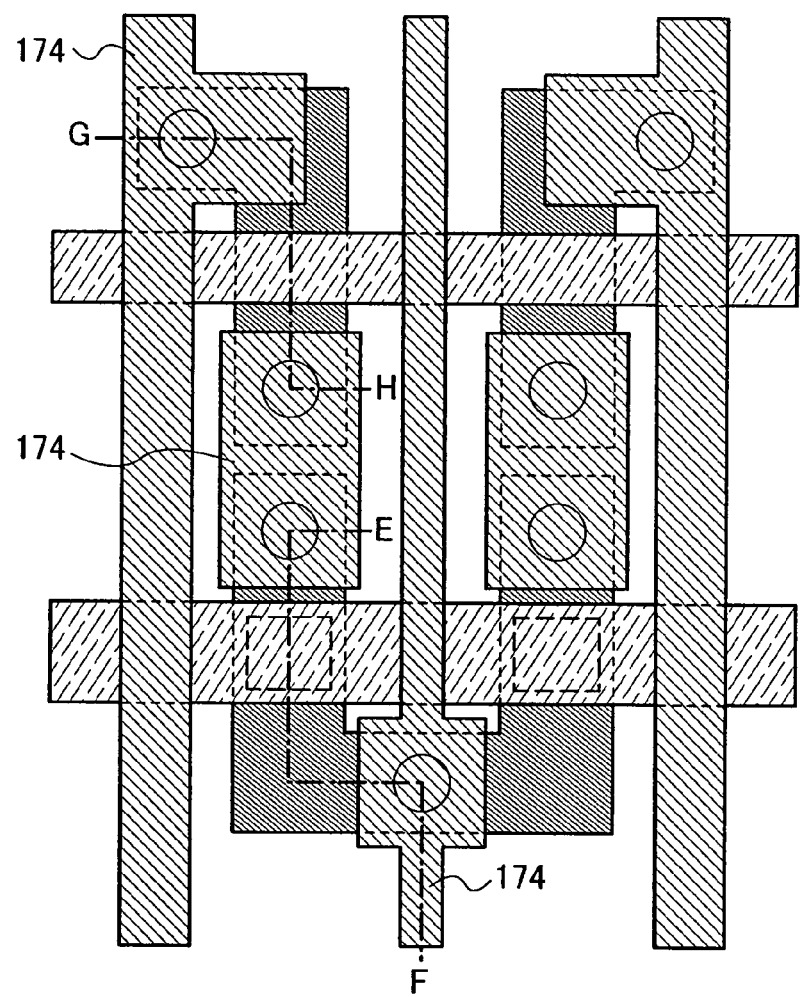
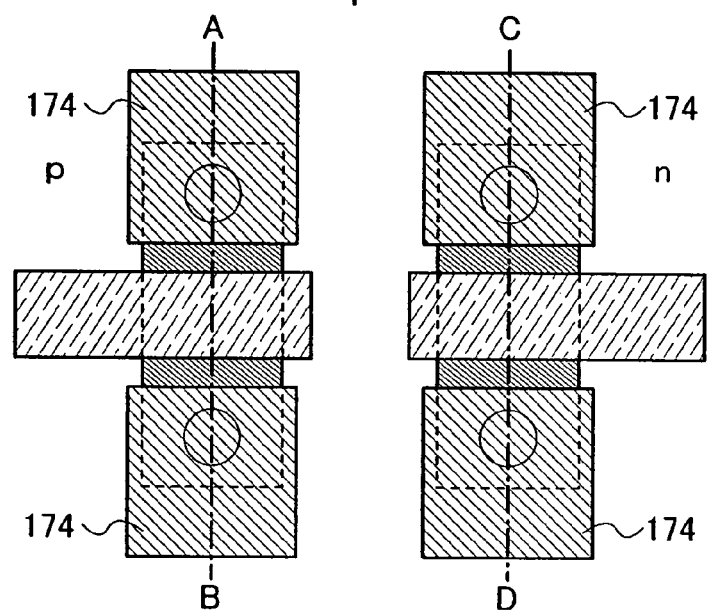

FIG. 45
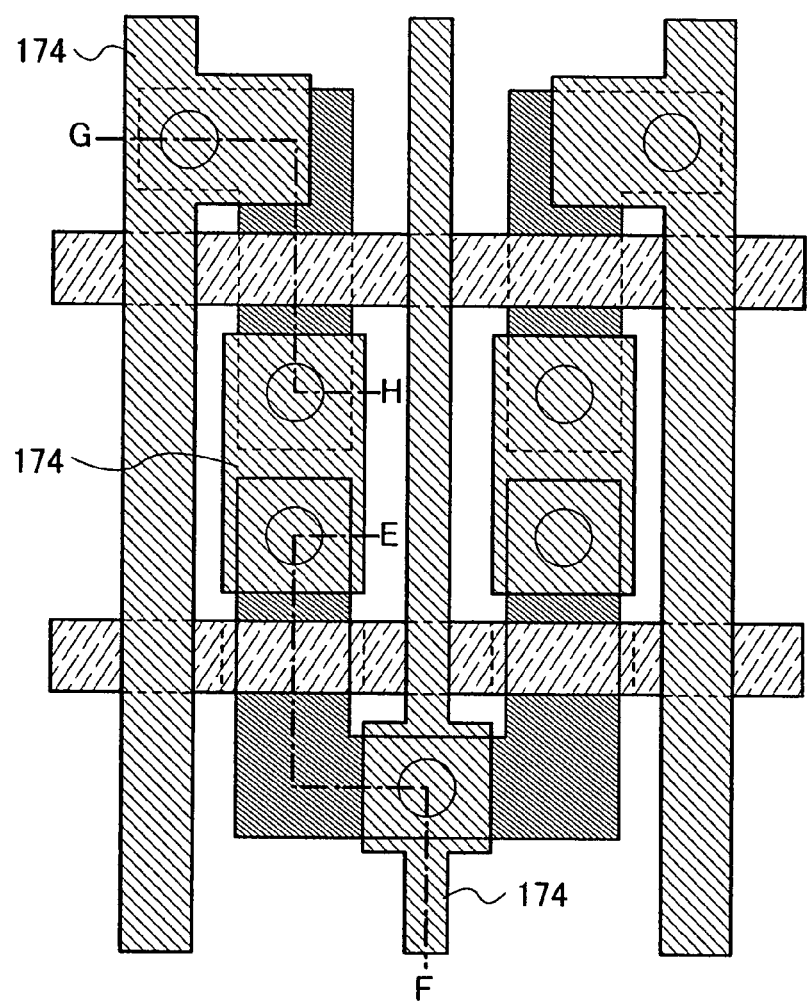
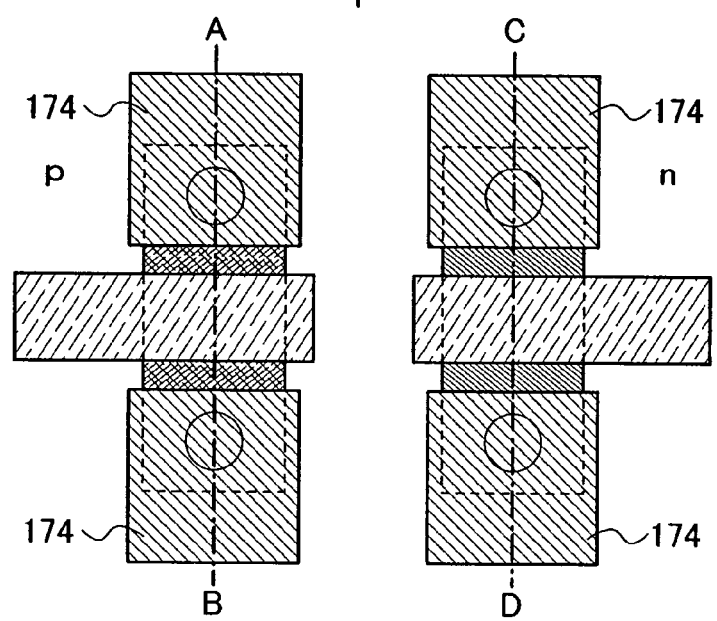

NONVOLATILE SEMICONDUCTOR MEMORY DEVICE

BACKGROUND OF THE INVENTION

1. Field of the Invention

The present invention relates to a nonvolatile semiconductor memory device that is electrically writable, readable, and erasable, and its manufacturing method. In particular, the present invention relates to a structure of a floating gate in the nonvolatile semiconductor memory device.

2. Description of the Related Art

The market is expanding for nonvolatile memories in which data can be electrically rewritten and data can be stored even after the power is turned off. Features of a nonvolatile memory lie in that its structure is similar to that of a MOSFET (Metal Oxide Semiconductor Field Effect Transistor) and a region capable of accumulating charge for a long period of time is provided over a channel forming region. Such a charge accumulating region is formed over an insulating layer and is also referred to as a floating gate since it is insulated and isolated from the peripheral portion. Since the floating gate is electrically insulated from the peripheral portion by being surrounded by an insulator, there is a feature that charge injected to the floating gate are retained. A gate electrode called a control gate is further provided over the floating gate with an insulating layer interposed therebetween. The control gate is distinguished from the floating gate since predetermined voltage is applied to the control gate in data writing or reading.

In a floating gate type nonvolatile memory having such a structure, data is stored through electrical control of charge injection to and discharge from the floating gate. Specifically, charge is injected to and discharged from the floating gate by application of high voltage between a semiconductor layer in which a channel forming region is formed and a control gate. It is said that Fowler-Nordheim (F-N) type tunnel current (NAND type) or thermoelectrons (NOR type) flow in an insulating layer over the channel forming region at this time. Accordingly, the insulating layer is also referred to as a tunnel insulating layer.

The floating gate type nonvolatile memory is required to have a property, for securing reliability, that charges accumulated in the floating gate are retained for 10 years or more. Accordingly, the tunnel insulating layer is required to be formed to have a high insulating property so that charge does not leak and a thickness which produces tunnel current flow.

In addition, the floating gate formed over the tunnel insulating layer is formed using silicon that is the same semiconductor material as that of the semiconductor layer in which the channel forming region is formed. Specifically, a method for forming the floating gate using polycrystalline silicon has been widely used, for example, a polysilicon film deposited with a thickness of 400 nm (refer to Patent Document 1: Japanese Published Patent Application No. 2000-58685, p 7, FIG. 7)

SUMMARY OF THE INVENTION

Since a floating gate and a channel forming region of a nonvolatile memory are formed using the same silicon material, energy levels at the bottom of the conduction band are the same from the aspect of a band model. If the floating gate is formed using polycrystalline silicon and is intended to be formed thinly, the energy level at the bottom of the conduction band becomes quite higher than that of the semiconductor layer forming the channel forming region. With such a state, electrons are not easily injected from the semiconductor layer which forms the channel forming region to the floating gate; thus, writing voltage is necessary to be increased. In order to reduce the writing voltage as much as possible in the nonvolatile memory in which the floating gate is formed using polycrystalline silicon, the floating gate is required to be doped with an n-type impurity such as phosphorus or arsenic so that a Fermi level is shifted to the conduction band side.

A thickness of a gate insulating layer provided between the floating gate and the semiconductor layer is required to be thin so that charge is injected to the floating gate at low voltage. On the other hand, the thickness of the gate insulating layer is required to be thick so that charge is prevented from leaking and charge in the floating gate is thus stably retained for a long period of time.

In the conventional nonvolatile memory high writing voltage is required. Additionally, a redundant memory cell is provided or a controller is devised to perform error detection and error correction for deterioration of charge-retention property due to repeated rewriting, whereby reliability is secured.

It is an object of the present invention to provide a nonvolatile semiconductor memory device in which a writing property and a charge-retention property are excellent.

One aspect of the present invention is a nonvolatile semiconductor memory device including a semiconductor layer having a channel forming region between a pair of impurity regions which are formed to be apart from each other; and a first insulating layer, a floating gate, a second insulating layer, and a control gate in a position which is an upper layer portion of the semiconductor layer and which roughly overlaps with the channel forming region. In the present invention, the floating gate includes a plurality of layers each using a semiconductor material. Alternatively, a barrier layer for improving a water proof property of the floating gate and preventing corrosion of the floating gate is provided to be in contact with the second insulating layer side of the floating gate formed using a specific semiconductor material. A plurality of types of semiconductor materials for forming the floating gate can be selected in accordance with its relation to the semiconductor layer forming the channel forming region.

The semiconductor material forming the floating gate can be selected to satisfy one or a plurality of the following conditions. A band gap of the semiconductor material forming the floating gate (also referred to as a band gap) is preferably smaller than that of the semiconductor layer. For example, a difference between the band gap of the semiconductor material forming the floating gate and a band gap of the semiconductor layer is preferably greater than or equal to 0.1 eV, and the former is preferably smaller. A band gap of the second insulating layer provided to be in contact with the floating gate is preferably larger than that of the semiconductor material forming the floating gate.

In addition, the semiconductor material is preferably a material having an electron affinity which is larger than that of a material forming the semiconductor layer. As for the semiconductor material, barrier energy to electrons in the floating gate, which is formed by the first insulating layer, is preferably higher than barrier energy to electrons in the semiconductor layer, which is formed by the first insulating layer.

As the semiconductor material forming the floating gate, germanium or a germanium compound is typically used.

The floating gate is applied to a nonvolatile semiconductor memory device according to the present invention for charge accumulation. Without limitation to germanium or a germanium compound, a layer of an oxide or a nitride of germanium or a germanium compound, or an oxide layer or a nitride layer containing germanium or a germanium compound can be used as long as it is a layer having a similar function, that is, a layer functioning as a charge accumulation layer.

In addition, as a layer which is in contact with the floating gate formed using germanium or a germanium compound, a layer formed using silicon or a silicon compound is preferably employed. As a silicon compound, silicon nitride, silicon nitride oxide, silicon carbide, silicon germanium containing germanium at a concentration of less than 10 atomic %, metal nitride, metal oxide, or the like can be used. As metal nitride, tantalum nitride, tungsten nitride, molybdenum nitride, titanium nitride, or the like can be used. As metal oxide, tantalum oxide, titanium oxide, tin oxide, or the like can be used.

In the nonvolatile semiconductor memory device according to the present invention, preferably, a semiconductor layer is formed over an insulating surface and isolated to have an island-shape. At least a semiconductor layer forming a memory element and a semiconductor layer forming a logic circuit are preferably separated. In other words, one feature of the present invention is a nonvolatile semiconductor memory device including a semiconductor layer having a channel forming region between a pair of impurity regions which are formed to be apart from each other; a first insulating layer, a floating gate, a second insulating layer, and a control gate which are positioned over the semiconductor layer which roughly overlap with the channel forming region. This nonvolatile semiconductor memory device includes a semiconductor layer formed over an insulating surface.

When a floating gate is formed over a semiconductor layer with a first insulating layer functioning as a tunnel insulating layer interposed therebetween, through formation of the floating gate using a semiconductor material containing at least germanium, charges can be easily injected from the semiconductor layer to the floating gate, and a charge-retention property in the floating gate can be improved. Further, when a semiconductor material or a barrier layer for improving a water proof property of the floating gate and preventing corrosion of the floating gate is provided to be in contact with the floating gate, deterioration of the floating gate can be suppressed.

In addition, through formation of a floating gate using a material having characteristics which are close to those of silicon, a nonvolatile semiconductor memory device with excellent characteristics can be manufactured without reduction in productivity. Since germanium is a semiconductor and a material which belongs to Group 14 of the periodic table like silicon, microfabrication of a thin film can be performed without a burden on the manufacturing equipment.

BRIEF DESCRIPTION OF THE DRAWINGS

In the accompanying drawings:

FIGS. 6A and 6B are views showing a writing operation and a reading operation of a nonvolatile memory;

FIGS. 7A and 7B are views each showing an erasing operation of a nonvolatile memory;

FIG. 8 is a diagram showing an example of an equivalent circuit of a nonvolatile memory cell array;

FIG. 9 is a diagram showing an example of an equivalent circuit of a NOR type nonvolatile memory cell array;

FIGS. 11A and 11B are diagrams each showing a writing operation of a NAND type nonvolatile memory;

FIGS. 12A and 12B are diagrams showing an erasing operation and a reading operation of a NAND type nonvolatile memory;

FIGS. 18A to 18C are views each showing an example of a manufacturing method of a nonvolatile semiconductor memory device of the present invention;

FIGS. 19A to 19C are views each showing an example of a manufacturing method of a nonvolatile semiconductor memory device of the present invention;

FIGS. 20A to 20C are views each showing an example of a manufacturing method of a nonvolatile semiconductor memory device of the present invention;

FIGS. 21A to 21C are views each showing an example of a manufacturing method of a nonvolatile semiconductor memory device of the present invention;

FIGS. 22A to 22C are views each showing an example of a manufacturing method of a nonvolatile semiconductor memory device of the present invention;

FIGS. 23A to 23C are views each showing an example of a manufacturing method of a nonvolatile semiconductor memory device of the present invention;

FIGS. 24A and 24B are views each showing an example of a manufacturing method of a nonvolatile semiconductor memory device of the present invention;

FIGS. 25A to 25C are views each showing an example of a manufacturing method of a nonvolatile semiconductor memory device of the present invention;

FIGS. 26A to 26C are views each showing an example of a manufacturing method of a nonvolatile semiconductor memory device of the present invention;

FIGS. 28A to 28C are views each showing an example of a manufacturing method of a nonvolatile semiconductor memory device of the present invention;

FIGS. 29A to 29C are views each showing an example of a manufacturing method of a nonvolatile semiconductor memory device of the present invention;

FIGS. 30A to 30C are views each showing an example of a manufacturing method of a nonvolatile semiconductor memory device of the present invention;

FIGS. 31A and 31B are views each showing an example of a manufacturing method of a nonvolatile semiconductor memory device of the present invention;

FIG. 34 is a view showing an example of a top view of a nonvolatile semiconductor memory device of the present invention;

FIG. 37 is a view showing an example of a nonvolatile semiconductor memory device of the present invention;

FIG. 41 is a view showing an example of a top view of a nonvolatile semiconductor memory device of the present invention;

FIG. 45 is a view showing an example of a top view of a nonvolatile semiconductor memory device of the present invention.

DESCRIPTION OF THE INVENTION

Figure 1:
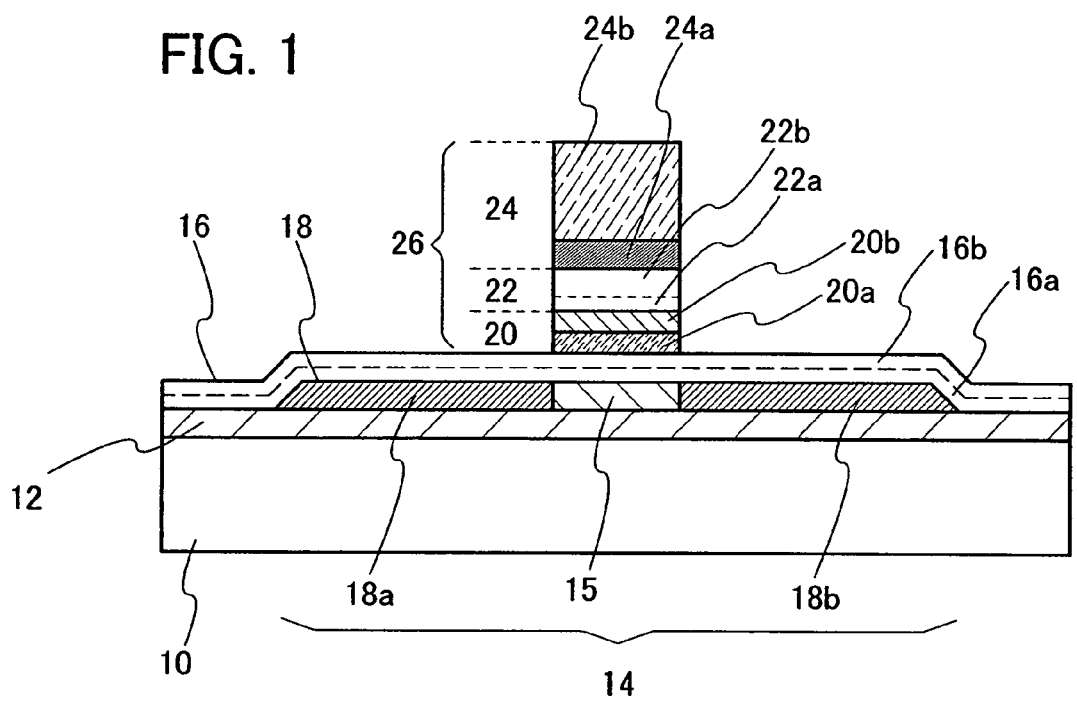
FIG. 1 is a cross-sectional view showing a major structure of a nonvolatile semiconductor memory device according to the present invention.

Hereinafter, an Embodiment Mode of the present invention will be explained with reference to the accompanying drawings. It is to be noted that the present invention is not limited to the following description, and it is easily understood by those skilled in the art that modes and details thereof can be modified in various ways without departing from the spirit and the scope of the present invention. Therefore, the present invention should not be interpreted as being limited to the following description of the embodiment mode. In a structure of the present invention, which will be explained below, reference numerals denoting the same portions may be used in common in different drawings.

FIG. 1 is a cross-sectional view showing a major structure of a nonvolatile semiconductor memory device according to the present invention. FIG. 1 particularly shows a main part of a nonvolatile memory element. The nonvolatile memory element is manufactured by using a substrate 10 having an insulating surface. As the substrate 10 having an insulating surface, a glass substrate, a quartz substrate, a sapphire substrate, a ceramic substrate, or a metal substrate provided with an insulating layer on the surface, or the like can be used.

A semiconductor layer 14 is formed over the substrate 10 having an insulating surface. A base insulating layer 12 may be provided between the substrate 10 and the semiconductor layer 14. The base insulating layer 12 prevents an impurity such as alkali metal from diffusing from the substrate 10 and contaminating the semiconductor layer 14, and may be appropriately provided as a blocking layer.

The base insulating layer 12 is formed by a CVD method, a sputtering method, or the like using an insulating material such as silicon oxide, silicon nitride, silicon oxynitride (SiOxNy, (x>y)), or silicon nitride oxide (SiNxOy, (x>y)). For example, in the case of the base insulating layer 12 with a two-layer structure, a silicon nitride oxide film may be formed as a first insulating layer, and a silicon oxynitride film may be formed as a second insulating layer. Alternatively, a silicon nitride film may be formed as the first insulating layer, and a silicon oxide film may be formed as the second insulating layer.

The semiconductor layer 14 is preferably formed using a single crystal semiconductor or a polycrystalline semiconductor. For example, the semiconductor layer 14 can be formed as follows: a semiconductor layer is formed over the entire surface of the substrate 10 by a sputtering method, a plasma CVD method, or a low-pressure CVD method, and the semiconductor layer is crystallized and selectively etched. In other words, in order to separate the elements, it is preferable to form an island-like semiconductor layer over an insulating surface and to form one or a plurality of nonvolatile memory elements over the island-like semiconductor layer. Silicon is preferable as a semiconductor material. Alternatively, a silicon-germanium semiconductor can also be used. As a crystallization method of the semiconductor layer, a laser crystallization method, a crystallization method by heat treatment using rapid thermal annealing (RTA) or an annealing furnace, a crystallization method using a metal element which promotes crystallization, or a method in which the above methods are combined can be employed. Alternatively, instead of such a thin film process, a so-called SOI (Silicon on Insulator) substrate in which a single crystal semiconductor layer is formed over an insulating surface may be used.

In such a manner, by forming the semiconductor layer which is separately formed into an island shape over an insulating surface, the elements can be effectively separated, even when a memory element array and a peripheral circuit are formed over the same substrate. In other words, even when a memory element array required to perform writing or erasing at a voltage of approximately 10 to 20 V and a peripheral circuit mainly performing input/output of data or controlling an instruction while operating at a voltage of approximately 3 to 7 V are formed over the same substrate, mutual interference due to a different voltage applied to each element can be prevented.

A p-type impurity may be added to the semiconductor layer 14. As the p-type impurity, for example, boron may be added at a concentration ranging from approximately $5\times10^{15}$ to $1\times10^{16}$ atoms/cm$^3$. This impurity controls threshold voltage of a transistor and effectively functions by being added to a channel forming region 15. The channel forming region 15 formed in a region which almost corresponds to a gate 26, which will be described later, is positioned between a pair of impurity regions 18 of the semiconductor layer 14.

The pair of impurity regions 18 function as a source and a drain in the nonvolatile memory element. The pair of impurity regions 18 are formed by addition of phosphorus or arsenic which is an n-type impurity at a concentration ranging form approximately $1\times10^{19}$ atoms/cm$^3$ to $1\times10^{21}$ atoms/cm$^3$.

Over the semiconductor layer 14, a first insulating layer 16, a floating gate electrode 20, a second insulating layer 22, and a control gate electrode 24 are formed. In this specification, a stacked structure from the floating gate electrode 20 to the control gate electrode 24 may be referred to as the gate 26.

The first insulating layer 16 is formed using silicon oxide or a stacked structure of silicon oxide and silicon nitride. The first insulating layer 16 may be formed through deposition of an insulating film by a plasma CVD method or a low-pressure CVD method but is preferably formed through solid phase oxidation or solid phase nitridation by plasma treatment. This is because an insulating layer which is formed through oxidation or nitridation of the semiconductor layer (typically, a silicon layer) by plasma treatment has a dense film quality, high withstanding voltage, and high reliability. The first insulating layer 16 preferably has dense film quality, high withstanding voltage, and high reliability since it is used as a tunnel insulating layer for injecting charge to the floating gate electrode 20. The first insulating layer 16 is preferably formed with a thickness of greater than or equal to 1 nm and less than or equal to 20 nm, more preferably greater than or equal to 3 nm and less than or equal to 6 nm. For example, in the case where the gate length is to be 600 nm, the first insulating layer 16 can be formed with a thickness of greater than or equal to 3 nm and less than or equal to 6 nm.

In solid phase oxidation treatment or solid phase nitridation treatment by plasma treatment, plasma is preferably used, which is excited by microwaves (typically, 2.45 GHz) and has an electron density of greater than or equal to $1\times10^{11}$ cm$^{-3}$ and less than or equal to $1\times10^{13}$ cm$^{-3}$ and electron temperatures of greater than or equal to 0.5 eV and less than or equal to 1.5 eV. This is because, in solid phase oxidation treatment or solid phase nitridation treatment, a dense insulating film is formed and a practical response rate is obtained at temperatures of less than or equal to 500° C. through the above condition.

When the surface of the semiconductor layer 14 is oxidized by the plasma treatment, the plasma treatment is performed in an oxygen atmosphere (for example, an atmosphere containing oxygen ($O_2$) or dinitrogen monoxide ($N_2O$) and a rare gas (at least one of He, Ne, Ar, Kr, and Xe), or an atmosphere containing oxygen or dinitrogen monoxide, hydrogen ($H_2$), and a rare gas). Further, when the surface of the semiconductor layer 14 is nitrided by the plasma treatment, the plasma treatment is performed in a nitrogen atmosphere (for example, an atmosphere containing nitrogen ($N_2$) and a rare gas (at least one of He, Ne, Ar, Kr, and Xe), an atmosphere containing nitrogen, hydrogen, and a rare gas, or an atmosphere containing $NH_3$ and a rare gas). As the rare gas, Ar can be used, for example. Alternatively, a gas in which Ar and Kr are mixed may also be used.

Figure 15:
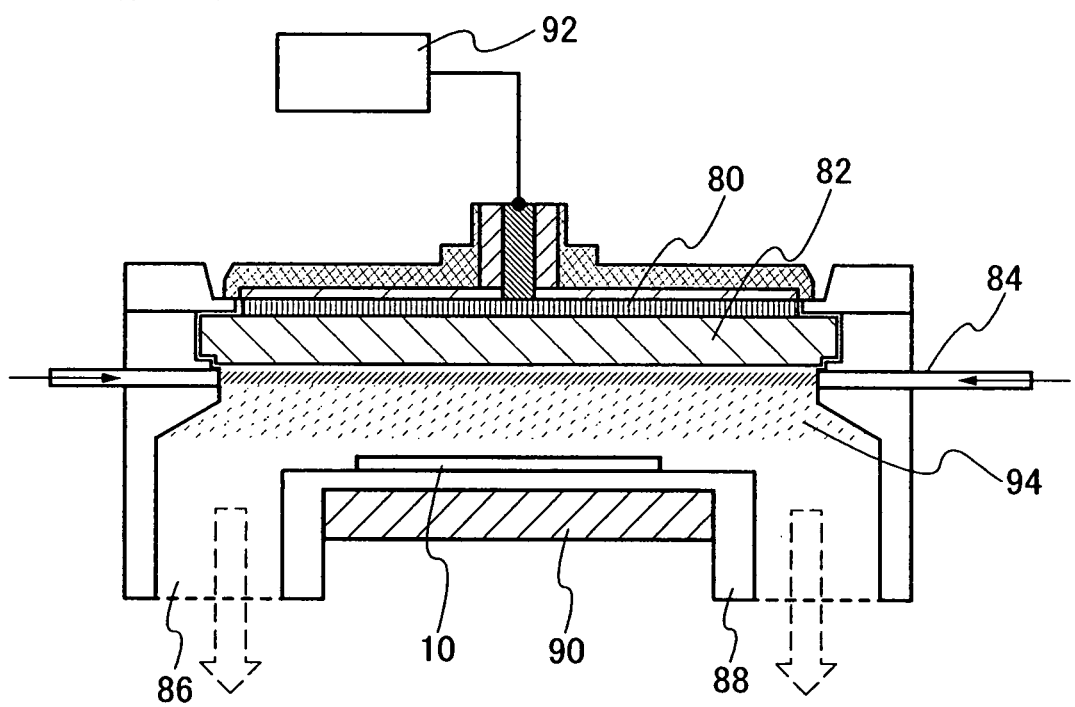
FIG. 15 is a view showing a structure of a plasma treatment apparatus.

FIG. 15 shows a structural example of an apparatus for performing plasma treatment. The plasma treatment apparatus includes a support 88 on which the substrate 10 is arranged, a gas supplying portion 84 for introducing a gas, an exhaust port 86 connected to a vacuum pump for exhausting a gas, an antenna 80, a dielectric plate 82, and a microwave supplying portion 92 which supplies a microwave for plasma generation. In addition, the temperature of the substrate 10 can be controlled by a temperature controlling portion 90 attached to the support 88.

Hereinafter, plasma treatment will be explained. It is to be noted that the plasma treatment includes oxidation treatment, nitridation treatment, oxynitridation treatment, hydrogenation treatment, and surface modification treatment performed to a semiconductor layer, an insulating layer, and a conductive layer. For these treatments, a gas supplied from the gas supplying portion 84 may be selected in accordance with an intended purpose.

Oxidation treatment or nitridation treatment may be performed as follows. First, a processing chamber is made in a vacuum and a gas containing oxygen or nitrogen for plasma treatment is introduced from the gas supplying portion 84. The substrate 10 is heated at the room temperature or at temperatures of 100 to 550° C. by the temperature controlling portion 90. It is to be noted that the distance between the substrate 10 and the dielectric plate 82 is approximately 20 mm to 80 mm (preferably 20 mm to 60 mm). Next, microwaves are supplied from the microwave supplying portion 92 to the antenna 80. Then, the microwaves are introduced from the antenna 80 into the processing chamber through the dielectric plate 82; thus, plasma 94 is generated. When the plasma is excited by the introduced microwaves, plasma which has the low electron temperature (less than or equal to 3 eV, preferably less than or equal to 1.5 eV) and the high electron density (greater than or equal to $1\times10^{11}$ cm$^{-3}$) can be generated. With oxygen radicals (containing OH radicals in some cases) and/or nitrogen radicals (containing NH radicals in some cases) generated by this high-density plasma, the surface of the semiconductor layer can be oxidized and/or nitrided. A plasma treatment gas mixed with a rare gas such as argon enables oxygen radicals or nitrogen radicals to be generated efficiently due to excited species of a rare gas. Through the effective use of active radicals excited by plasma in this method, oxidation, nitridation, or oxynitridation by a solid phase reaction can be performed at low temperatures of less than or equal to 500° C.

In FIG. 1, one preferable example of the first insulating layer 16 formed by plasma treatment is a stacked structure in which a silicon oxide layer 16a is formed with a thickness of greater than or equal to 3 nm and less than or equal to 6 nm by performing the plasma treatment in an oxygen atmosphere to the semiconductor layer 14, and the surface of the silicon oxide layer 16a is nitrided in a nitrogen atmosphere to form a silicon nitride layer 16b. When a silicon material is used as a typical example of the semiconductor layer 14, the surface of the silicon layer is oxidized by plasma treatment to form a dense oxide film which has no distortion at the interface. In addition, a nitride layer is formed through nitridation of the oxide film by plasma treatment and through substitution of nitrogen for oxygen on the surface, and thus, the layer can be denser. Accordingly, an insulating layer which has high withstanding voltage can be formed.

In any case, through the use of solid phase oxidation treatment or solid phase nitridation treatment by the plasma treatment as described above, an insulating layer similar to a thermal oxide film, which is formed at 950 to 1050° C., can also be obtained with the use of a glass substrate having a temperature limit of less than or equal to 700° C. In other words, a highly reliable tunnel insulating layer can be formed as the tunnel insulating layer of the nonvolatile memory element.

The floating gate electrode 20 is formed over the first insulating layer 16. This floating gate electrode 20 includes a first floating gate electrode 20a and a second floating gate electrode 20b. Of course, the floating gate electrode is not limited to the two-layer structure, and a plurality of layers may be stacked. The first floating gate electrode 20a which is formed to be in contact with the first insulating layer 16 is preferably formed using a semiconductor material, and a material which satisfies one or a plurality of the following conditions can be selected.

It is preferable that a band gap of a semiconductor material forming the first floating gate electrode 20a be smaller than that of the semiconductor layer 14. For example, it is preferable that a band gap of a semiconductor material forming the first floating gate electrode 20a and a band gap of the semiconductor layer 14 have a difference of greater than or equal to 0.1 eV, and the former be smaller. This is because when an energy level at the bottom of the conduction band of the floating gate electrode 20 is lower than that of the semiconductor layer 14, injectability of charge (electrons) and a charge-retention property can be improved.

A semiconductor material forming the first floating gate electrode 20a preferably has a larger electron affinity than that of a material forming the semiconductor layer 14. This is because an energy level at the bottom of the conduction band of the first floating gate electrode 20a that is lower than that of the semiconductor layer 14 can improve injectability of charges (electrons) and a charge-retention property. In the case of a semiconductor, an electron affinity is an energy difference between the bottom of the conduction band and a vacuum state.

A semiconductor material forming the first floating gate electrode 20a is selected so that barrier energy to electrons in the first floating gate electrode 20a, which is formed by the first insulating layer 16, gets higher than barrier energy to electrons in the semiconductor layer 14, which is formed by the first insulating layer 16. This is because charge (electrons) is easily injected from the semiconductor layer 14 to the first floating gate electrode 20a and charge is prevented from being discharged from the first floating gate electrode 20a.

The first floating gate electrode 20a can be typically formed using germanium or a germanium compound to satisfy the above conditions. Silicon germanium is given as a typical germanium compound. In this case, preferably, 10 atomic % or more of germanium is contained in silicon. With the concentration of germanium of less than 10 atomic %, its effect as a constituent element is weakened, and a band gap does not become smaller effectively.

Of course, other materials can also be employed to form the first floating gate electrode 20a as long as they have similar effects. For example, a ternary semiconductor material containing germanium can be used. In addition, the semiconductor material may be hydrogenated. In addition, as a floating gate electrode functioning as a charge accumulation layer of the nonvolatile memory element, a layer of an oxide or a nitride of germanium or a germanium compound, or an oxide layer or a nitride layer containing germanium or a germanium compound can be used.

As the second floating gate electrode 20b which is provided on the second insulating layer 22 side to be in contact with the first floating gate electrode 20a, a layer formed using silicon or a silicon compound is preferably used. As a silicon compound, silicon nitride, silicon nitride oxide, silicon carbide, silicon germanium containing germanium at a concentration of less than 10 atomic %, metal nitride, metal oxide, or the like can be employed. In such a manner, the second floating gate electrode 20b that is formed using a material with a larger band gap than that of the first floating gate electrode 20a can prevent charges accumulated in the floating gate from leaking to the second insulating layer 22 side. In addition, as a material for the second floating gate electrode 20b, metal nitride or metal oxide can be used. As the metal nitride, tantalum nitride, tungsten nitride, molybdenum nitride, titanium nitride, or the like can be used. As the metal oxide, tantalum oxide, titanium oxide, tin oxide, or the like can be used.

In any case, when the second layer of silicon or a silicon compound, or metal nitride or metal oxide as described above is provided on the upper layer side of the first layer formed using germanium or a germanium compound, the second layer can be used as a barrier layer for water proof or chemical resistance in the manufacturing process. Therefore, the substrate can be easily handled in a photolithography step, an etching step, or a cleaning step, whereby productivity can be improved. In other words, the floating gate can be easily processed.

The second insulating layer 22 is formed by a low-pressure CVD method, a plasma CVD method, or the like using one or a plurality of layers of silicon oxide, silicon oxynitride ($SiO_xN_y$, (x>y)), silicon nitride ($SiN_x$), silicon nitride oxide ($SiN_xO_y$, (x>y)), aluminum oxide ($Al_xO_y$), and the like. The second insulating layer 22 is formed with a thickness of greater than or equal to 1 nm and less than or equal to 20 nm, preferably greater than or equal to 5 nm and less than or equal to 10 nm. For example, a silicon nitride layer 22a is deposited with a thickness of 3 nm, and a silicon oxide layer 22b is deposited thereover with a thickness of 5 nm, can be used. In addition, the second floating gate electrode 20b may be subjected to plasma treatment, and a nitride film which is formed by nitriding the surface of the second floating gate electrode 20b (for example, silicon nitride, in the case where silicon is used as the second floating gate electrode 20b) may be formed. In any case, in the first insulating layer 16 and the second insulating layer 22, when one or both of the sides is/are in contact with the floating gate electrode 20, and is/are a nitride film or a layer subjected to nitridation treatment, oxidation of the floating gate electrode 20 can be prevented.

The control gate electrode 24 is preferably formed using metal such as tantalum (Ta), tungsten (W), titanium (Ti), molybdenum (Mo), chromium (Cr), or niobium (Nb), or an alloy material or a compound material containing the metal as its main component. In addition, polycrystalline silicon to which an impurity element such as phosphorus is added can be used. Alternatively, the control gate electrode 24 may be formed using a stacked structure including one or a plurality of layers, such as a metal nitride layer 24a and a metal layer 24b formed using the above metal. As the metal nitride, tungsten nitride, molybdenum nitride, or titanium nitride can be used. By providing the metal nitride layer 24a, adhesion of the metal layer 24b can be improved, whereby the metal layer 24b can be prevented from peeling. In addition, since metal nitride such as tantalum nitride has a high work function, the thickness of the first insulating layer 16 can be thick due to synergistic effect with the second insulating layer 22.

An operation mechanism of the nonvolatile memory element shown in FIG. 1 will be explained with reference to a band diagram. In the following band diagram, the same portions as those in FIG. 1 are denoted by the same reference numerals.

Figure 2:
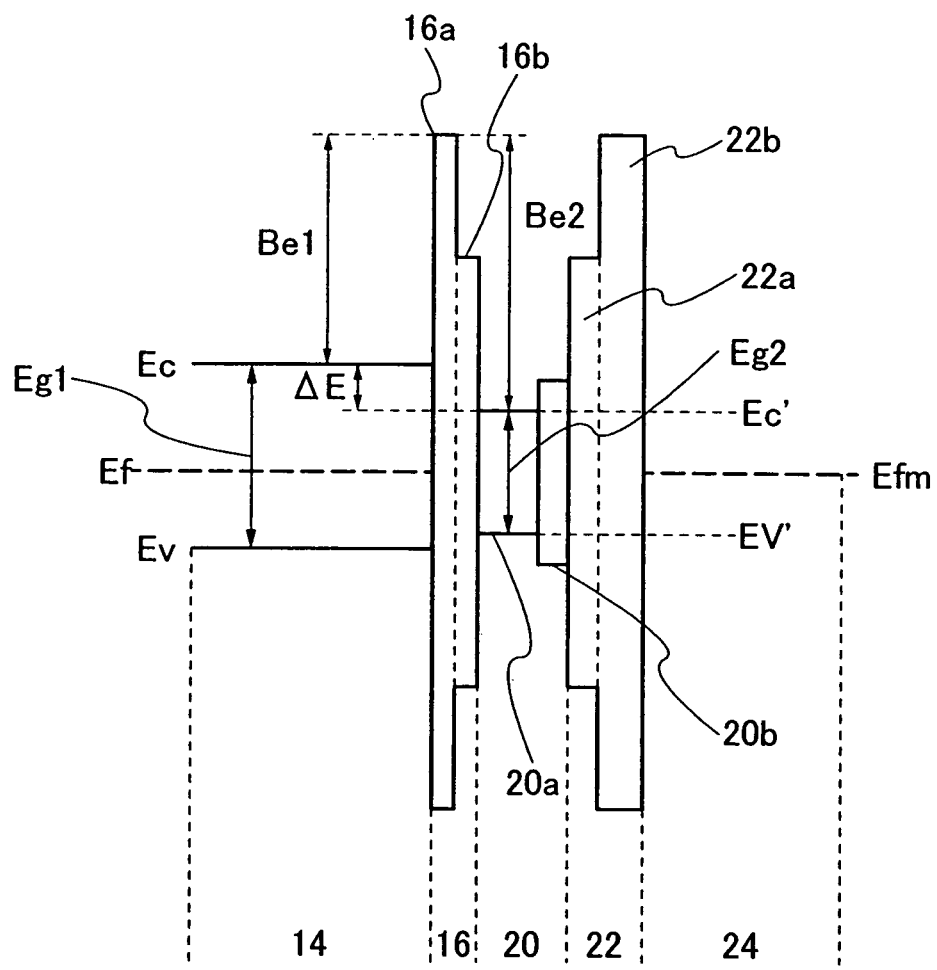
FIG. 2 is a band diagram of a nonvolatile memory in an initial state (charge emission state)

FIG. 2 shows a state where the semiconductor layer 14, the first insulating layer 16, the floating gate electrode 20, the second insulating layer 22, and the control gate electrode 24 are stacked. FIG. 2 shows the case where voltage is not applied to the control gate electrode 24, and a Fermi level Ef of the semiconductor layer 14 and a Fermi level Efm of the control gate electrode 24 are the same.

With the first insulating layer 16 interposed, the semiconductor layer 14 and at least the first floating gate electrode 20a of the floating gate electrode 20 are formed using different materials. A band gap Eg1 (an energy difference between a lower end Ec of the conduction band and an upper end Ev of the valence band) of the semiconductor layer 14 and a band gap Eg2 of the first floating gate electrode 20a are to be different, and the first floating gate electrode 20a has a smaller band gap than that of the semiconductor layer 14. For example, silicon (1.12 eV) can be used for the semiconductor layer 14, whereas germanium (0.72 eV) or silicon germanium (0.73 to 1.0 eV) can be used for the first floating gate electrode 20a. When polycrystalline silicon is used for the second floating gate electrode 20b, the second floating gate electrode 20b has a larger band gap than that of the first floating gate electrode 20a. The band gap difference functions as a barrier to carriers which are injected to the first floating gate electrode 20a through the first insulating layer 16. Accordingly, injected carriers can be prevented from leaking to the second insulating layer 22 side and being trapped at the interface.

It is to be noted that the first insulating layer 16 includes the silicon oxide layer 16a (approximately 8 eV) and the silicon nitride layer 16b (approximately 5 eV) which is obtained through nitridation of the silicon oxide by plasma treatment. In addition, the second insulating layer 22 includes the silicon nitride layer 22a and the silicon oxide layer 22b which are stacked from the floating gate electrode 20 side.

When a vacuum level is to be 0 eV, an energy level of the conduction band of silicon is −4.05 eV and an energy level of the conduction band of germanium is −4.1 eV. Further, an energy level of the conduction band of silicon oxide is −0.9 eV. Therefore, such a combination of the semiconductor layer 14 and the first floating gate electrode 20a can enhance barrier energy (Be2) to electrons in the first floating gate electrode 20a, which is formed by the first insulating layer 16, with respect to barrier energy (Be1) to electrons in the semiconductor layer 14, which is formed by the first insulating layer 16. In other words, the barrier energy to the electrons, that is, the first barrier Be1 and the second barrier Be2 have different values and can have a relation of Be2>Be1.

In such a condition, the band gap Eg1 of silicon of the semiconductor layer 14 and the band gap Eg2 of germanium of the first floating gate electrode 20a have a relation of Eg1>Eg2. Further, in consideration of an electron affinity as described above, an energy difference ΔE between energy levels at the bottom of the conduction bands of the semiconductor layer 14 and the floating gate electrode 20 is generated. As will be described later, this energy difference ΔE contributes to reduction in writing voltage since ΔE acts in an electron-accelerating direction when electrons are injected from the semiconductor layer 14 to the floating gate electrode 20.

Figure 16:
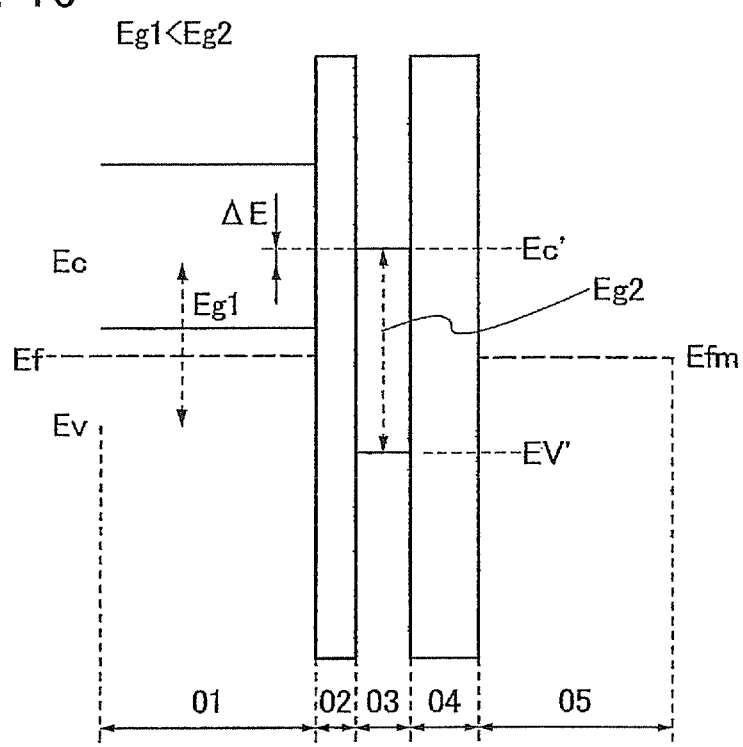
FIG. 16 is a band diagram of a conventional nonvolatile memory.

For comparison, FIG. 16 shows a band diagram where a semiconductor layer and a floating gate electrode are formed using the same semiconductor material. This band diagram shows a state where a semiconductor layer 01, a first insulating layer 02, a floating gate electrode 03, a second insulating layer 04, and a control gate electrode 05 are sequentially stacked. Also when the semiconductor layer 01 and the floating gate electrode 03 are formed using the same silicon material, band gaps thereof are different when the floating gate electrode 03 is formed thinly. In FIG. 16, a band gap of the semiconductor layer 01 is denoted by Eg1, and a band gap of the floating gate electrode 03 is denoted by Eg2. For example, a band gap of silicon is increased to approximately 1.4 eV from 1.12 eV which is a value of a bulk state by being formed into a thin film. Accordingly, an energy difference of −ΔE is generated between the semiconductor layer 01 and the floating gate electrode 03 in a direction which blocks electron injection. In such a condition, high voltage is necessary for injection of electrons from the semiconductor layer 01 to the floating gate electrode 03. In other words, in order to reduce writing voltage, it is necessary to form the floating gate electrode 03 thickly like bulk silicon, or add phosphorus or arsenic as an n-type impurity at a high concentration. This is a defect in a conventional nonvolatile memory.

For electron injection to the floating gate electrode 20, there is a method utilizing thermoelectrons and a method utilizing F-N type tunnel current. In the case of a method utilizing thermoelectrons, thermoelectrons are generated by application of positive voltage to the control gate electrode 24 and high voltage to a drain. Accordingly, thermoelectrons can be injected to the floating gate electrode 20. In the case of a method utilizing F-N type tunnel current, positive voltage is applied to the control gate electrode 24, and electrons are injected from the semiconductor layer 14 to the floating gate electrode 20 by F-N type tunnel current.

Figure 3:
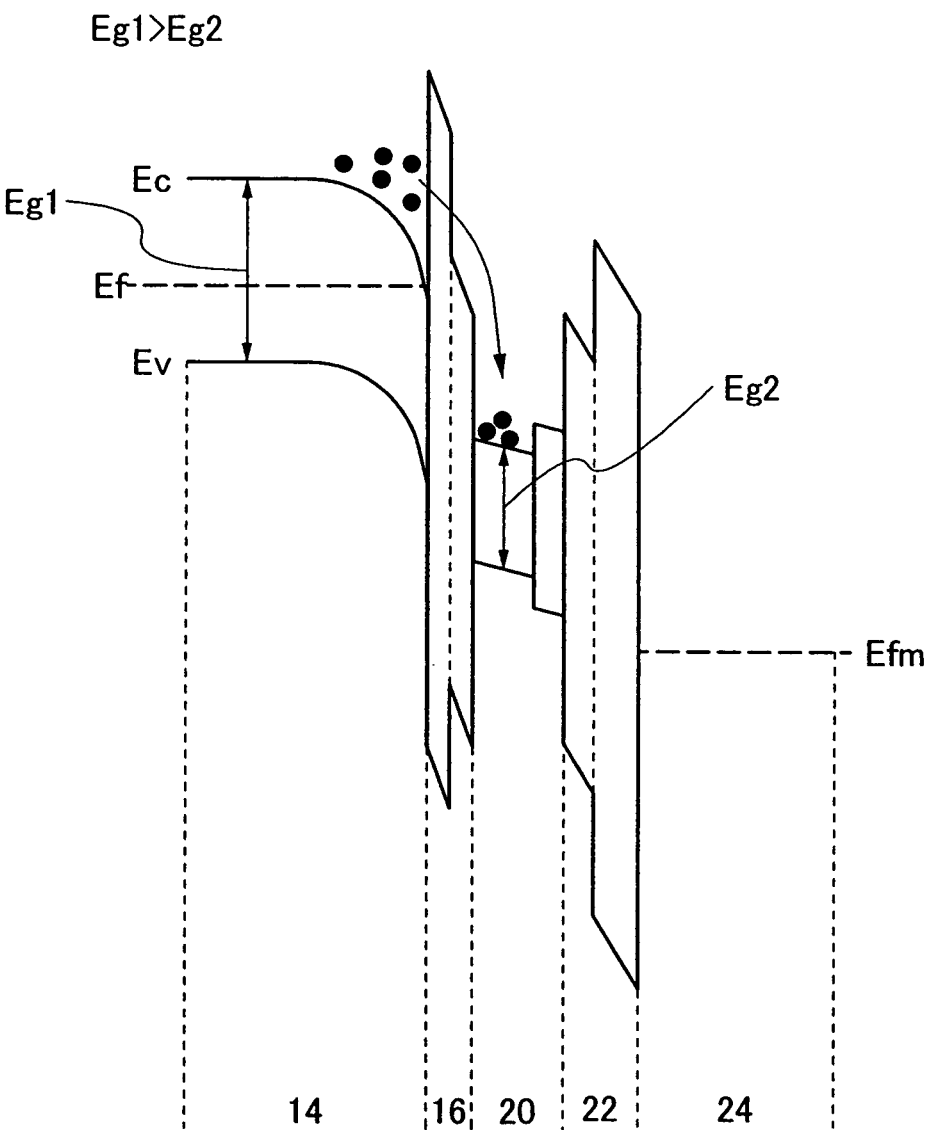
FIG. 3 is a band diagram of a nonvolatile memory in a writing state.

FIG. 6A shows applied voltage when electrons are injected to the floating gate electrode 20 by F-N type tunnel current. High positive voltage (10 to 20 V) is applied to the control gate electrode 24 while 0V is applied to the source region 18a and the drain region 18b. FIG. 3 shows a band diagram at this time. A high electric filed enables electrons of the semiconductor layer 14 to be injected to the first insulating layer 16, whereby F-N type tunnel current flows. As explained in FIG. 2, a relation of the band gap Eg1 of the semiconductor layer 14 and the band gap Eg2 of the floating gate electrode 20 is Eg1>Eg2. This difference acts as self-bias so that electrons injected from the channel forming region 15 of the semiconductor layer 14 are accelerated toward the floating gate electrode. Accordingly, injectability of electrons can be improved.

An energy level at the bottom of the conduction band of the floating gate electrode 20 lies at a level that is lower than the energy level at the bottom of the conduction band of the semiconductor layer 14 by ΔE in terms of electron energy. Therefore, when electrons are injected to the floating gate electrode 20, an internal electric field is generated by this energy difference. This phenomenon is achieved by a combination of the semiconductor layer 14 and the floating gate electrode 20 as described above. In other words, electrons can be easily injected from the semiconductor layer 14 to the floating gate electrode 20, whereby a writing property in the nonvolatile memory element can be improved. This effect is obtained also when electrons are injected to the floating gate electrode 20 with the use of thermoelectrons.

Figure 4:
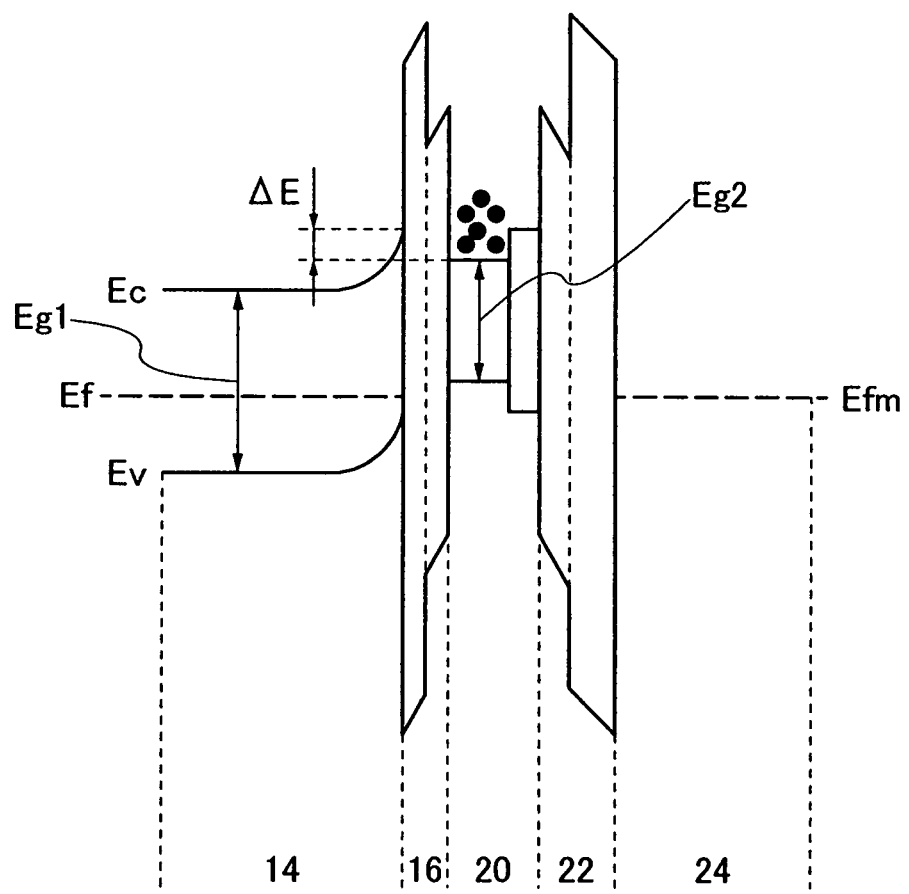
FIG. 4 is a band diagram of a nonvolatile memory in a charge-retention state.

During retention of electrons in the floating gate electrode 20, threshold voltage of the nonvolatile memory element is shifted to a positive direction. This state can be regarded as a state where data "0" is written. FIG. 4 shows a band diagram of a charge-retention state. Carriers of the floating gate electrode 20 are kept in terms of energy by being interposed between the first insulating layer 16 and the second insulating layer 22. This means that, although potential is increased by carriers (electrons) accumulated in the floating gate electrode 20, electrons are not discharged from the floating gate electrode 20 unless energy over barrier energy is given to the electrons. In other words, carriers accumulated in the floating gate electrode can be retained similar to that of a reliability test in which the element is left at a constant temperature of 150° C.

More in detail, it can be said that carriers of the first floating gate electrode 20a are kept in terms of energy between the first insulating layer 16 and the second floating gate electrode 20b. With this state, injected carries are prevented from leaking to the second insulating layer 22 side and being trapped at the interface. That is, an erasing failure can be prevented, which is caused when carriers injected to the floating gate region are left in an erasing operation. Since the second floating gate electrode 20b also has an ability to accumulate carriers as a floating gate, the second floating gate electrode 20b can function as a floating gate which supports the first floating gate electrode 20a.

In any case, electrons are not discharged from the floating gate electrode 20 unless energy over barrier energy is given to electrons. The energy level at the bottom of the conduction band of the floating gate electrode 20 lies at a level that is lower than the energy level at the bottom of the conduction band of the semiconductor layer 14 by $\Delta E$ in terms of electron energy, and the energy barrier is formed to electrons. By this barrier, electrons are prevented from being discharged to the semiconductor layer 14 by tunnel current.

A state where data "0" is written is detected as follows: it is detected by a circuit that a transistor is not turned on when an intermediate potential Vread is applied to the control gate electrode 24. The intermediate potential is a potential between the threshold Voltage Vth1 in data "1" and the threshold voltage Vth2 in the data "0" (in this case, Vth1<Vread<Vth2). Alternatively, the state where data "0" is written can be detected depending on whether the nonvolatile memory element is conducted by application of a bias voltage to the source region 18a and the drain region 18b so that 0V is applied to the control gate electrode 24 as shown in FIG. 6B.

FIG. 7A shows a state where charge is discharged from the floating gate electrode 20 and data is erased from the nonvolatile memory element. In this case, negative bias voltage is applied to the control gate electrode 24, and F-N type tunnel current is applied between the semiconductor layer 14 and the floating gate electrode 20, whereby data is erased. Alternatively, as shown in FIG. 7B, negative bias voltage may be applied to the control gate electrode 24, and high positive voltage may be applied to the source region 18a so that F-N type tunnel current is generated and electrons are taken to the source region 18a side.

Figure 5:
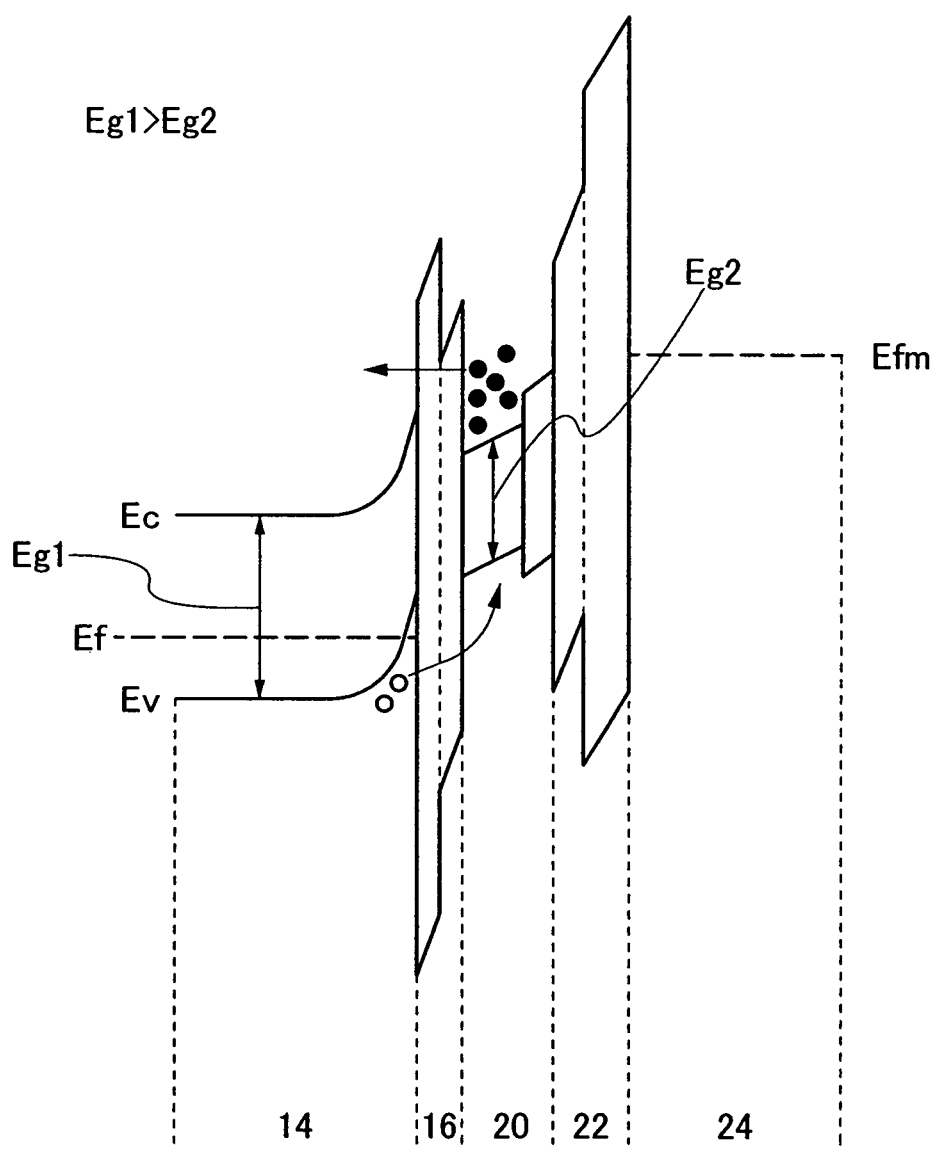
FIG. 5 is a band diagram of a nonvolatile memory in an erasing state.

FIG. 5 shows a band diagram in the erasing state. In the erasing operation, since the first insulating layer 16 can be formed thinly, electrons of the floating gate electrode 20 can be discharged to the semiconductor layer 14 side by F-N type tunnel current. In addition, holes can be easily injected from the channel forming region of the semiconductor layer 14. Therefore, a substantial erasing operation can be achieved by injection of holes to the floating gate electrode 20.

When the floating gate electrode 20 is formed using germanium or a germanium compound, the thickness of the first insulating layer 16 can be thin. Accordingly, electrons can be easily injected to the floating gate electrode 20 through the first insulating layer 16 by tunnel current, whereby a low-voltage operation can be performed. Further, charges can be kept at a low energy level, whereby an advantageous effect in which charge may be kept stably can be obtained.

The nonvolatile memory element according to the present invention has a structure as shown in FIGS. 2 and 3 so that self-bias is generated as Eg1>Eg2 between the semiconductor layer 14 and the floating gate electrode 20. This relation is highly important and enables carriers to be easily injected from the channel forming region of the semiconductor layer to the floating gate electrode. That is, writing voltage can be reduced, and carriers are not easily discharged from the floating gate electrode. This can improve a memory retention property of the nonvolatile memory element. In addition, a germanium layer as the floating gate electrode is doped with an n-type impurity, whereby self-bias can be activated so that an energy level at the bottom of the conduction band can be further lowered, and carriers can be more easily injected to the floating gate electrode. In other words, writing voltage can be reduced, and a memory retention property of the nonvolatile memory element can be improved.

As explained above, in the nonvolatile memory element according to the present invention, charge can be easily injected from the semiconductor layer to the floating gate electrode, and charge is prevented from being discharged from the floating gate electrode. In other words, when the nonvolatile memory element operates as a memory, data can be written with very high efficiency at low voltage, and a charge-retention property can be improved.

Through the use of such a nonvolatile memory element, various modes of nonvolatile semiconductor memory devices can be obtained. FIG. 8 shows an example of an equivalent circuit of a nonvolatile memory cell array. A memory cell MS01 which stores 1-bit information includes a selection transistor S01 and a nonvolatile memory element M01. The selection transistor S01 is inserted in series between a bit line BL0 and the nonvolatile memory element M01, and a gate of the selection transistor S01 is connected to a word line WL1. A gate of the nonvolatile memory element M01 is connected to a word line WL11. When data is written in the nonvolatile memory element M01, H level voltage is applied to the word line WL1 and the bit line BL0, L level voltage is applied to a bit line BL1, and high voltage is applied to the word line WL11, whereby charge is accumulated in the floating gate electrode as described above. When data is erased, H level voltage is applied to the word line WL1 and the bit line BL0, and high negative voltage is applied to the word line WL11.

In this memory cell MS01, the selection transistor S01 and the nonvolatile memory element M01 are formed using semiconductor layers 30 and 32, which are formed separately into island-shapes over an insulating surface, respectively. Therefore, when an element separation region is not particularly provided, interference with other selection transistors or nonvolatile memory elements can be prevented. In addition, both the selection transistor S01 and the nonvolatile memory element M01 in the memory cell MS01 are n-channel type so that a wiring connecting these two elements can be omitted by formation of both the elements using a semiconductor layer which is separated into one island-shape.

FIG. 9 shows a NOR type equivalent circuit in which a nonvolatile memory element is directly connected to a bit line. In this memory cell array, a word line WL and a bit line BL are intersected, and the nonvolatile memory element is arranged at the intersection. In the NOR type, a drain of each nonvolatile memory element is connected to the bit line BL. A source of the nonvolatile memory element is commonly connected to a source line SL.

Also in this case, in a memory cell MS01, a nonvolatile memory element M01 is formed using a semiconductor layer 32, which is formed separately into an island-shape over an insulating surface. Therefore, when an element separation region is not particularly provided, interference with other nonvolatile memory elements can be prevented. Further, a plurality of nonvolatile memory elements (such as M01 to M23 shown in FIG. 9) are used as one block, and an erasing operation can be performed based on the block by formation of the nonvolatile memory elements using a semiconductor layer which is separated into one island-shape.

For example, an operation of the NOR type is as follows. In data writing, 0 V is applied to the source line SL, high voltage is applied to the word line WL which is selected to write data, and potential corresponding to data "0" or "1" is applied to the bit line BL. For example, H level and L level potentials corresponding to "0" and "1" respectively are applied to the bit line BL. Hot electrons are generated around the drain in the nonvolatile memory element to which H level potential is applied so that "0" data is written, and the hot electrons are injected to the floating gate. In the case of "1" data, such electron injection is not caused.

In the memory cell to which "0" data is given, hot electrons are generated around the drain by a strong lateral electric field between the drain and the source, and the hot electrons are injected to the floating gate. This state where the electrons are injected to the floating gate and threshold voltage is increased is "0". In the case of "1" data, hot electrons are not generated and electrons are not injected to the floating gate, whereby a state where threshold voltage is low, that is, an erasing state, can be retained.

When data is erased, positive voltage of approximately 10 V is applied to the source line SL, and the bit line BL is made in a floating state. Then, high negative voltage is applied to the word line WL (high negative voltage is applied to the control gate), and electrons are taken from the floating gate. Therefore, an erasing state of data "1" is obtained.

When data is read, 0 V is applied to the source line SL and approximately 0.8 V is applied to the bit line BL, and reading voltage that is set to be an intermediate value of threshold values of data "0" and "1" is applied to the selected word line WL, and then, it is detected by a sensing amplifier connected to the bit line BL depending on whether current is led-in in the nonvolatile memory element.

Figure 10:
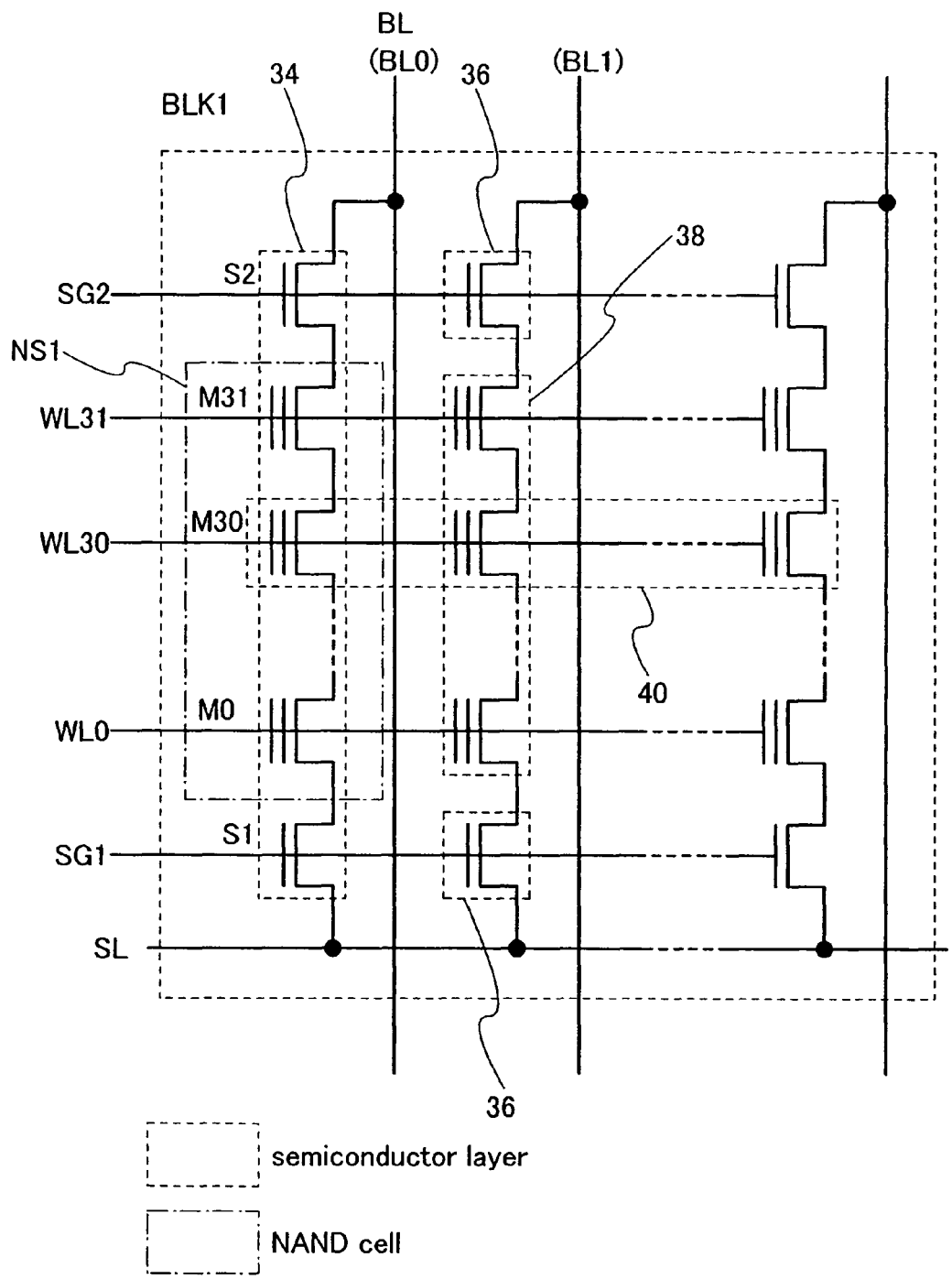
FIG. 10 is a diagram showing an example of an equivalent circuit of a NAND type nonvolatile memory cell array.

FIG. 10 shows an equivalent circuit of a NAND type memory cell array. A NAND cell NS1 in which a plurality of nonvolatile memory elements are connected in series is connected to a bit line BL. A plurality of NAND cells form a block BLK. A block BLK1 shown in FIG. 10 has 32 word lines (word lines WL0 to WL31). To the nonvolatile memory elements arranged in the same row of the block BLK1, a word line corresponding to this row is commonly connected.

In this case, selection transistors S1 and S2 and the nonvolatile memory elements M0 to M31 are connected in series; thus, they may be formed using one semiconductor layer 34 as one group. Accordingly, a wiring connecting the nonvolatile memory elements can be omitted, whereby integration can be achieved. In addition, the adjacent NAND cells can be easily separated from each other. Further, a semiconductor layer 36 of the selection transistors S1 and S2 and a semiconductor layer 38 of the NAND cell may be separately formed. In an erasing operation in which charge is taken from each floating gate of the nonvolatile memory elements M0 to M31, the erasing operation can be performed based on the NAND cell. Further, the nonvolatile memory elements commonly connected to one word line (such as a row of M30) may be formed using one semiconductor layer 40.

A writing operation is executed after the NAND cell NS1 is made in an erasing state, that is, a threshold value of each nonvolatile memory element of the NAND cell NS1 is made in a negative voltage state. Writing is sequentially performed from the memory element M0 on the source line SL side. Writing to the memory element M0 will be explained as an example approximately as follows.

In FIG. 11A, when "0" is written, for example, Vcc (power source voltage) is applied to a selection gate line SG2 to turn on the selection transistor S2 and 0 V (ground voltage) is applied to the bit line BL0. 0 V is applied to a selection gate line SG1 to turn off the selection transistor S1. Then, high voltage Vpgm (approximately 20 V) is applied to a word line WL0 of the nonvolatile memory element M0, and intermediate voltage Vpass (approximately 10 V) is applied to other word lines. Since 0 V is applied to the bit line BL0, potential of a channel forming region of the selected nonvolatile memory element M0 is 0 V. Further, since a potential difference between the word line WL0 and the channel forming region is large, electrons are injected to the floating gate of the nonvolatile memory element M0 by F-N tunnel current as described above. Accordingly, threshold voltage of the nonvolatile memory element M0 is in a positive state (a state where "0" is written).

On the other hand, when "1" is written, for example, as shown in FIG. 11B, Vcc (power source voltage) is applied to the bit line BL. Since Vcc is applied to the selection gate line SG2, the selection transistor S2 is cut off in the case of Vcc−Vth (Vth is threshold voltage of the selection transistor S2). Therefore, a channel forming region of the nonvolatile memory element M0 is in a floating state. Next, when high voltage Vpgm (20 V) is applied to the word line WL1 and intermediate voltage Vpass (10 V) is applied to other word lines, voltage of the channel forming region is increased from Vcc−Vth to, for example, approximately 8 V by capacitive coupling of each word line and channel forming region. Differing from writing of "0", a potential difference between the word line WL0 and the channel forming region is small since voltage of the channel forming region is increased. Therefore, electron injection due to F-N tunnel current is not caused in the floating gate of the nonvolatile memory element M0. Accordingly, the threshold value of the nonvolatile memory element M0 is kept in a negative state (a state where "1" is written).

In the case of the erasing operation, as shown in FIG. 12A, high negative voltage (Vers) is applied to all the selected word lines in the block. The bit line BL and the source line SL are made in a floating state. Thus, electrons in the floating gate in all the memory cells in the block are discharged to the semiconductor layer by the tunnel current. Consequently, the threshold voltage of these memory cells is shifted to a negative direction.

Figure 13:
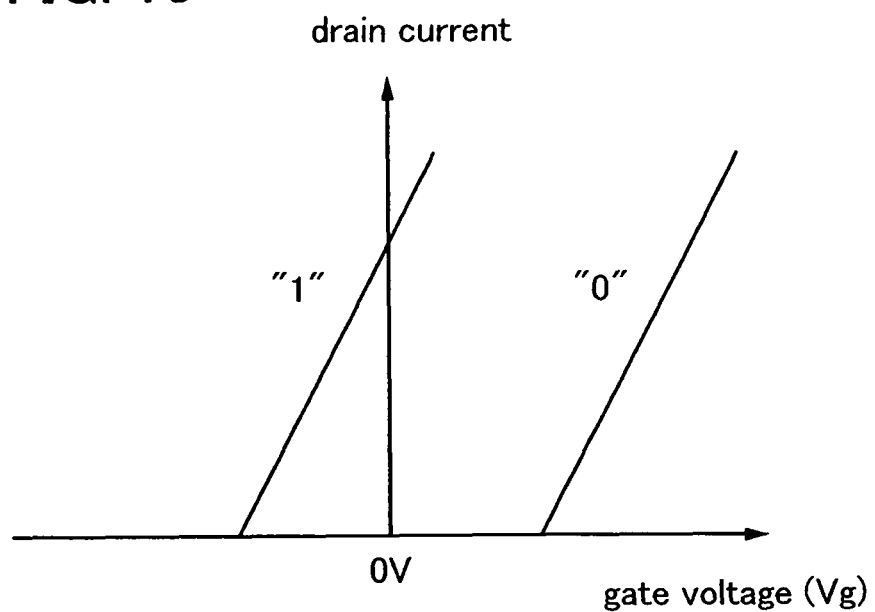
FIG. 13 is a diagram showing a change in threshold voltage of a nonvolatile memory in the case of "0" where charge is accumulated and in the case of "1" where charge is discharged.

In the reading operation shown in FIG. 12B, voltage Vr (for example, 0 V) is applied to the word line WL0 of the nonvolatile memory element M0 which is selected to be read, whereas intermediate voltage Vread for reading which is slightly higher than power source voltage is applied to the word lines WL1 to WL31 and the selection gate lines SG1 and SG2 of the memory cell which is not selected. That is, as shown in FIG. 13, the memory elements other than the selected memory element each function as a transfer transistor. Accordingly, it is detected whether current flows in the nonvolatile memory element M0 which is selected to be read. In other words, when data stored in the nonvolatile memory element M0 is "0", the nonvolatile memory element M0 is off and the bit line BL does not discharge electricity. On the other hand, when data stored in the nonvolatile memory element M0 is "1", the nonvolatile memory element M0 is on and the bit line BL discharges electricity.

Figure 14:
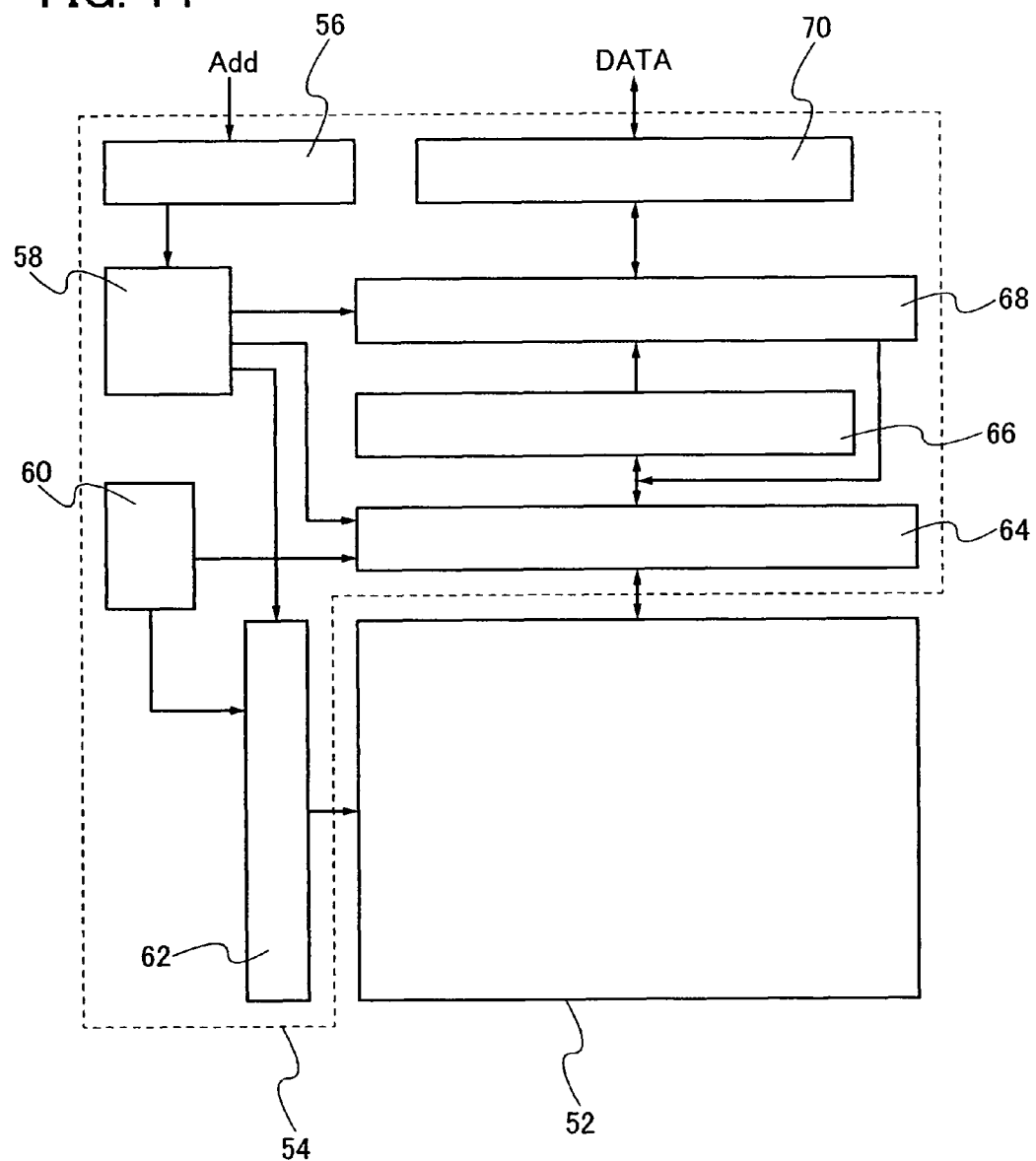
FIG. 14 is a diagram showing an example of a circuit block diagram of a nonvolatile semiconductor memory device.

FIG. 14 shows an example of a circuit block diagram of a nonvolatile semiconductor memory device. In the nonvolatile semiconductor memory device, a memory cell array 52 and a peripheral circuit 54 are formed over the same substrate. The memory cell array 52 has a configuration as shown in FIG. 8, 9, or 10. The peripheral circuit 54 has the following configuration.

A row decoder 62 for selecting a word line and a column decoder 64 for selecting a bit line are provided in the periphery of the memory cell array 52. An address is transmitted to a controlling circuit 58 through an address buffer 56, and an internal row address signal and an internal column address signal are transferred to the row decoder 62 and the column decoder 64, respectively.

Power source potential is increased to be used for data writing and data erasing. Therefore, a boosting circuit 60, which is controlled by the controlling circuit 58 depending on the operation mode, is provided. Output of the boosting circuit 60 is supplied to a word line WL or a bit line BL through the row decoder 62 or the column decoder 64. Data output from the column decoder 64 is input to a sense amplifier 66. The data which is read by the sense amplifier 66 is retained in a data buffer 68, and the data is accessed randomly by the control of the controlling circuit 58 to be output through a data input/output buffer 70. Data to be written is once retained in the data buffer 68 through the data input/output buffer 70 and transferred to the column decoder 64 by the control of the controlling circuit 58.

In such a manner, in the nonvolatile semiconductor memory device, it is necessary to use potential that is different from the power source potential in the memory cell array 52. Therefore, it is desirable that at least the memory cell array 52 and the peripheral circuit 54 be electrically insulated and isolated. In this case, as in embodiments which will be explained afterwards, the nonvolatile memory element and a transistor in the peripheral circuit are each formed using a semiconductor layer formed over an insulating surface, whereby the memory element and the peripheral circuit are easily insulated and isolated. Accordingly, malfunction is eliminated and a nonvolatile semiconductor memory device with low power consumption can be obtained.

Hereinafter, a nonvolatile semiconductor memory device according to the present invention will be explained in more detail in the following embodiments. In a structure of the present invention, which will be explained below, reference numerals denoting the same portions are used in common in different drawings, and repeated explanation thereof in such a case may be omitted.

[Embodiment 1]

This embodiment will explain an example of a nonvolatile semiconductor memory device with reference to the drawings. In the following explanation, in the nonvolatile semiconductor memory device, a nonvolatile memory element included in a memory portion and an element such as a transistor included a logic portion, which is provided over the same substrate as that of the memory portion and controls the memory portion or the like, are formed at the same time.

First, FIG. 8 shows an equivalent circuit of the memory portion in the nonvolatile semiconductor memory device.

The memory portion shown in this embodiment includes a plurality of memory cells each having a selection transistor and a nonvolatile memory element. In FIG. 8, a selection transistor S01 and a nonvolatile memory element M01 form one memory cell. Similarly, pairs of a selection transistor S02 and a nonvolatile memory element M02, a selection transistor S03 and a nonvolatile memory element M03, a selection transistor S11 and a nonvolatile memory element M11, a selection transistor S12 and a nonvolatile memory element M12, and a selection transistor S13 and a nonvolatile memory element M13 each form a memory cell.

A gate electrode of the selection transistor S01 is connected to a word line WL1, one of a source and a drain is connected to a bit line BL0, and the other is connected to a source or a drain of the nonvolatile memory element M01. Further, a gate electrode of the nonvolatile memory element M01 is connected to a word line WL11, one of a source and a drain is connected to a source or a drain of the selection transistor S01, and the other is connected to a source line SL.

The selection transistor provided in the memory portion has high drive voltage compared to the transistor provided in the logic portion. Therefore, a gate insulating film and the like of the transistor provided in the memory portion and the transistor provided in the logic portion are preferably formed with different thicknesses. For example, when drive voltage is low and variation in threshold voltage is desired to be reduced, a thin film transistor in which a gate insulating film is thin is preferably provided, whereas, when drive voltage is high and a high withstanding voltage of a gate insulating film is required, a thin film transistor in which a gate insulating film is thick is preferably provided.

Figure 32:
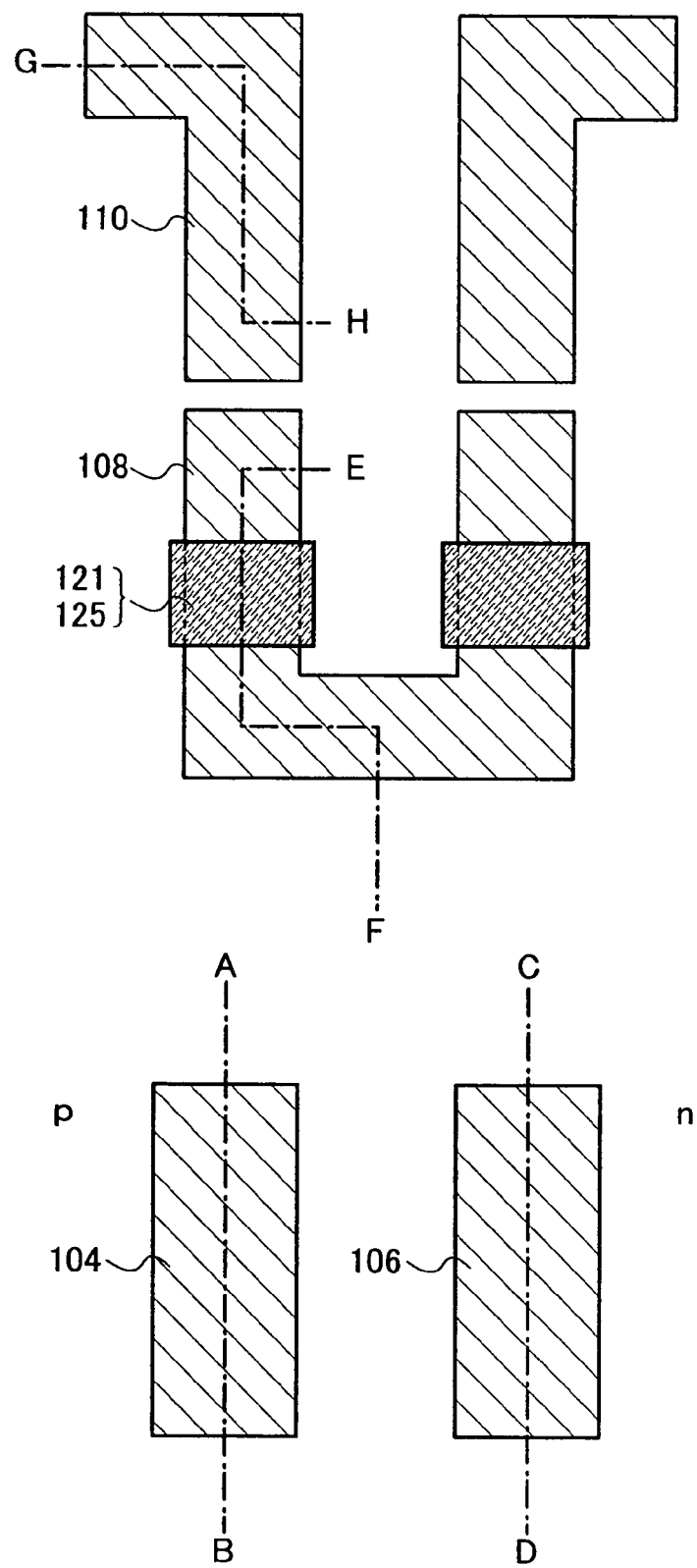
FIG. 32 is a view showing an example of a top view of a nonvolatile semiconductor memory device of the present invention.
Figure 33:
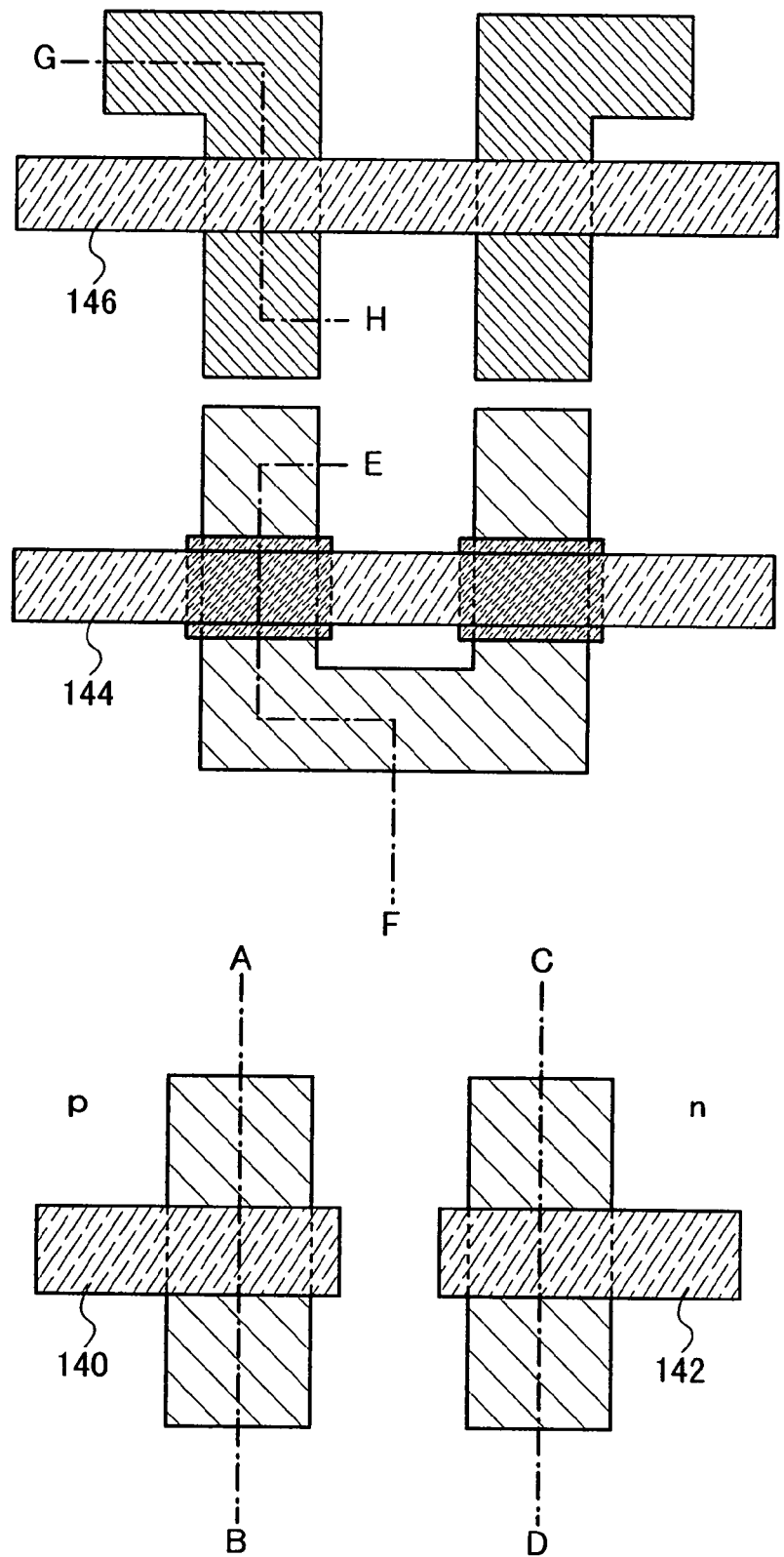
FIG. 33 is a view showing an example of a top view of a nonvolatile semiconductor memory device of the present invention.

Therefore, with reference to the drawings, this embodiment will hereinafter explain the case where a thin insulating layer is formed in the transistor in the logic portion in which drive voltage is low and variation in threshold voltage is desirably reduced, and a thick insulating layer is formed in the transistor in the memory portion in which drive voltage is high and a high withstanding voltage of a gate insulating film is required. FIGS. 32 to 34 show top views, and FIGS. 18A to 18C, 19A to 19C, 20A to 20C, and 21A to 21C show cross-sectional views taken along A-B, C-D, E-F, and G-H of FIGS. 32 to 34. A-B and C-D each show a thin film transistor provided in the logic portion, E-F shows a nonvolatile memory element provided in the memory portion, and G-H shows a thin film transistor provided in the memory portion. In addition, this embodiment will explain the case where the thin film transistor provided in A-B is a p-channel type, the thin film transistors provided in C-D and G-H are an n-channel type, and electrons are used for carrier transition in the nonvolatile memory element provided in E-F. However, the nonvolatile semiconductor memory device of the present invention is not limited thereto.

First, island-like semiconductor layers 104, 106, 108, and 110 are formed over a substrate 100 with an insulating layer 102 interposed therebetween. First insulating layers 112, 114, 116, and 118 are formed so as to cover the island-like semiconductor layers 104, 106, 108, and 110, respectively. Then, charge accumulation layers 120 and 123, which function as a floating gate of a nonvolatile memory element that will be completed afterwards, are stacked so as to cover the first insulating layers 112, 114, 116, and 118 (refer to FIG. 18A). The island-like semiconductor layers 104, 106, 108, and 110 can be provided as follows: an amorphous semiconductor layer is formed using a material containing silicon (Si) as its main component (such as $Si_xGe_{1-x}$) by a sputtering method, an LPCVD method, a plasma CVD method, or the like over the insulating layer 102 which is formed over the substrate 100 in advance, and the amorphous semiconductor layer is crystallized and selectively etched. The amorphous semiconductor layer can be crystallized by a laser crystallization method, a thermal crystallization method using RTA or an annealing furnace, a thermal crystallization method using a metal element which promotes crystallization, a method in which the above methods are combined, or the like.

When crystallization or recrystallization of the semiconductor layer is performed by laser beam irradiation, an LD-pumped continuous wave (CW) laser ($YVO_4$, the second harmonic (wavelength: 532 nm)) can be used as a laser beam source. The wavelength is not necessarily limited to the second harmonic; however, the second harmonic is superior to other higher harmonics in terms of energy efficiency. When the semiconductor layer is irradiated with a CW laser beam, the semiconductor layer continuously receives energy; therefore, once the semiconductor layer is melted, the melted state can be continuous. Moreover, it is possible to move a solid-liquid interface of the semiconductor layer by scanning of a CW laser beam and to form a crystal grain which is elongated in one direction along this scanning direction. A solid-state laser is used because its output is so stable that a stable process can be expected as compared to a gas laser or the like. Not only a CW laser but also a pulsed laser with a repetition rate of 10 MHz or more can be used. In the case of a pulsed laser with a high repetition rate, when the pulse interval of the laser beam is shorter than the period after the semiconductor layer is melted and before the melted semiconductor layer is solidified, the semiconductor layer can be maintained in a melted state at all times. Also, by movement of the solid-liquid interface, a semiconductor layer including a crystal grain which is elongated in one direction can be formed. Other CW lasers or pulsed lasers with a repetition rate of 10 MHz or more can also be used. For example, as the gas laser, an Ar laser, a Kr laser, a $CO_2$ laser, or the like is given. As the solid-state laser, a YAG laser, a YLF laser, a $YAlO_3$ laser, a $GdVO_4$ laser, a KGW laser, a KYW laser, an alexandrite laser, a Ti:sapphire laser, a $Y_2O_3$ laser, a $YVO_4$ laser, or the like is given. A YAG laser, a $Y_2O_3$ laser, a $GdVO_4$ laser, a $YVO_4$ laser, or the like is also called a ceramic laser. As a metal vapor laser, a helium-cadmium laser or the like is given. Moreover, oscillation of a laser beam with $TEM_{00}$ (single transverse mode) in a laser oscillator is preferable because the energy homogeneity of a linear beam spot on an irradiation surface can be improved. In addition, a pulsed excimer laser may also be used.

As the substrate 100, a glass substrate, a quartz substrate, a metal substrate (such as a ceramic substrate or a stainless steel substrate), or a semiconductor substrate such as a silicon substrate can be used. In addition, as a plastic substrate, a substrate formed using polyethylene terephthalate (PET), polyethylene naphthalate (PEN), polyether sulfone (PES), acrylic, or the like can be used.

The insulating layer 102 is formed by a CVD method, a sputtering method, or the like using an insulating material such as silicon oxide, silicon nitride, silicon oxynitride (SiOxNy, (x>y)), or silicon nitride oxide (SiNxOy, (x>y)). For example, in the case of the insulating layer 102 with a two-layer structure, a silicon nitride oxide film may be formed as a first insulating layer, and a silicon oxynitride film may be formed as a second insulating layer. Alternatively, a silicon nitride film may be formed as the first insulating layer, and a silicon oxide film may be formed as the second insulating layer. Through formation of the insulating layer 102 functioning as a blocking layer, an element formed thereover can be prevented from being adversely affected due to alkali metal such as Na or alkaline earth metal from the substrate 100. When the substrate 100 is formed using quartz, the insulating layer 102 may be omitted.

The first insulating layers 112, 114, 116, and 118 can be formed through heat treatment, plasma treatment, or the like performed to the semiconductor layers 104, 106, 108, and 110. For example, oxidation treatment, nitridation treatment, or oxynitridation treatment is performed to the semiconductor layers 104, 106, 108, and 110 by high-density plasma treatment, whereby the first insulating layers 112, 114, 116, and 118 formed using an oxide film, a nitride film, or an oxynitride film are formed over the semiconductor layers 104, 106, 108, and 110, respectively. It is to be noted that the first insulating layers 112, 114, 116, and 118 may also be formed by a plasma CVD method or a sputtering method.

For example, in the case where oxidation treatment or nitridation treatment is performed using a semiconductor layer containing silicon as its main component as each of the semiconductor layers 104, 106, 108, and 110 by high-density plasma treatment, a silicon oxide (SiOx) film or a silicon nitride (SiNx) film is formed as each of the first insulating layers 112, 114, 116, and 118. Moreover, after oxidation treatment is performed to the semiconductor layers 104, 106, 108, and 110 by high-density plasma treatment, nitridation treatment may be performed by performing high-density plasma treatment again. In this case, a silicon oxide film is formed to be in contact with each of the semiconductor layers 104, 106, 108, and 110 and a film containing oxygen and nitrogen (hereinafter referred to as an silicon oxynitride film) is formed over the silicon oxide film, whereby a stack of the silicon oxide film and the silicon oxynitride film is formed as each of the first insulating layers 112, 114, 116, and 118.

In this embodiment, the first insulating layers 112, 114, 116, and 118 are each formed with a thickness of greater than or equal to 1 nm and less than or equal to 10 nm, preferably greater than or equal to 1 nm and less than or equal to 5 nm. For example, oxidation treatment is performed to the semiconductor layers 104, 106, 108, and 110 by high-density plasma treatment, whereby a silicon oxide film with a thickness of approximately 5 nm is formed over each surface of the semiconductor layers 104, 106, 108, and 110. Thereafter, nitridation treatment is performed by high-density plasma treatment, whereby a silicon oxynitride film with a thickness of approximately 2 nm is formed over the surface of the silicon oxide film. In this case, the silicon oxide film formed over each surface of the semiconductor layers 104, 106, 108, and 110 has a thickness of approximately 3 nm. This is because the thickness of the formed silicon oxynitride film is reduced from the thickness of the silicon oxide film. Moreover, at this time, the oxidation treatment and the nitridation treatment by high-density plasma treatment are preferably performed continuously without exposure to the air. By performing the high-density plasma treatment continuously, prevention of an impurity mixture and improvement in production efficiency can be achieved.

In the case where the semiconductor layers are oxidized by high-density plasma treatment, the plasma treatment is performed in an oxygen atmosphere (for example, an atmosphere containing oxygen ($O_2$) or dinitrogen monoxide ($N_2O$) and a rare gas (at least one of He, Ne, Ar, Kr, and Xe), or an atmosphere containing oxygen or dinitrogen monoxide, hydrogen ($H_2$), and a rare gas). On the other hand, in the case where the semiconductor layers are nitrided by high-density plasma treatment, the plasma treatment is performed in a nitrogen atmosphere (for example, an atmosphere containing nitrogen ($N_2$) and a rare gas (at least one of He, Ne, Ar, Kr, and Xe), an atmosphere containing nitrogen, hydrogen, and a rare gas, or an atmosphere containing $NH_3$ and a rare gas).

As the rare gas, Ar can be used, for example. Alternatively, a gas in which Ar and Kr are mixed may also be used. In the case where high-density plasma treatment is performed in a rare gas atmosphere, the first insulating layers 112, 114, 116, and 118 may contain the rare gas (at least one of He, Ne, Ar, Kr, and Xe) used in the plasma treatment. When Ar is used, the first insulating layers 112, 114, 116, and 118 may contain Ar.

Moreover, the high-density plasma treatment is performed in an atmosphere containing the aforementioned gas with an electron density of greater than or equal to $1\times10^{11}$ $cm^{-3}$ and plasma electron temperatures of less than or equal to 1.5 eV. More specifically, the electron density is greater than or equal to $1\times10^{11}$ $cm^{-3}$ and less than or equal to $1\times10^{13}$ $cm^{-3}$, and the plasma electron temperature is greater than or equal to 0.5 eV and less than or equal to 1.5 eV. Since the plasma electron density is high and the electron temperature around an object to be processed formed over the substrate 100 (the semiconductor layers 104, 106, 108, and 110 in this embodiment) is low, plasma damage to the object to be processed can be prevented. Moreover, since the plasma electron density is as high as greater than or equal to $1\times10^{11}$ $cm^{-3}$, an oxide film or a nitride film formed by oxidizing or nitriding the object to be processed by using the plasma treatment can be dense and superior in uniformity of its thickness and the like compared to a film formed by a CVD method, a sputtering method, or the like. Furthermore, since the plasma electron temperature is as low as less than or equal to 1.5 eV, oxidation treatment or nitridation treatment can be performed at a lower temperature than that in the conventional plasma treatment or thermal oxidation method. For example, even plasma treatment at temperatures lower than the distortion point of a glass substrate by 100° C. or more can sufficiently perform oxidation treatment or nitridation treatment. As the frequency for forming plasma, high frequency such as a microwave (for example, 2.45 GHz) can be used.

In this embodiment, when oxidation treatment is performed to the object to be processed by high-density plasma treatment, a mixed gas of oxygen ($O_2$), hydrogen ($H_2$) and argon (Ar) is introduced. Here, as a mixed gas, 0.1 to 100 sccm of oxygen, 0.1 to 100 sccm of hydrogen, and 100 to 5000 sccm of argon may be introduced. The mixed gas is preferably introduced at a ratio of 1:1:100 (oxygen:hydrogen: argon). For example, 5 sccm of oxygen, 5 sccm of hydrogen, and 500 sccm of argon may be introduced.

In addition, when nitridation treatment is performed by high-density plasma treatment, a mixed gas of nitrogen ($N_2$) and argon (Ar) is introduced. As a mixed gas used here, 20 to 2000 sccm of nitrogen and 100 to 10000 sccm of argon may be introduced. For example, 200 sccm of nitrogen and 1000 sccm of argon may be introduced.

In this embodiment, the first insulating layer 116 formed over the semiconductor layer 108 in the memory portion functions as a tunnel oxide film in a nonvolatile memory element which will be completed afterwards. Therefore, the thinner the first insulating layer 116 is, the more easily the tunnel current flows, which allows a higher-speed operation as a memory. Further, since the first insulating layer 116 is thinner, charges can be accumulated at lower voltage in a floating gate which will be formed afterwards; therefore, power consumption of the semiconductor device can be reduced. Accordingly, the first insulating layers 112, 114, 116, and 118 are preferably formed thinly.

In general, a thermal oxidation method is given as a method for forming a thin insulating layer over a semiconductor layer. However, when a substrate of which the melting point is not sufficiently high, such as a glass substrate, is used as the substrate 100, it is highly difficult to form the first insulating layers 112, 114, 116, and 118 by a thermal oxidation method. Moreover, an insulating layer formed by a CVD method or a sputtering method has problems in that: sufficient withstanding voltage cannot be obtained because of defects inside the film, and a defect such as a pinhole is produced when the insulating layer is formed thinly. In addition, an insulating layer formed by a CVD method or a sputtering method does not cover the edge of the semiconductor layer sufficiently, resulting in a conductive film and the like, which will be formed afterwards over the first insulating layer 116, and the semiconductor layer to possibly leak. Thus, when the first insulating layers 112, 114, 116, and 118 are formed by the high-density plasma treatment as shown in this embodiment, the first insulating layers 112, 114, 116, and 118 can be denser than an insulating layer formed by a CVD method, a sputtering method, or the like. Moreover, the first insulating layers 112, 114, 116, and 118 can sufficiently cover the edges of the semiconductor layers 104, 106, 108, and 110, respectively. As a result, a high-speed operation and a charge-retention property as a memory can be improved. It is to be noted that when the first insulating layers 112, 114, 116, and 118 are formed by a CVD method or a sputtering method, preferably, high-density plasma treatment is performed after the insulating layer is formed, whereby the surface of the insulating layer is subjected to oxidation treatment, nitridation treatment, or oxynitridation treatment.

The charge accumulation layers 120 and 123 are formed of a stacked structure of a film containing germanium, such as germanium (Ge) or a silicon germanium alloy, and a film containing silicon (Si). In this embodiment, the charge accumulation layer 120 is formed using a film containing germanium as its main component with a thickness of greater than or equal to 1 nm and less than or equal to 20 nm, preferably greater than or equal to 1 nm and less than or equal to 10 nm, by a plasma CVD method in an atmosphere containing a germanium element (for example, $GeH_4$). Thereafter, the charge accumulation layer 123 is formed using a film containing silicon as its main component with a thickness of greater than or equal to 1 nm and less than or equal to 50 nm, preferably greater than or equal to 1 nm and less than or equal to 20 nm, by a plasma CVD method in an atmosphere containing a silicon element (for example, $SiH_4$). Accordingly, a stacked structure of germanium and silicon is provided. Thus, when the semiconductor layer is formed using a material containing silicon as its main component and the film containing germanium, which has a smaller energy gap than that of silicon, is provided as the charge accumulation layer over the semiconductor layer with the first insulating layer functioning as a tunnel oxide film interposed therebetween, a second barrier to charge in the charge accumulation layer, which is formed by the insulating layer, gets higher in terms of energy than a first barrier to charge in the semiconductor layer, which is formed by the insulating layer. As a result, charge can be easily injected from the semiconductor layer to the charge accumulation layer, and the charge is prevented from being discharged from the charge accumulation layer. That is, in the case of an operation as a memory, highly-efficient writing is possible at low voltage, and moreover, a charge-retention property can be improved. Further, the stacked structure including the charge accumulation layers 120 and 123 formed over the semiconductor layer 108 in the memory portion functions as a floating gate in a nonvolatile memory element which will be completed afterwards.

Subsequently, the first insulating layers 112, 114, and 118, and the stacked structure including the charge accumulation layers 120 and 123 formed over the semiconductor layers 104, 106, and 110 are selectively removed, whereas the first insulating layer 116 and the stacked structure including the charge accumulation layers 120 and 123 formed over the semiconductor layer 108 are left. In this embodiment, the semiconductor layer 108, the first insulating layer 116, and the stacked structure including the charge accumulation layers 120 and 123 provided in the memory portion are selectively covered with a resist, and the first insulating layers 112, 114, and 118, and the stacked structure including the charge accumulation layers 120 and 123 formed over the semiconductor layers 104, 106, and 110 are selectively removed by etching (refer to FIG. 18B).

Next, the semiconductor layers 104, 106, and 110 and part of the stacked structure including the charge accumulation layers 120 and 123 formed over the semiconductor layer 108 are selectively covered with a resist 122, the charge accumulation layers 120 and 123 not covered with the resist 122 are selectively removed by etching, and part of the stacked structure including the charge accumulation layers 120 and 123 is left, whereby a stacked structure including charge accumulation layers 121 and 125 functioning as a floating gate is formed (refer to FIGS. 18C and 32).

Then, an impurity region is formed in a specific region of the semiconductor layer 110. In this embodiment, after the resist 122 is removed, a resist 124 is formed so as to selectively cover the semiconductor layers 104, 106, and 108 and part of the semiconductor layer 110. Then, an impurity element is introduced to the semiconductor layer 110 not covered with the resist 124, whereby an impurity region 126 is formed (refer to FIG. 19A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, as the impurity element, phosphorus (P) is introduced to the semiconductor layer 110.

Subsequently, a second insulating layer 128 is formed so as to cover the semiconductor layers 104, 106, and 110, the first insulating layer 116, and the stacked structure including and the charge accumulation layers 121 and 125 functioning as a floating gate formed over the semiconductor layer 108 (refer to FIG. 19B).

The second insulating layer 128 is formed by a CVD method, a sputtering method, or the like using an insulating material such as silicon oxide, silicon nitride, silicon oxynitride (SiOxNy, (x>y)), or silicon nitride oxide (SiNxOy, (x>y)) with a single layer structure or a stacked structure. For example, in the case of the second insulating layer 128 with a single layer structure, a silicon oxynitride film or a silicon nitride oxide film is formed by a CVD method with a thickness of greater than or equal to 5 nm and less than or equal to 50 nm. In addition, in the case of the second insulating layer 128 with a three-layer structure, a silicon oxynitride film may be formed as a first insulating layer, a silicon nitride film may be formed as a second insulating layer, and a silicon oxynitride film may be formed as a third insulating layer. Alternatively, an oxide or a nitride of germanium may be used as the second insulating layer 128.

It is to be noted that the second insulating layer 128 formed over the semiconductor layer 108 functions as a control insulating layer in a nonvolatile memory element which will be completed afterwards, and the second insulating layer 128 formed over the semiconductor layer 110 functions as a gate insulating film in a transistor which will be completed afterwards.

Subsequently, a resist 130 is selectively formed so as to cover the second insulating layer 128 formed over the semiconductor layers 108 and 110, and the second insulating layer 128 formed over the semiconductor layers 104 and 106 is selectively removed (refer to FIG. 19C).

Then, third insulating layers 132 and 134 are formed so as to cover the semiconductor layers 104 and 106, respectively (refer to FIG. 20A).

The third insulating layers 132 and 134 are formed by any of the methods for forming the first insulating layers 112, 114, 116, and 118. For example, oxidation treatment, nitridation treatment, or oxynitridation treatment is performed to the semiconductor layers 104, 106, 108, and 110 by high-density plasma treatment, whereby the third insulating layers 132 and 134 are formed using an oxide film, a nitride film, or an oxynitride film of silicon over the semiconductor layers 104 and 106, respectively.

In this embodiment, the third insulating layers 132 and 134 are each formed with a thickness of greater than or equal to 1 nm and less than or equal to 20 nm, preferably greater than or equal to 1 nm and less than or equal to 10 nm. For example, after a silicon oxide film is formed over each surface of the semiconductor layers 104 and 106 by oxidation treatment performed to the semiconductor layers 104 and 106 by high-density plasma treatment, a silicon oxynitride film is formed over the surface of the silicon oxide film by nitridation treatment performed by high-density plasma treatment. Further, in this case, oxidation treatment or nitridation treatment is performed to the surface of the second insulating layer 128 formed over the semiconductor layers 108 and 110, whereby an oxide film or an oxynitride film is formed. The third insulating layers 132 and 134 formed over the semiconductor layers 104 and 106 each function as a gate insulating film in a transistor which will be completed afterwards.

Subsequently, a conductive film is formed so as to cover the third insulating layers 132 and 134 formed over the semiconductor layers 104 and 106, and the second insulating layer 128 formed over the semiconductor layers 108 and 110 (refer to FIG. 20B). In this embodiment, an example is shown, in which conductive films 136 and 138 are sequentially stacked as the conductive film. Of course, the conductive film may have a single-layer structure or a stacked structure including three or more layers.

The conductive films 136 and 138 can be formed using an element such as tantalum (Ta), tungsten (W), titanium (Ti), molybdenum (Mo), aluminum (Al), copper (Cu), chromium (Cr), or niobium (Nb), or an alloy material or a compound material containing the above element as its main component. In addition, a metal nitride film obtained by nitriding these elements can be used. Besides, a semiconductor material typified by polycrystalline silicon doped with an impurity element such as phosphorus can also be used.

In this embodiment, a stacked structure is provided, in which the conductive film 136 is formed using tantalum nitride and the conductive film 138 is formed using tungsten thereover. Besides, a single layer or a stacked layer using tungsten nitride, molybdenum nitride, or titanium nitride can be used as the conductive film 136, and a single layer or a stacked layer using tantalum, molybdenum, or titanium can be used as the conductive film 138.

Next, the stacked conductive films 136 and 138 are selectively removed by etching, and the conductive films 136 and 138 are partially left over the semiconductor layers 104, 106, 108, and 110, whereby conductive films 140, 142, 144, and 146 each functioning as a gate electrode are formed (refer to FIGS. 20C and 33). It is to be noted that the conductive film 144 formed over the semiconductor layer 108 provided in the memory portion functions as a control gate in a nonvolatile memory element which will be completed afterwards. In addition, the conductive films 140, 142, and 146 each function as a gate electrode in a transistor which will be completed afterwards.

Then, a resist 148 is selectively formed so as to cover the semiconductor layer 104. An impurity element is introduced to the semiconductor layers 106, 108, and 110 using the resist 148, and the conductive films 142, 144, and 146 as masks, whereby an impurity region is formed (refer to FIG. 21A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, as the impurity element, phosphorus (P) is used.

In FIG. 21A, by introducing the impurity element, an impurity region 152 which forms a source or drain region and a channel forming region 150 are formed in the semiconductor layer 106. In addition, in the semiconductor layer 108, an impurity region 156 which forms a source or drain region, a low-concentration impurity region 158 which forms an LDD region, and a channel forming region 154 are formed. Moreover, in the semiconductor layer 110, an impurity region 162 which forms a source or drain region, a low-concentration impurity region 164 which forms an LDD region, and a channel forming region 160 are formed.

In FIG. 21A, the introduced impurity element passes through the stacked structure including the charge accumulation layers 121 and 125 functioning as a floating gate, whereby the low-concentration impurity region 158 is formed in the semiconductor layer 108. Therefore, in the semiconductor layer 108, the channel forming region 154 is formed in a region which overlaps with both the conductive film 144 and the stacked structure including the charge accumulation layers 121 and 125, the low-concentration impurity region 158 is formed in a region which overlaps with the stacked structure including the charge accumulation layers 121 and 125 and which does not overlap with the conductive film 144, and the high-concentration impurity region 156 is formed in a region which overlaps with neither the conductive film 144 nor the stacked structure including the charge accumulation layers 121 and 125.

Subsequently, a resist 166 is selectively formed so as to cover the semiconductor layers 106, 108, and 110. An impurity element is introduced to the semiconductor layer 104 using the resist 166 and the conductive film 140 as masks, whereby an impurity region is formed (refer to FIG. 21B). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, an impurity element having a different conductivity type from that of the impurity element introduced to the semiconductor layers 106, 108, and 110 in FIG. 21A (such as boron (B)) is used. As a result, in the semiconductor layer 104, an impurity region 170 which forms a source or drain region and a channel forming region 168 are formed.

Next, an insulating layer 172 is formed so as to cover the second insulating layer 128, the third insulating layers 132 and 134, and the conductive films 140, 142, 144, and 146. Over the insulating layer 172, a conductive film 174 is formed so as to be electrically connected to the impurity regions 170, 152, 156, and 162 which are formed in the semiconductor layers 104, 106, 108, and 110, respectively (refer to FIGS. 21C and 34).

The insulating layer 172 is formed by a CVD method, a sputtering method, or the like using an insulating layer containing oxygen or nitrogen such as silicon oxide (SiOx), silicon nitride (SiNx), silicon oxynitride (SiOxNy, (x>y)), or silicon nitride oxide (SiNxOy, (x>y)), a film containing carbon such as DLC (diamond like carbon), an organic material such as epoxy, polyimide, polyamide, polyvinyl phenol, benzocyclobutene, or acrylic, or a siloxane material such as a siloxane resin with a single layer structure or a stacked structure. The siloxane material is a material including a Si—O—Si bond. Siloxane has a skeleton structure formed of a bond of silicon (Si) and oxygen (O). As a substituent, an organic group containing at least hydrogen (for example, an alkyl group or aromatic hydrocarbon) is used. Alternatively, a fluoro group may be used as a substituent. In addition, as a substituent, both a fluoro group and an organic group containing at least hydrogen may also be used.

The conductive film 174 is formed by a CVD method, a sputtering method, or the like using an element such as aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing the above element as its main component with a single layer structure or a stacked structure. An alloy material containing aluminum as its main component corresponds to, for example, an alloy material containing nickel, whose main component is aluminum, or an alloy material containing nickel and one or both of carbon and silicon, whose main component is aluminum. The conductive film 174 preferably employs, for example, a stacked structure of a barrier film, an aluminum-silicon (Al—Si) film, and a barrier film, or a stacked structure of a barrier film, an aluminum-silicon (Al—Si) film, a titanium nitride (TiN) film, and a barrier film. It is to be noted that the barrier film corresponds to a thin film formed using titanium, a nitride of titanium, molybdenum, or a nitride of molybdenum. Aluminum and aluminum silicon which have the low resistance and are inexpensive are optimal materials for forming the conductive film 174. In addition, generation of a hillock of aluminum or aluminum silicon can be prevented when upper and lower barrier layers are provided. Further, when the barrier film is formed using titanium that is a highly-reducible element, even if a thin natural oxide film is formed on the crystalline semiconductor layer, the natural oxide film is reduced so that preferable contact with the crystalline semiconductor layer can be obtained.

In this embodiment, the stacked structure including the charge accumulation layers 121 and 125 functioning as a floating gate is formed so as to extend beyond the edges of the semiconductor layer 108 (refer to FIG. 32). Therefore, the stacked structure including the charge accumulation layers 121 and 125 functioning as a floating gate is formed over the edge of the semiconductor layer 108 provided in an island shape with the first insulating layer 116 functioning as a tunnel insulating layer interposed therebetween. Accordingly, characteristics of the nonvolatile memory element may be adversely affected due to a coverage defect of the first insulating layer 116 or charges accumulated in the manufacturing process. Therefore, in the above described structure, an impurity region 194 may be selectively provided in a region which overlaps with the stacked structure including the charge accumulation layers 121 and 125 and in the neighborhood of the edge portion of the semiconductor layer 108 (refer to FIG. 35).

The impurity region 194 is provided so as to have a different conductivity type from that of the impurity region 156 functioning as a source or drain region in the semiconductor layer 108. For example, when the impurity region 156 is provided so as to have n-type conductivity, the impurity region 194 is provided so as to have p-type conductivity.

Figure 35:
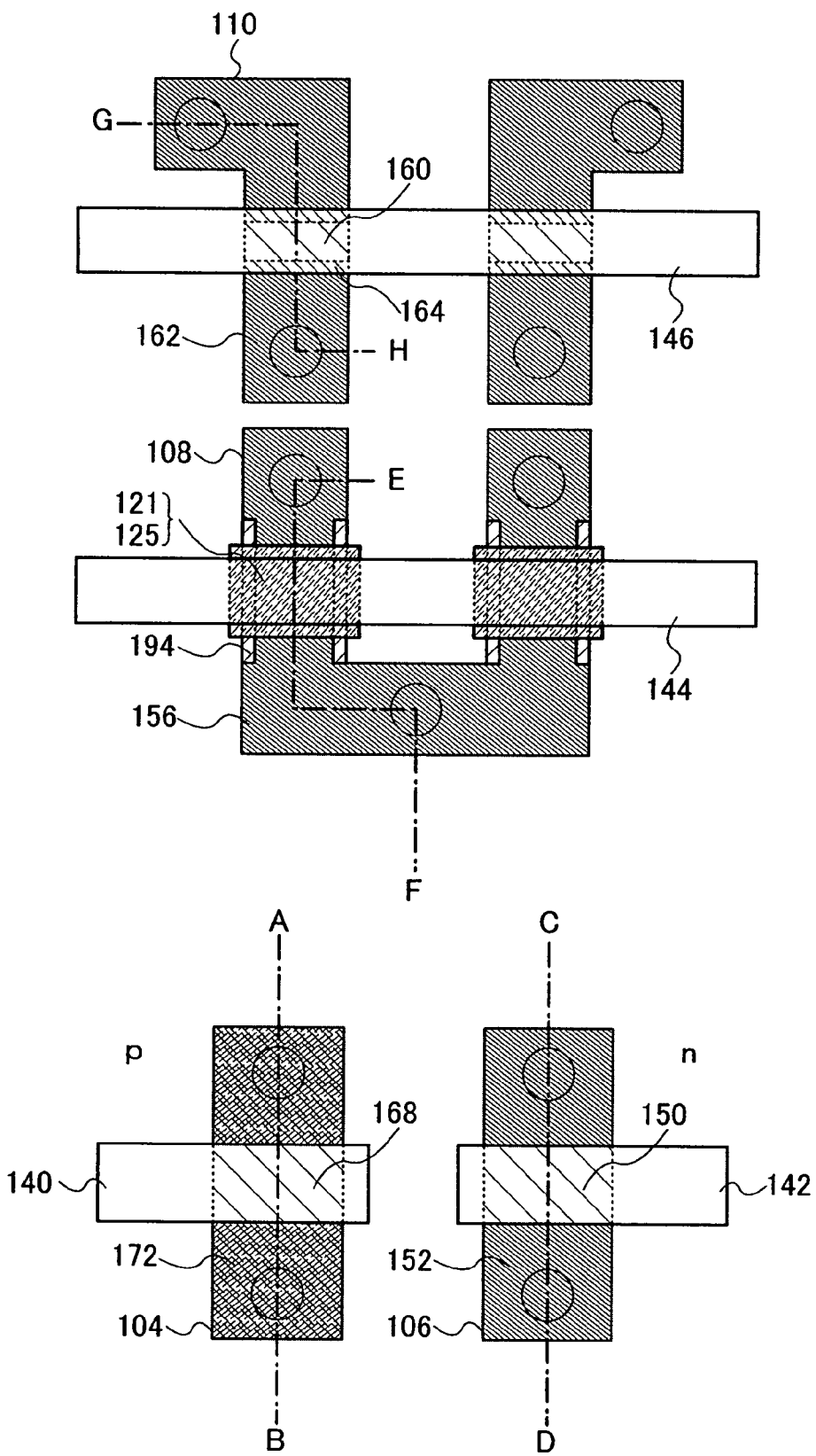
FIG. 35 is a view showing an example of a top view of a nonvolatile semiconductor memory device of the present invention.

In addition, FIG. 35 shows an example in which the impurity region 194 is provided in the region which overlaps with the stacked structure including the charge accumulation layers 121 and 125 functioning as a floating gate and the in the neighborhood of the edge portion of the semiconductor layer 108; however, the present invention is not limited thereto. For example, the impurity region 194 may be provided only in the region which overlaps with the stacked structure including the charge accumulation layers 121 and 125 in the edge of the semiconductor layer 108, or in all the peripheral portions of the edge of the semiconductor layer 108. Alternatively, for example, the impurity region 194 may be provided around the region which overlaps with the stacked structure including the charge accumulation layers 121 and 125 in the edge of the semiconductor layer 108 and not provided below the stacked structure including the charge accumulation layers 121 and 125 (refer to FIG. 36).

In such a manner, by providing the impurity region 194, resistance is enhanced due to a p-n junction in a portion where the impurity regions 156 and 194 are adjacent. Accordingly, characteristics of the nonvolatile memory element are prevented from being adversely affected due to a coverage defect of the first insulating layer 116 and charges and the like accumulated in the manufacturing process.

Figure 36:
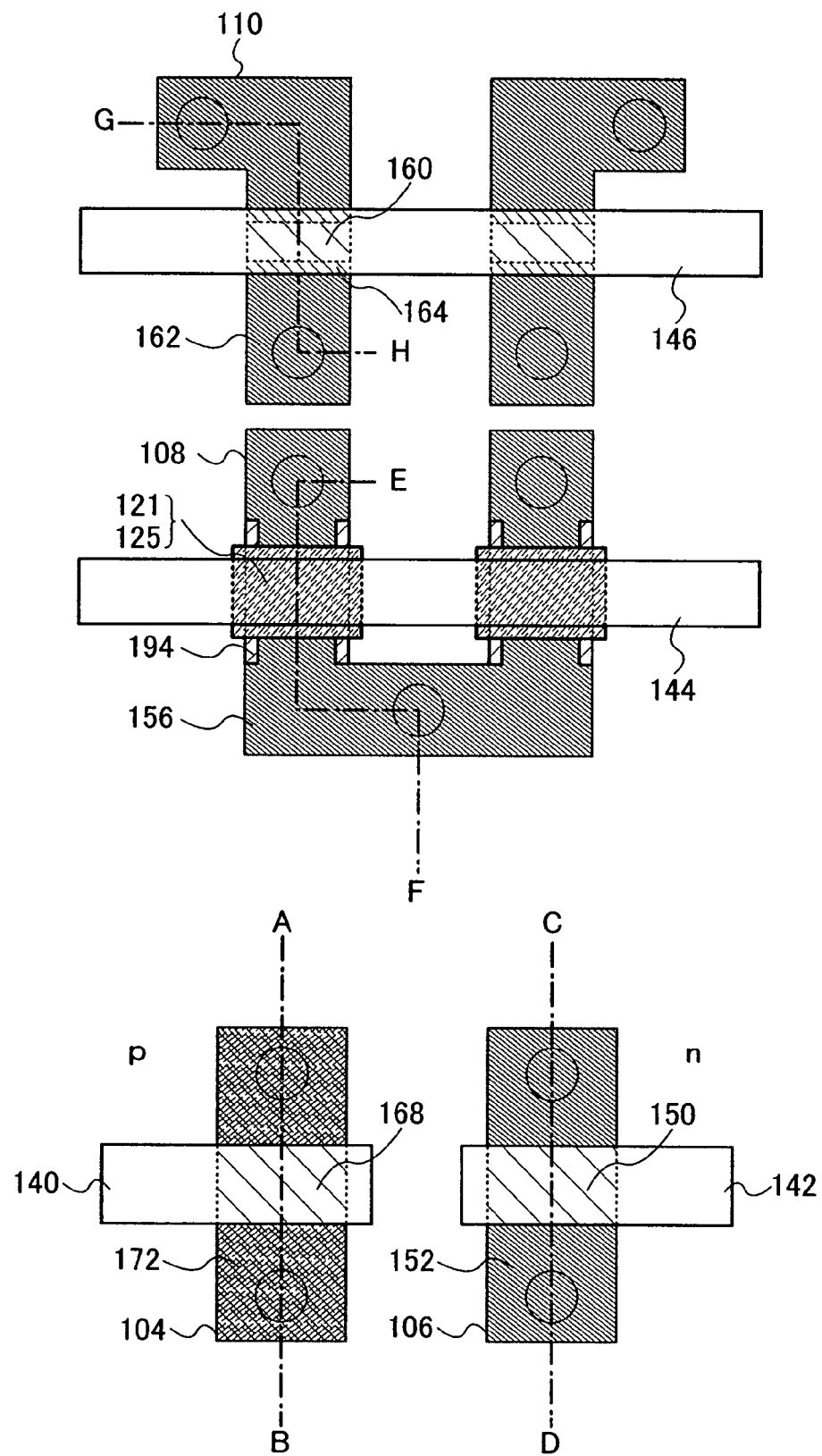
FIG. 36 is a view showing an example of a top view of a nonvolatile semiconductor memory device of the present invention.

In this embodiment, the nonvolatile memory element in E-F is explained. However, the impurity region 194 may also be similarly provided in the transistors provided in A-B, C-D, and G-H as shown in FIGS. 35 and 36.

In the nonvolatile semiconductor memory device of this embodiment, low power consumption can be achieved by employing, depending on a configuration of a circuit, a different thickness of a gate insulating layer for a transistor. In addition, a stable operation of the nonvolatile semiconductor memory device can be achieved. Specifically, by formation of a thin gate insulating layer for a transistor included in a logic portion, variation in threshold voltage can be reduced, and the memory device can be driven at low voltage. By formation of a thick gate insulating layer for a selection transistor included in a memory portion, stability of an operation can be enhanced even when higher voltage than that in the logic portion is employed in writing and erasing operations in the nonvolatile memory element. In the nonvolatile memory element, charge can be easily injected from a semiconductor layer to the floating gate electrode, and the charge can be prevented from being discharged from the floating gate electrode. In other words, in the case of an operation as a memory, writing can be performed with very high efficiency at low voltage, and a charge-retention property can be improved. According to this embodiment, a nonvolatile semiconductor memory device which has the excellent effect as described above can be manufactured in sequential steps.

This embodiment can be executed by being combined with the embodiment mode or other embodiments of this specification.

[Embodiment 2]

Figure 38A:
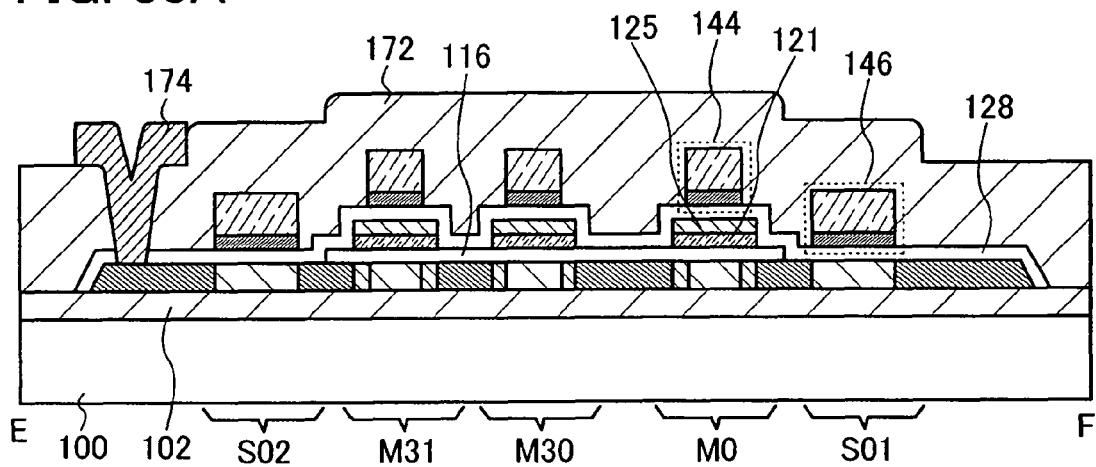
FIGS. 38A and 38B are views each showing an example of a nonvolatile semiconductor memory device of the present invention.
Figure 38B:
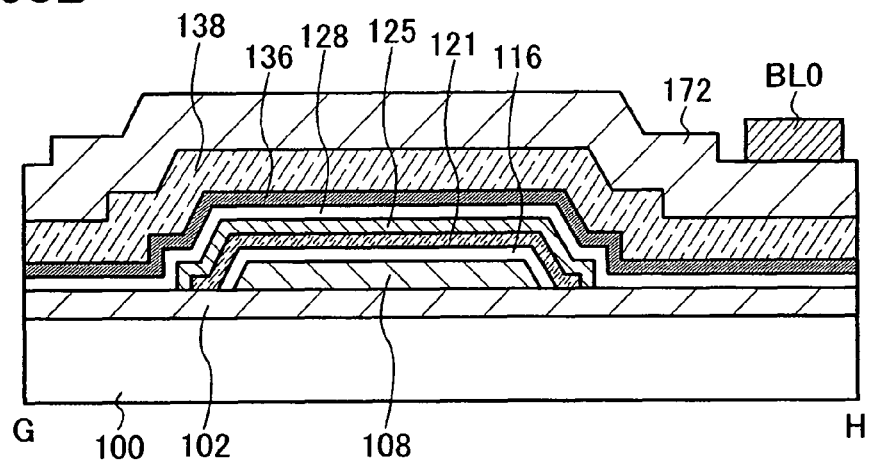

This embodiment will explain the case where a plurality of nonvolatile memory elements are provided over one island-like semiconductor layer in the structure shown in Embodiment 1, with reference to the drawings. It is to be noted that the same portions as those in the above embodiment are denoted by the same reference numerals, and explanation thereof will be omitted. FIG. 37 shows a top-view, and FIGS. 38A and 38B show cross-sectional views taken along E-F and G-H of FIG. 37.

The nonvolatile semiconductor memory device shown in this embodiment includes island-like semiconductor layers 200a and 200b electrically connected to bit lines BL0 and BL1, respectively. Over each of the island-like semiconductor layers 200a and 200b, a plurality of nonvolatile memory elements are provided (refer to FIGS. 37, and 38A and 38B). Specifically, over the semiconductor layer 200a, a NAND cell 202a including a plurality of nonvolatile memory elements M0 to M31 is provided between selection transistors S01 and S02. Further, over the semiconductor layer 200b, a NAND cell 202b including a plurality of nonvolatile memory elements is provided between selection transistors. In addition, by the semiconductor layers 200a and 200b which are separately provided, the adjacent NAND cells 202a and 202b can be insulated and isolated.

When a plurality of nonvolatile memory elements are provided over one island-like semiconductor layer, further integration of the nonvolatile memory elements becomes possible, whereby a large-capacity nonvolatile semiconductor memory device can be formed.

In this embodiment, by formation of a thick gate insulating layer in a selection transistor of a NAND cell as in Embodiment 1, stability of an operation can be enhanced even when higher voltage than that in a logic portion is employed in writing and erasing operations in the nonvolatile memory element. In the nonvolatile memory element, charges can be easily injected from a semiconductor layer to a floating gate electrode, and charges can be prevented from being discharged from the floating gate electrode. With such a structure, stability of an operation of the nonvolatile semiconductor memory device according to this embodiment can be achieved.

This embodiment can be executed by being combined with the embodiment mode or other embodiments of this specification.

[Embodiment 3]

This embodiment will explain a manufacturing method of a semiconductor device which is different from that of Embodiment 1 with reference to the drawings. It is to be noted that the same portions as those in the above embodiment are denoted by the same reference numerals, and explanation thereof will be omitted. In FIGS. 22A to 22C, 23A to 23C, and 24A and 24B, A-B and C-D each show a thin film transistor provided in a logic portion, E-F shows a nonvolatile memory element provided in a memory portion, and G-H shows a thin film transistor provided in the memory portion.

First, components up through FIG. 18C are similarly formed. Thereafter, the resist 122 is removed, and a second insulating layer 128 is formed so as to cover semiconductor layers 104, 106, and 110, and a first insulating layer 116 and a stacked structure including charge accumulation layers 121 and 125 formed over a semiconductor layer 108 (refer to FIG. 22A).

Then, a resist 130 is selectively formed so as to cover the second insulating layer 128 formed over the semiconductor layers 108 and 110, and the second insulating layer 128 formed over the semiconductor layers 104 and 106 is selectively removed (refer to FIG. 22B).

Then, third insulating layers 132 and 134 are formed so as to cover the semiconductor layers 104 and 106, respectively (refer to FIG. 22C).

A conductive film is formed so as to cover the third insulating layers 132 and 134 formed over the semiconductor layers 104 and 106, and the second insulating layer 128 formed over the semiconductor layers 108 and 110 (refer to FIG. 23A). In this embodiment, as the conductive film, an example is shown, in which conductive films 136 and 138 are sequentially stacked. Of course, the conductive film may have a single layer structure or a stacked structure including three or more layers.

Subsequently, the stacked conductive films 136 and 138 are selectively removed by etching, and the conductive films 136 and 138 are partially left over the semiconductor layers 104, 106, 108, and 110, whereby conductive films 140, 142, 144, and 146 each functioning as a gate electrode are formed (refer to FIG. 23B). It is to be noted that the conductive film 140 includes conductive films 182a and 184a which are stacked using the left conductive films 136 and 138. In addition, in this embodiment, the width (the width in a direction almost parallel to a direction in which carriers flow in a channel forming region (a direction connecting a source region and a drain region)) of the lower conductive film 182a is made larger than that of the conductive film 184a in the conductive film 140. Similarly, a conductive film 182b and a conductive film 184b having the narrower width than that of the conductive film 182b are sequentially stacked in the conductive film 142, a conductive film 182c and a conductive film 184c having the narrower width than that of the conductive film 182c are sequentially stacked in the conductive film 144, and a conductive film 182d and a conductive film 184d having the narrower width than that of the conductive film 182d are sequentially stacked in the conductive film 146.

Next, a resist 148 is selectively formed so as to cover the semiconductor layer 104, and an impurity element is introduced to the semiconductor layers 106, 108, and 110 using the resist 148 and the conductive films 142, 144, and 146 as masks, whereby an impurity region is formed (refer to FIG. 23C). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, as the impurity element, phosphorus (P) is used.

In FIG. 23C, by introducing the impurity element, a high-concentration impurity region 152 which forms a source or drain region, a low-concentration impurity region 186 which forms an LDD region, and a channel forming region 150 are formed in the semiconductor layer 106. In addition, in the semiconductor layer 108, an impurity region 156 which forms a source or drain region, a low-concentration impurity region 158 which forms an LDD region, and a channel forming region 154 are formed. Further, in the semiconductor layer 110, a high-concentration impurity region 162 which forms a source or drain region, a low-concentration impurity region 164 which forms an LDD region, and a channel forming region 160 are formed.

In FIG. 23C, the introduced impurity element passes through the conductive film 182b, whereby the low-concentration impurity region 186 is formed in the semiconductor layer 106. Therefore, in the semiconductor layer 106, the channel forming region 150 is formed in a region which overlaps with both the conductive films 182b and 184b, the low-concentration impurity region 186 is formed in a region which overlaps with the conductive film 182b and which does not overlap with the conductive film 184b, and the high-concentration impurity region 152 is formed in a region which overlaps with neither the conductive film 182b nor 184b.

In FIG. 23C, the introduced impurity element passes through the stacked structure including the charge accumulation layers 121 and 125, whereby the low-concentration impurity region 158 is formed in the semiconductor layer 108. Therefore, in the semiconductor layer 108, the channel forming region 154 is formed in a region which overlaps with both the conductive film 182c and the stacked structure including the charge accumulation layers 121 and 125, the low-concentration impurity region 158 is formed in a region which overlaps with the stacked structure including the charge accumulation layers 121 and 125 and which does not overlap with the conductive film 182c, and the high-concentration impurity region 156 is formed in a region which overlaps with neither the stacked structure including the charge accumulation layers 121 and 125 nor the conductive film 182c. It is to be noted that when the conductive film 182c is formed thinly, a low-concentration impurity region having a concentration that is similar to or lower than that of the low-concentration impurity region 158 may be formed in a region which overlaps with both the conductive film 182c and the stacked structure including the charge accumulation layers 121 and 125 and which does not overlap with the conductive film 184c in the semiconductor layer 108.

In FIG. 23C, the introduced impurity element passes through the conductive film 182d, whereby the low-concentration impurity region 164 is formed in the semiconductor layer 110. Therefore, in the semiconductor layer 110, the channel forming region 160 is formed in a region which overlaps with both the conductive films 182d and 184d, the low-concentration impurity region 164 is formed in a region which overlaps with the conductive film 182d and which does not overlap with the conductive film 184d, and the high-concentration impurity region 162 is formed in a region which overlaps with neither the conductive film 182d nor 184d.

Subsequently, a resist 166 is selectively formed so as to cover the semiconductor layers 106, 108, and 110. An impurity element is introduced to the semiconductor layer 104 using the resist 166 and the conductive film 140 as masks, whereby an impurity region is formed (refer to FIG. 24A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, an impurity element having a different conductivity type from that of the impurity element introduced to the semiconductor layers 106, 108, and 110 in FIG. 23C (such as boron (B)) is used. As a result, in the semiconductor layer 104, a high-concentration impurity region 170 which forms a source or drain region, a low-concentration impurity region 188 which forms an LDD region, and a channel forming region 168 are formed.

In FIG. 24A, the introduced impurity element passes through the conductive film 182a, whereby the low-concentration impurity region 188 is formed in the semiconductor layer 104. Therefore, in the semiconductor layer 104, the channel forming region 168 is formed in a region which overlaps with both the conductive films 182a and 184a, the low-concentration impurity region 188 is formed in a region which overlaps with the conductive film 182a and which does not overlap with the conductive film 184a, and the high-concentration impurity region 170 is formed in a region which overlaps with neither the conductive film 182a nor 184a.

Then, an insulating layer 172 is formed so as to cover the second insulating layer 128, the third insulating layers 132 and 134, and the conductive films 140, 142, 144, and 146. Over the insulating layer 172, a conductive film 174 is formed so as to be electrically connected to the impurity regions 170, 152, 156, and 162 which are formed in the semiconductor layers 104, 106, 108, and 110, respectively (refer to FIG. 24B).

It is to be noted that an impurity region 194 may be also provided in the structure shown in this embodiment as shown in FIGS. 35 and 36.

In the nonvolatile semiconductor memory device of this embodiment, low power consumption can be achieved by employing, depending on a configuration of a circuit, a different thickness of a gate insulating layer for a transistor. In addition, a stable operation of the nonvolatile semiconductor memory device can be achieved. Specifically, by formation of a thin gate insulating layer for a transistor included in a logic portion, variation in threshold voltage can be reduced, and the memory device can be driven at low voltage. By formation of a thick gate insulating layer for a selection transistor included in a memory portion, stability of an operation can be enhanced even when higher voltage than that in the logic portion is employed in writing and erasing operations in the nonvolatile memory element. In the nonvolatile memory element, charges can be easily injected from a semiconductor layer to a floating gate electrode, and the charges can be prevented from being discharged from the floating gate electrode. In other words, in the case of an operation as a memory, writing can be performed with very high efficiency at low voltage, and a charge-retention property can be improved. According to this embodiment, a nonvolatile semiconductor memory device which has the excellent effect as described above can be manufactured in sequential steps.

This embodiment can be executed by being combined with the embodiment mode or other embodiments of this specification.

[Embodiment 4]

Figure 39:
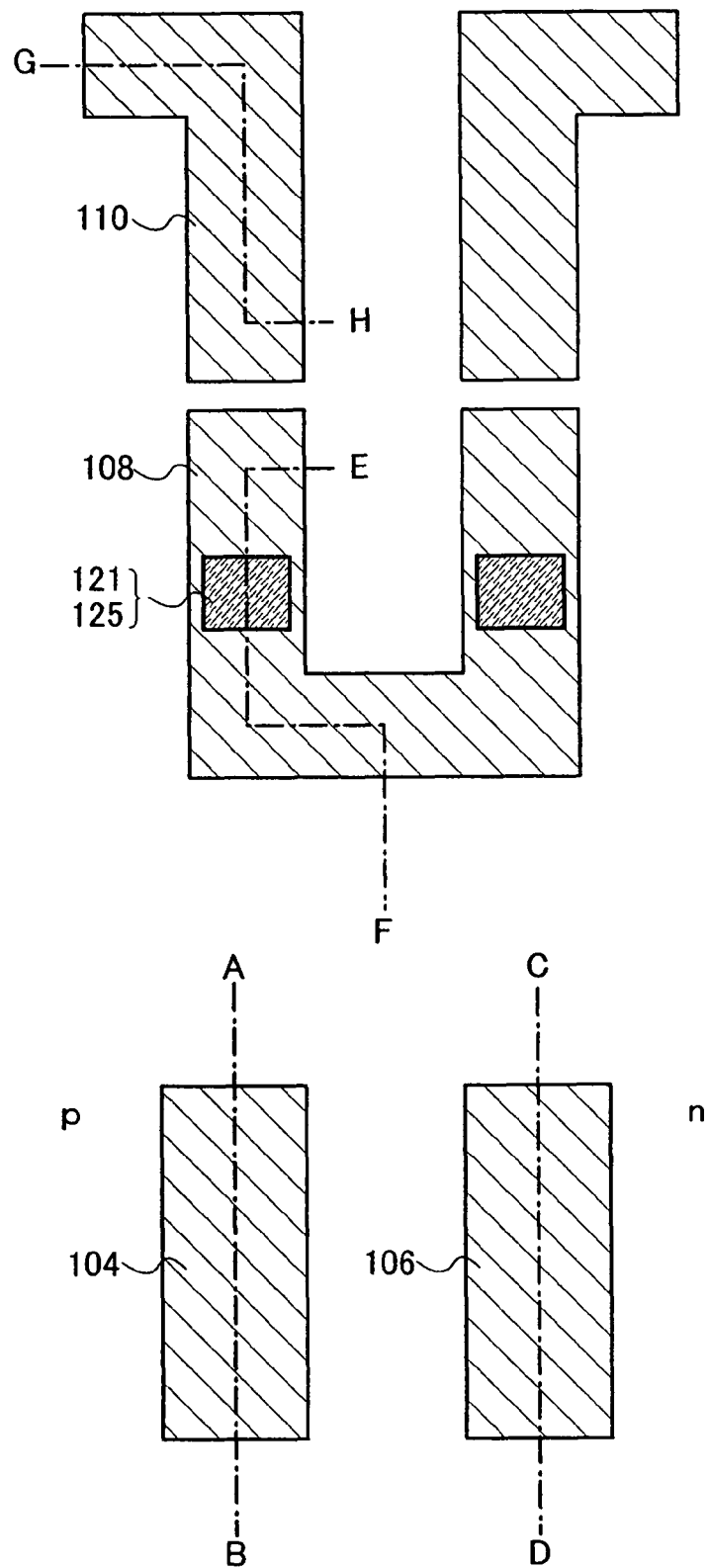
FIG. 39 is a view showing an example of a top view of a nonvolatile semiconductor memory device of the present invention.
Figure 40:
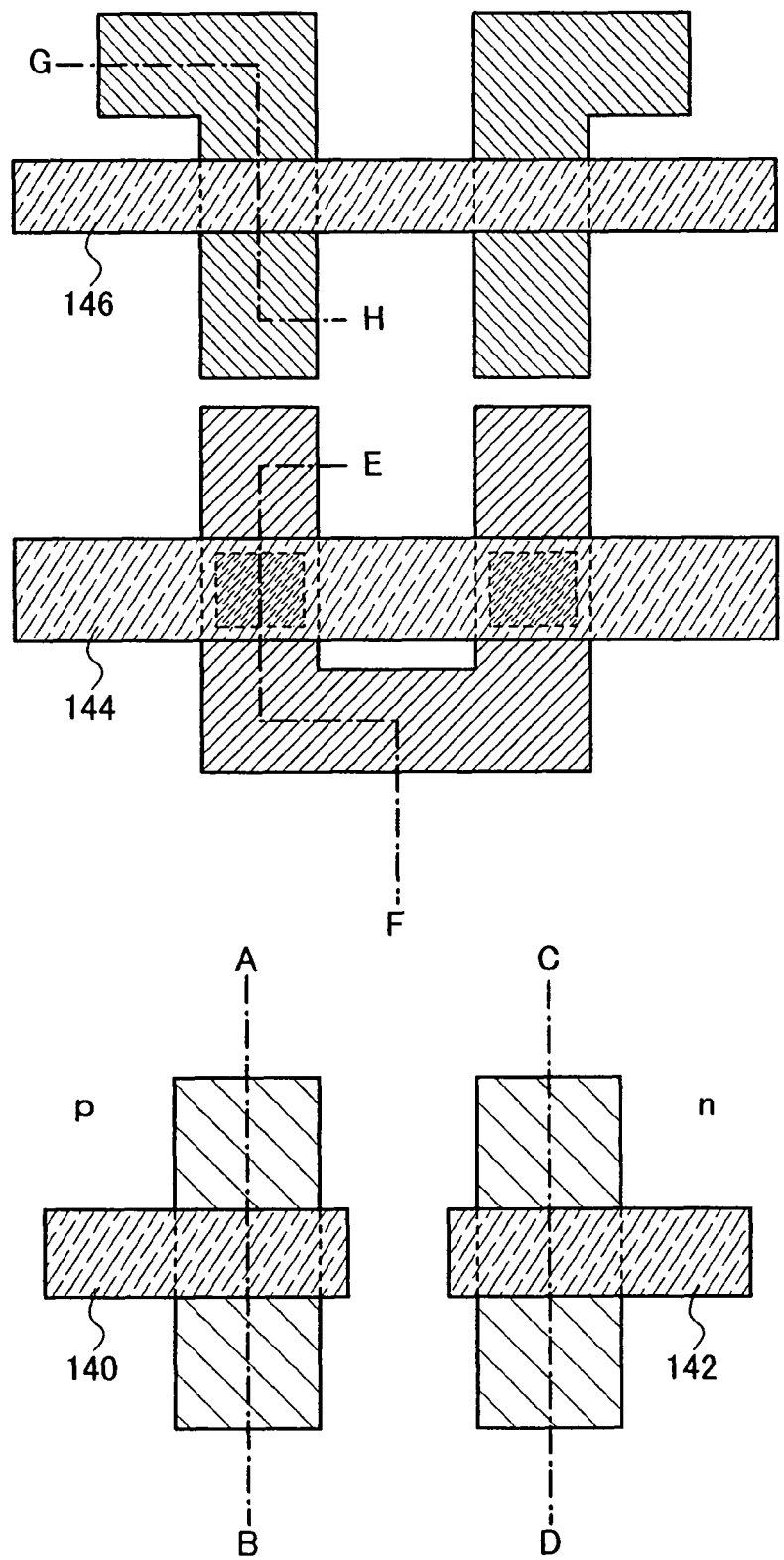
FIG. 40 is a view showing an example of a top view of a nonvolatile semiconductor memory device of the present invention.

This embodiment will explain a manufacturing method of a semiconductor device which is different from that of Embodiment 1 or 2 with reference to the drawings. It is to be noted that the same portions as those in Embodiment 1 or 2 are denoted by the same reference numerals, and explanation thereof will be omitted. FIGS. 39 to 41 show top views, and FIGS. 28A to 28C, 29A to 29C, and 30A to 30C show cross-sectional views taken along A-B, C-D, E-F, and G-H of FIGS. 39 to 41. A-B and C-D each show a thin film transistor provided in a logic portion, E-F shows a nonvolatile memory element provided in a memory portion, and G-H shows a thin film transistor provided in the memory portion.

First, components up through FIG. 18C of Embodiment 1 are similarly formed. Thereafter, an impurity element is introduced to a semiconductor layer 108 using a resist 122 as a mask, whereby an impurity region 190 is formed (refer to FIG. 28A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, as the impurity element, phosphorus (P) is introduced to the semiconductor layer 108. It is to be noted that, in this embodiment, the width of a stacked structure including charge accumulation layers 121 and 125 functioning as a floating gate is made smaller than that of the semiconductor layer 108. In other words, the stacked structure including the charge accumulation layers 121 and 125 is provided so as not to extend beyond the semiconductor layer 108 (so that the stacked structure including the charge accumulation layers 121 and 125, functioning as a floating gate, always overlaps with the semiconductor layer 108) (refer to FIG. 39).

Subsequently, a second insulating layer 128 is formed so as to cover semiconductor layers 104, 106, and 110, and a first insulating layer 116 and the stacked structure including the charge accumulation layers 121 and 125 formed over the semiconductor layer 108 (refer to FIG. 28B).

Next, a resist 130 is selectively formed so as to cover the second insulating layer 128 formed over the semiconductor layers 108 and 110, and the second insulating layer 128 formed over the semiconductor layers 104 and 106 is selectively removed (refer to FIG. 28C).

Then, third insulating layers 132 and 134 are formed so as to cover the semiconductor layers 104 and 106, respectively (refer to FIG. 29A).

A conductive film is formed so as to cover the third insulating layers 132 and 134 formed over the semiconductor layers 104 and 106, and the second insulating layer 128 formed over the semiconductor layers 108 and 110 (refer to FIG. 29B). In this embodiment, as the conductive film, an example is shown, in which conductive films 136 and 138 are sequentially stacked. Of course, the conductive film may have a single layer structure or a stacked structure including three or more layers.

Subsequently, the stacked conductive films 136 and 138 are selectively removed by etching, and the conductive films 136 and 138 are partially left over the semiconductor layers 104, 106, 108, and 110, whereby conductive films 140, 142, 144, and 146 each functioning as a gate electrode are formed (refer to FIGS. 29C and 40).

It is to be noted, in this embodiment, the width (the width in a direction almost parallel to a direction in which at least carriers flow in a channel forming region) of the conductive film 144 formed over the semiconductor layer 108 is made larger than that of the stacked structure including the charge accumulation layers 121 and 125.

Next, a resist 148 is selectively formed so as to cover the semiconductor layer 104, and an impurity element is introduced to the semiconductor layers 106, 108, and 110 using the resist 148 and the conductive films 142, 144, and 146 as masks, whereby an impurity region is formed (refer to FIG. 30A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, as the impurity element, phosphorus (P) is used.

In FIG. 30A, by introducing the impurity element, a high-concentration impurity region 152 which forms a source or drain region and a channel forming region 150 are formed in the semiconductor layer 106. In addition, in the semiconductor layer 108, an impurity region 156 which forms a source or drain region, a low-concentration impurity region 158 which forms an LDD region, and a channel forming region 154 are formed. Further, in the semiconductor layer 110, a high-concentration impurity region 162 which forms a source or drain region and a channel forming region 160 are formed.

Subsequently, a resist 166 is selectively formed so as to cover the semiconductor layers 106, 108, and 110. An impurity element is introduced to the semiconductor layer 104 using the resist 166 and the conductive film 140 as masks, whereby an impurity region is formed (refer to FIG. 30B). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, an impurity element having a different conductivity type from that of the impurity element introduced to the semiconductor layers 106, 108, and 110 in FIG. 30A (such as boron (B)) is used. As a result, in the semiconductor layer 104, a high-concentration impurity region 170 which forms a source or drain region and a channel forming region 168 are formed.

Next, an insulating layer 172 is formed so as to cover the second insulating layer 128, the third insulating layers 132 and 134, and the conductive films 140, 142, 144, and 146. Over the insulating layer 172, a conductive film 174 is formed so as to be electrically connected to the impurity regions 170, 152, 156, and 162 which are formed in the semiconductor layers 104, 106, 108, and 110, respectively (refer to FIGS. 30C and 41).

In this embodiment, the width of the stacked structure including the charge accumulation layers 121 and 125 functioning as a floating gate in the nonvolatile memory element is made smaller than that of the semiconductor layer 108 (refer to FIG. 40). The edge of the stacked structure including the charge accumulation layers 121 and 125 is formed over the semiconductor layer 108, and the conductive film 144 functioning as a control gate is formed so as to extend beyond the edge of the semiconductor layer 108. Therefore, characteristics of the nonvolatile memory element may be adversely affected when the edge of the stacked structure including the charge accumulation layers 121 and 125 is formed into an uneven shape by etching or the like in the manufacturing process. In addition, characteristics of the nonvolatile memory element may be adversely affected due to a coverage defect of the first insulating layer 116 or charges accumulated in the manufacturing process. Thus, in the above described structure, an impurity region 194 may be selectively provided in a region of the semiconductor layer 108, which overlaps with the edge of the stacked structure including the charge accumulation layers 121 and 125 (in this embodiment, the edge of the stacked structure including the charge accumulation layers 121 and 125 in a direction almost perpendicular to a direction in which carriers flow in a channel forming region (a direction connecting a source region and a drain region)) and the in the neighborhood thereof (refer to FIG. 42).

The impurity region 194 is provided so as to have a different conductivity type from that of the impurity region 156 functioning as a source or drain region in the semiconductor layer 108. For example, when the impurity region 156 is provided so as to have n-type conductivity, the impurity region 194 is provided so as to have p-type conductivity.

Figure 42:
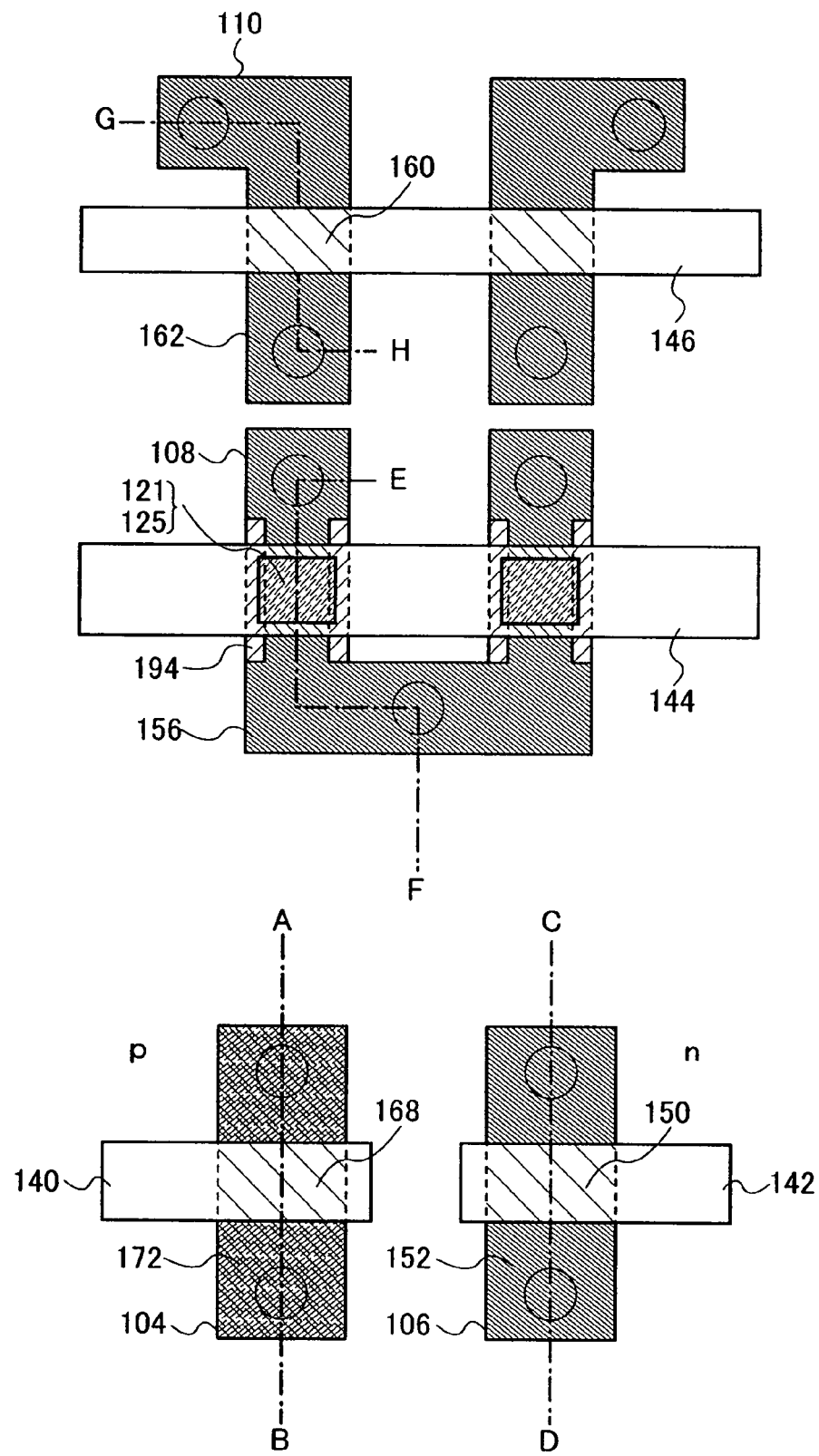
FIG. 42 is a view showing an example of a top view of a nonvolatile semiconductor memory device of the present invention.

In FIG. 42, the impurity region 194 is formed so as to extend to a region which does not overlap with the conductive film 144; however, the impurity region 194 may also be formed only in a region which overlaps with the conductive film 144. In addition, the impurity region 194 may be provided in all the peripheral portions of the semiconductor layer 108.

In such a manner, by providing the impurity region 194, resistance is enhanced due to a p-n junction in a portion where the impurity regions 156 and 194 are adjacent. Accordingly, characteristics of the nonvolatile memory element are prevented from being adversely affected due to a shape or the like of the edge of the stacked structure including the charge accumulation layers 121 and 125.

In this embodiment, the nonvolatile memory element in E-F is explained. However, the impurity region 194 may also be similarly provided in the transistors provided in A-B, C-D, and G-H as shown in FIGS. 35 to 42.

In the nonvolatile semiconductor memory device of this embodiment, low power consumption can be achieved by employing, depending on a configuration of a circuit, a different thickness of a gate insulating layer for a transistor. In addition, a stable operation of the nonvolatile semiconductor memory device can be achieved. Specifically, by formation of a thin gate insulating layer for a transistor included in a logic portion, variation in threshold voltage can be reduced, and the memory device can be driven at low voltage. By formation of a thick gate insulating layer for a selection transistor included in a memory portion, stability of an operation can be enhanced even when higher voltage than that in the logic portion is employed in writing and erasing operations in the nonvolatile memory element. In the nonvolatile memory element, charge can be easily injected from a semiconductor layer to the floating gate electrode, and the charge can be prevented from being discharged from the floating gate electrode. In other words, in the case of an operation as a memory, writing can be performed with very high efficiency at low voltage, and a charge-retention property can be improved. According to this embodiment, a nonvolatile semiconductor memory device which has the excellent effect as described above can be manufactured in sequential steps.

This embodiment can be executed by being combined with other embodiment mode or embodiments shown in this specification.

[Embodiment 5]

Figure 43:
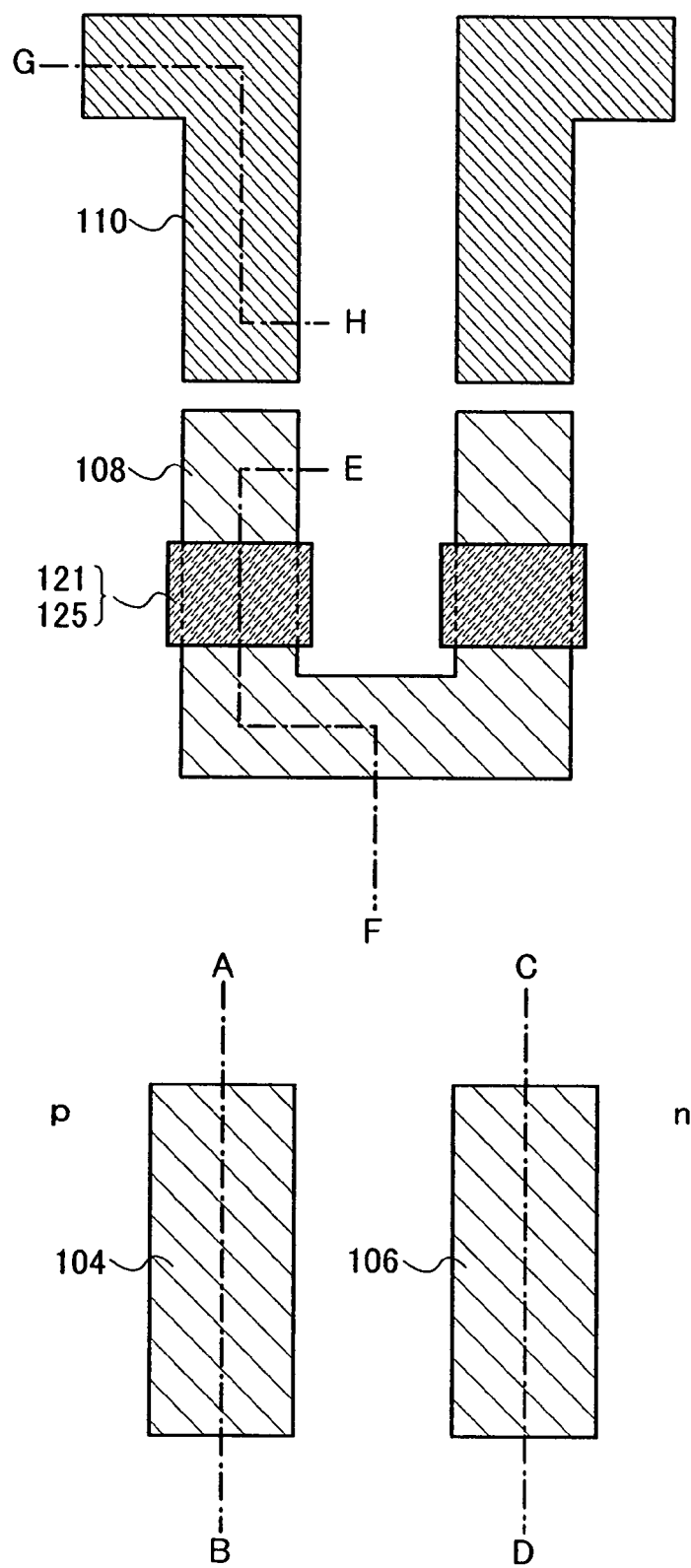
FIG. 43 is a view showing an example of a top view of a nonvolatile semiconductor memory device of the present invention.
Figure 44:
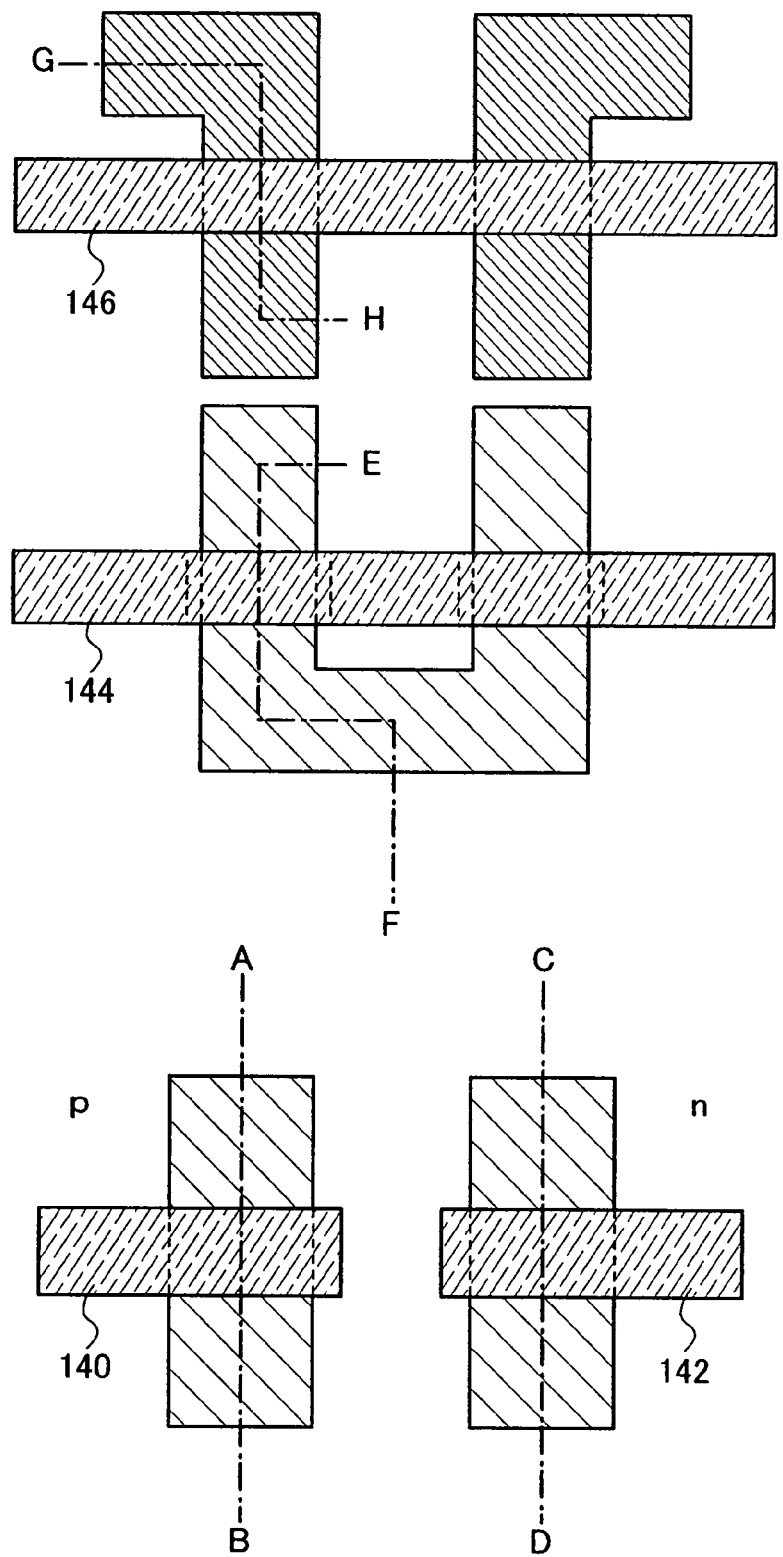
FIG. 44 is a view showing an example of a top view of a nonvolatile semiconductor memory device of the present invention.

This embodiment will explain a manufacturing method of a semiconductor device which is different from that of Embodiment 1, 2, or 3 with reference to the drawings. It is to be noted that the same portions as those in Embodiment 1, 2, or 3 are denoted by the same reference numerals, and explanation thereof will be omitted. FIGS. 43 to 45 show top views, and FIGS. 25A to 25C, 26A to 26C, and 27A to 27C show cross-sectional views taken along A-B, C-D, E-F, and G-H of FIGS. 43 to 45. A-B and C-D each show a thin film transistor provided in a logic portion, E-F shows a nonvolatile memory element provided in a memory portion, and G-H shows a thin film transistor provided in the memory portion.

First, components up through FIG. 18C are similarly formed. Thereafter, as shown in FIG. 19A, a resist is formed so as to selectively cover semiconductor layers 104, 106, and 108, and part of a semiconductor layer 110, and an impurity element is introduced to the semiconductor layer 110 which is not covered with the resist, whereby an impurity region 126 is formed. Then, the resist is removed, and a second insulating layer 128 is formed so as to cover the semiconductor layers 104, 106, and 110, and a first insulating layer 116 and a stacked structure including charge accumulation layers 120 and 123 formed over the semiconductor layer 108 (refer to FIGS. 25A and 43).

Next, a resist 130 is selectively formed so as to cover the second insulating layer 128 formed over the semiconductor layers 108 and 110, whereby the second insulating layer 128 formed over the semiconductor layers 104 and 106 is selectively removed (refer to FIG. 25B).

Then, third insulating layers 132 and 134 are formed so as to cover the semiconductor layers 104 and 106, respectively (refer to FIG. 25C).

A conductive film is formed so as to cover the third insulating layers 132 and 134 formed over the semiconductor layers 104 and 106, and the second insulating layer 128 formed over the semiconductor layers 108 and 110 (refer to FIG. 26A). In this embodiment, as the conductive film, an example is shown, in which conductive films 136 and 138 are sequentially stacked. Of course, the conductive film may also have a single layer structure or a stacked structure including three or more layers.

Subsequently, the stacked conductive films 136 and 138 are selectively removed by etching, and the conductive films 136 and 138 are partially left over the semiconductor layers 104, 106, 108, and 110, whereby conductive films 140, 142, 144, and 146 each functioning as a gate electrode are formed (refer to FIGS. 26B and 43). In addition, in this embodiment, the surfaces of the semiconductor layers 104, 106, 108, and 110 which do not overlap with the conductive films 140, 142, 144, and 146 are exposed.

Specifically, in the semiconductor layer 104, a portion of the third insulating layer 132 formed below the conductive film 140, which does not overlap with the conductive film 140, is selectively removed so that the edges of the conductive film 140 and the third insulating layer 132 are almost in alignment. In addition, in the semiconductor layer 106, a portion of the third insulating layer 134 formed below the conductive film 142, which does not overlap with the conductive film 142, is selectively removed so that the edges of the conductive film 142 and the third insulating layer 134 are almost in alignment. In addition, in the semiconductor layer 108, portions of the second insulating layer 128, a stacked structure including charge accumulation layers 120 and 123, and the first insulating layer 116 formed below the conductive film 144, which do not overlap with the conductive film 144, are selectively removed so that the edges of the conductive film 144, the second insulating layer 128, a stacked structure including charge accumulation layers 121 and 125, and the first insulating layer 116 are almost in alignment. In addition, in the semiconductor layer 110, a portion of the second insulating layer 128 formed below the conductive film 146, which does not overlap with the conductive film 146, is selectively removed so that the edges of the conductive film 146 and the second insulating layer 128 are almost in alignment (refer to FIG. 44).

In this case, an insulating layer and the like in a portion which does not overlap with the conductive films 140, 142, 144, and 146 may be removed at the same time as formation of the conductive films 140, 142, 144, and 146. Alternatively, after the conductive films 140, 142, 144, and 146 are formed, an insulating layer and the like in a portion which does not overlap with the conductive films 140, 142, 144, and 146 may be removed using the left resist or the conductive films 140, 142, 144, and 146 as masks.

Then, a resist 148 is selectively formed so as to cover the semiconductor layer 104. An impurity element is introduced to the semiconductor layers 106, 108, and 110 using the resist 148, and the conductive films 142, 144, and 146 as masks, whereby an impurity region is formed (refer to FIG. 26C). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, as the impurity element, phosphorus (P) is used.

In FIG. 26C, by introducing the impurity element, an impurity region 152 which forms a source or drain region and a channel forming region 150 are formed in the semiconductor layer 106. In addition, in the semiconductor layer 108, an impurity region 156 which forms a source or drain region and a channel forming region 154 are formed. Further, in the semiconductor layer 110, a high-concentration impurity region 162 which forms a source or drain region, a low-concentration impurity region 164 which forms an LDD region, and a channel forming region 160 are formed.

Then, a resist 166 is selectively formed so as to cover the semiconductor layers 106, 108, and 110. An impurity element is introduced to the semiconductor layer 104 using the resist 166 and the conductive film 140 as masks, whereby an impurity region is formed (refer to FIG. 27A). As the impurity element, an impurity element imparting n-type conductivity or an impurity element imparting p-type conductivity is used. As the impurity element imparting n-type conductivity, phosphorus (P), arsenic (As), or the like can be used. As the impurity element imparting p-type conductivity, boron (B), aluminum (Al), gallium (Ga), or the like can be used. In this embodiment, an impurity element having a different conductivity type from that of the impurity element introduced to the semiconductor layers 106, 108, and 110 in FIG. 26C (such as boron (B)) is used. As a result, an impurity region 170 which forms a source or drain region and a channel forming region 168 are formed in the semiconductor layer 104.

Figures 27A, 27B, 27C:
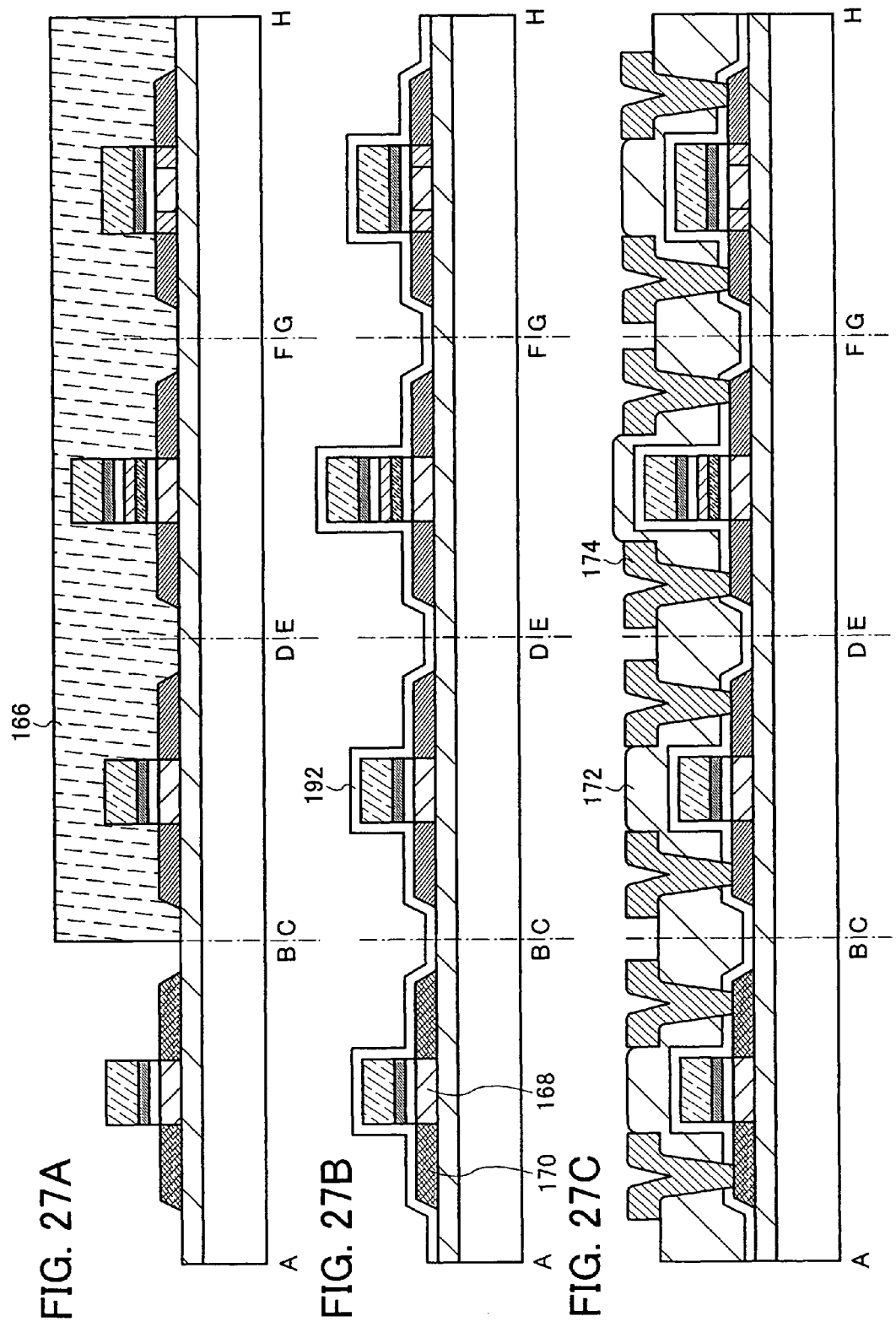
FIGS. 27A to 27C are views each showing an example of a manufacturing method of a nonvolatile semiconductor memory device of the present invention.

It is to be noted that, in this embodiment, an impurity element is introduced in FIGS. 26C and 27A in a state where the semiconductor layers 104, 106, 108, and 110, which do not overlap with the conductive films 140, 142, 144, and 146, are exposed. Therefore, the channel forming regions 150, 154, 160 and 168, which are formed in the semiconductor layers 104, 106, 108, and 110, respectively, can be formed in a self-alignment manner with the conductive films 140, 142, 144, and 146.

An insulating layer 192 is formed so as to cover the exposed semiconductor layers 104, 106, 108, and 110, and the conductive films 140, 142, 144, and 146 (refer to FIG. 27B).

The insulating layer 192 is formed by a CVD method, a sputtering method, or the like using an insulating layer containing oxygen or nitrogen such as silicon oxide (SiOx), silicon nitride (SiNx), silicon oxynitride (SiOxNy, (x>y)), or silicon nitride oxide (SiNxOy, (x>y)), DLC (diamond like carbon), or the like with a single layer structure or a stacked structure.

An insulating layer 172 is formed so as to cover the second insulating layer 128, the third insulating layers 132 and 134, and the conductive films 140, 142, 144, and 146. Over the insulating layer 172, a conductive film 174 is formed so as to be electrically connected to the impurity regions 170, 152, 156, and 162 which are formed in the semiconductor layers 104, 106, 108, and 110, respectively (refer to FIGS. 27C and 45).

As the insulating layer 172, any of the materials explained in Embodiment 1 can be used. For example, the insulating layer 192 can be formed using an insulating layer containing an inorganic material having oxygen or nitrogen such as silicon oxide (SiOx), silicon nitride (SiNx), silicon oxynitride (SiOxNy, (x>y)), or silicon nitride oxide (SiNxOy, (x>y)), and the insulating layer 172 can be formed using an organic material such as epoxy, polyimide, polyamide, polyvinyl phenol, benzocyclobutene, or acrylic. Of course, both the insulating layer 192 and the insulating layer 172 may be formed using an insulating layer containing an inorganic material.

It is to be noted that, in this embodiment, an LDD region can be formed using a sidewall in each of the semiconductor layers 104, 106, 108, and 110. For example, after components up through FIG. 26B are formed, an impurity element is introduced at a low concentration to the semiconductor layers 104, 106, 108, and 110 using the conductive films 140, 142, 144, and 146 as masks. Thereafter, an insulating layer (also referred to as a sidewall) 198 is formed so as to be in contact with each side surface of the conductive films 140, 142, 144, and 146 (refer to FIG. 31A).

An impurity element is introduced at a high concentration using the insulating layer 198, and the conductive films 140, 142, 144, and 146 as masks, whereby a high-concentration impurity region 170 which forms a source or drain region, a low-concentration impurity region 188 which forms an LDD region, and a channel forming region 168 are formed in the semiconductor layer 104. In addition, in the semiconductor layer 106, a high-concentration impurity region 152 which forms a source or drain region, a low-concentration impurity region 186 which forms an LDD region, and a channel forming region 150 are formed. In addition, in the semiconductor layer 108, an impurity region 156 which forms a source or drain region, a low-concentration impurity region 158 which forms an LDD region, and a channel forming region 154 are formed. In addition, in the semiconductor layer 110, a high-concentration impurity region 162 which forms a source or drain region, a low-concentration impurity region 164 which forms an LDD region, and a channel forming region 160 are formed (refer to FIG. 31A).

As for a method for forming the insulating layer 198, a film containing an inorganic material such as silicon, an oxide of silicon, or a nitride of silicon, or a film containing an organic material such as an organic resin is formed by a plasma CVD method, a sputtering method, or the like with a single layer structure or a stacked structure. Then, the above insulating layer is selectively etched by anisotropic etching mainly in a perpendicular direction so as to be in contact with each side surface of the conductive films 140, 142, 144, and 146. It is to be noted that the insulating layer 198 is used as a mask for doping when an LDD (Lightly Doped Drain) region is formed. In this embodiment, the insulating layer 198 is formed so as to be also in contact with each side surface of the insulating layer and the charge accumulation layer formed below the conductive films 140, 142, 144, and 146.

Thereafter, as described above, the insulating layers 192 and 172, and the conductive film 174 are formed, whereby a nonvolatile semiconductor memory device can be obtained (refer to FIG. 31B).

In the structure shown in this embodiment, the width of the stacked structure including the charge accumulation layers 121 and 125 functioning as a floating gate may be smaller than that of the semiconductor layer 108 as shown in Embodiment 3. In addition, in the structure shown in this embodiment, an impurity region 194 may be provided as shown in FIGS. 35 and 36.

In the nonvolatile semiconductor memory device of this embodiment, low power consumption can be achieved by employing, depending on a configuration of a circuit, a different thickness of a gate insulating layer for a transistor. In addition, a stable operation of the nonvolatile semiconductor memory device can be achieved. Specifically, by formation of a thin gate insulating layer for a transistor included in a logic portion, variation in threshold voltage can be reduced, and the memory device can be driven at low voltage. By formation of a thick gate insulating layer for a selection transistor included in a memory portion, stability of an operation can be enhanced even when higher voltage than that in the logic portion is employed in writing and erasing operations in the nonvolatile memory element. In the nonvolatile memory element, charges can be easily injected from a semiconductor layer to a floating gate electrode, and the charges can be prevented from being discharged from the floating gate electrode. In other words, in the case of an operation as a memory, writing can be performed with very high efficiency at low voltage, and a charge-retention property can be improved. According to this embodiment, a nonvolatile semiconductor memory device which has the excellent effect as described above can be manufactured in sequential steps.

This embodiment can be executed by being combined with other embodiment mode or embodiments shown in this specification.

[Embodiment 6]

This embodiment will explain an application example of a semiconductor device which is provided with the nonvolatile semiconductor memory device of the present invention and in which data can be input/output without contact, with reference to the drawings. The semiconductor device in which data can be input/output without contact is also referred to as an RFID tag, an ID tag, an IC tag, an IC chip, an RF tag, a wireless tag, an electronic tag, or a wireless chip depending on the usage.

Figure 46A:
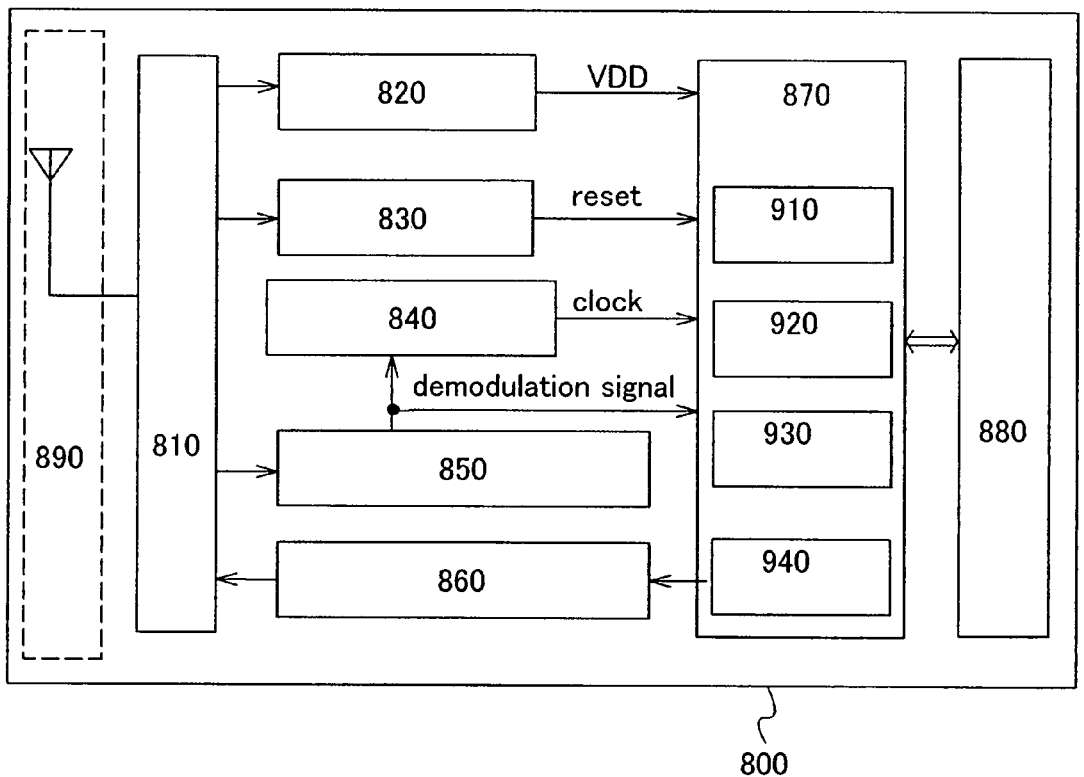
FIGS. 46A to 46C are views each showing an example of a usage pattern of a nonvolatile semiconductor memory device of the present invention.

A semiconductor device 800 has a function of exchanging data without contact, and includes a high-frequency circuit 810, a power source circuit 820, a reset circuit 830, a clock generating circuit 840, a data demodulating circuit 850, a data modulating circuit 860, a controlling circuit 870 for controlling other circuits, a memory circuit 880, and an antenna 890 (FIG. 46A). The high-frequency circuit 810 receives a signal from the antenna 890. In addition, the high-frequency circuit 810 outputs a signal, which is received from the data modulating circuit 860, from the antenna 890. The power source circuit 820 generates power source potential from a received signal. The reset circuit 830 generates a reset signal. The clock generating circuit 840 generates various clock signals based on a received signal input from the antenna 890. The data demodulating circuit 850 demodulates a received signal and outputs the demodulated signal to the controlling circuit 870. The data modulating circuit 860 modulates a signal received from the controlling circuit 870. As the controlling circuit 870, for example, a code extracting circuit 910, a code judging circuit 920, a CRC judging circuit 930, and an output unit circuit 940 are provided. It is to be noted that the code extracting circuit 910 extracts each of a plurality of codes included in an instruction sent to the controlling circuit 870. The code judging circuit 920 judges the content of the instruction by comparing the extracted code with a code corresponding to a reference. The CRC judging circuit 930 detects whether or not there is a transmission error or the like based on the judgment code.

Subsequently, an example of an operation of the aforementioned semiconductor device will be explained. First, a wireless signal is received by the antenna 890 and then sent to the power source circuit 820 through the high-frequency circuit 810, whereby high power source potential (hereinafter referred to as VDD) is generated. The VDD is supplied to each circuit in the semiconductor device 800. A signal sent to the data demodulating circuit 850 through the high-frequency circuit 810 is demodulated (hereinafter, this signal is referred to as a demodulated signal). Moreover, signals passed through the reset circuit 830 and the clock generating circuit 840 through the high-frequency circuit 810, and the demodulated signal are sent to the controlling circuit 870. The signals sent to the controlling circuit 870 are analyzed by the code extracting circuit 910, the code judging circuit 920, the CRC judging circuit 930, and the like. Then, based on the analyzed signals, information of the semiconductor device stored in the memory circuit 880 is output. The output information of the semiconductor device is encoded through the output unit circuit 940. Further, the encoded information of the semiconductor device 800 passes through the data modulating circuit 860 and then is sent by the antenna 890 as a wireless signal. It is to be noted that low power source potential (hereinafter referred to as VSS) is common in the plurality of circuits included in the semiconductor device 800 and VSS can be GND. In addition, the nonvolatile semiconductor memory device of the present invention can be applied to the memory circuit 880. In the nonvolatile semiconductor memory device of the present invention, drive voltage can be reduced, and a distance for exchanging data without contact can be lengthened.

In this manner, when a signal is sent from a reader/writer to the semiconductor device 800 and a signal sent from the semiconductor device 800 is received by the reader/writer, the data of the semiconductor device can be read.

Moreover, in the semiconductor device 800, power source voltage may be supplied to each circuit by electromagnetic waves without mounting a power source (battery), or a power source (battery) may be mounted so that power source voltage is supplied to each circuit by both electromagnetic waves and the power source (battery).

Figure 46B:
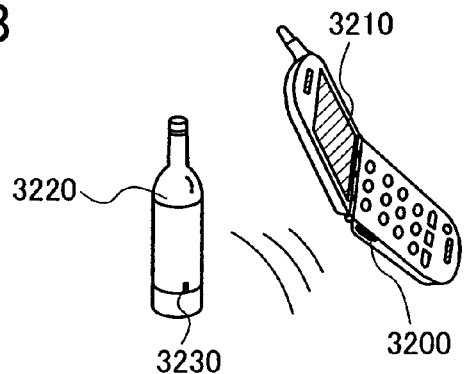
Figure 46C:
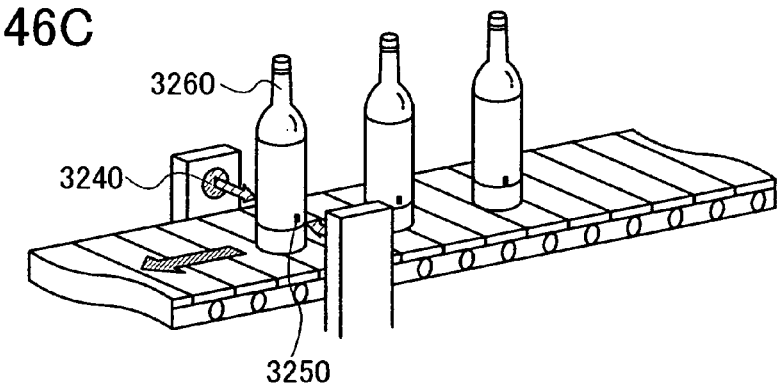

Next, an example of a usage pattern of a semiconductor device in which data can be input/output without contact will be explained. A side of a portable terminal including a display portion 3210 is provided with a reader/writer 3200. A side of a product 3220 is provided with a semiconductor device 3230 (FIG. 46B). When the reader/writer 3200 is held over the semiconductor device 3230 included in the product 3220, the display portion 3210 displays information on the product, such as a material, a production area, an inspection result for each production step, history of circulation process, and description of the product. In addition, when a product 3260 is transferred by a conveyer belt, the product 3260 can be inspected with the use of a semiconductor device 3250 provided on the product 3260 and a reader/writer 3240 (FIG. 46C). In this manner, through application of the semiconductor device in such a system, information can be easily obtained and higher performance and higher added value are achieved.

The nonvolatile semiconductor memory device of the present invention can be applied to electronic devices provided with a memory in various fields. For example, the nonvolatile semiconductor memory device of the present invention can be applied to electronic devices such as a camera such as a video camera or a digital camera, a goggle type display (a head-mounted display), a navigation system, an audio reproducing device (such as a car audio system or an audio component set), a computer, a game machine, a portable information terminal (such as a mobile computer, a mobile phone, a portable game machine, or an electronic book), and an image reproducing device provided with a recording medium (specifically, a device which reproduces a recording medium such as a DVD (Digital Versatile Disc) and has a display capable of displaying the reproduced image). FIGS. 17A to 17E specifically show examples of these electronic devices.

Figure 17A:
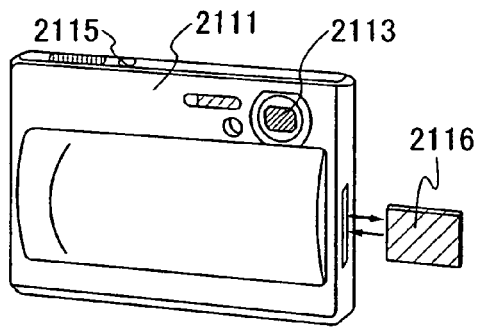
FIGS. 17A to 17E are views each showing an example of a usage pattern of a nonvolatile semiconductor memory device of the present invention.
Figure 17B:
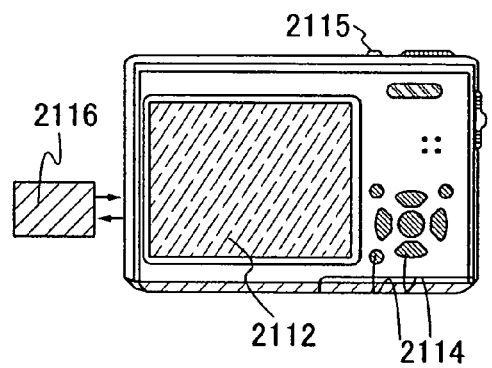

FIGS. 17A and 17B show a digital camera. FIG. 17B shows a rear side of FIG. 17A. This digital camera includes a chassis 2111, a display portion 2112, a lens 2113, operation keys 2114, a shutter 2115, and the like. Further, a nonvolatile memory 2116 which can be removed is provided, and data obtained by the digital camera is stored in the nonvolatile memory 2116. The nonvolatile semiconductor memory device formed using the present invention can be applied to the nonvolatile memory 2116.

Figure 17C:
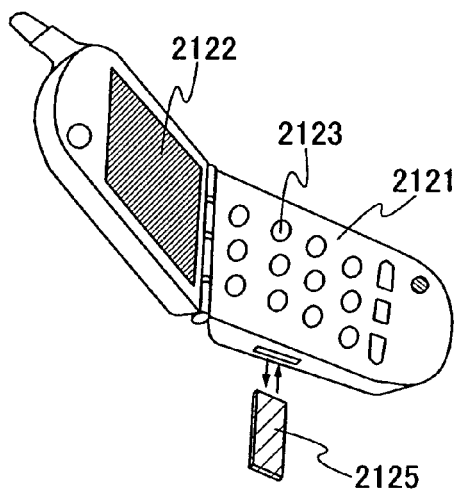

FIG. 17C shows a mobile phone which is a typical example of the portable terminals. This mobile phone includes a chassis 2121, a display portion 2122, operation keys 2123, and the like. Further, a nonvolatile memory 2125 which can be removed is provided in the mobile phone, and data such as a phone number of the mobile phone, image data, sound data, and the like can be stored in the nonvolatile memory 2125 and reproduced. The nonvolatile semiconductor memory device formed using the present invention can be applied to the nonvolatile memory 2125.

Figure 17D:
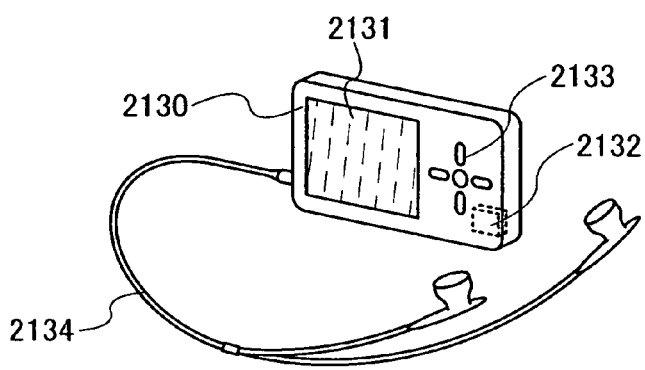

FIG. 17D shows a digital player which is a typical example of the audio sets. The digital player shown in FIG. 17D includes a main body 2130, a display portion 2131, a nonvolatile memory portion 2132, an operation portion 2133, an earphone 2134, and the like. A headphone or a wireless earphone can be used instead of the earphone 2134. The nonvolatile semiconductor memory device formed using the present invention can be applied to the nonvolatile memory portion 2132. For example, the operation portion 2133 is operated with the use of a NAND type nonvolatile memory having a memory capacity of 20 to 200 gigabytes, and thus, image or sound (music) can be recorded and reproduced. It is to be noted that power consumption of the display portion 2131 can be suppressed through display of white characters on the black background. This is particularly effective in a portable audio set. The nonvolatile semiconductor memory device provided in the nonvolatile memory portion 2132 may also be removed.

Figure 17E:
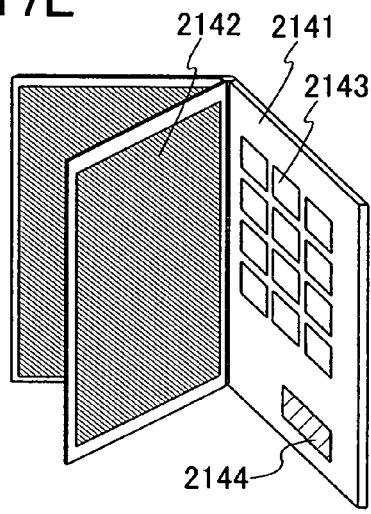

FIG. 17E shows an electronic book (also referred to as electronic paper). This electronic book includes a main body 2141, a display portion 2142, operation keys 2143, and a nonvolatile memory portion 2144. In addition, a modem may be incorporated in the main body 2141, or data can be transmitted and received wirelessly. The nonvolatile semiconductor memory device formed using the present invention can be applied to the nonvolatile memory portion 2144. For example, the operation keys 2143 are operated with the use of a NAND type nonvolatile memory having a memory capacity of 20 to 200 gigabytes, and thus, image or sound (music) can be recorded and reproduced. The nonvolatile semiconductor memory device provided in the nonvolatile memory portion 2144 may also be removed.

As described above, the applicable range of the nonvolatile semiconductor memory device of the present invention is extremely wide and can be used for electronic devices in various fields as long as they have a memory.

This application is based on Japanese Patent Application serial No. 2006-077894 filed in Japan Patent Office on Mar. 21, 2006, the entire contents of which are hereby incorporated by reference.

What is claimed is:

1. A nonvolatile semiconductor memory device comprising:
   a substrate;
   a semiconductor layer over the substrate, the semiconductor layer including a channel forming region between a pair of impurity regions which are formed apart from each other;
   a first insulating layer over the semiconductor layer;
   a floating gate over the channel forming region with the first insulating layer interposed therebetween;
   a second insulating layer over the floating gate; and
   a control gate over the floating gate with the second insulating layer interposed therebetween,
   wherein the floating gate includes at least a first layer which is in contact with the first insulating layer and a second layer formed over the first layer, and the first layer comprises germanium and oxygen,
   wherein the semiconductor layer is an island-like semiconductor layer formed on an insulating surface,
   wherein the first insulating layer covers the channel forming region and the pair of impurity regions, and
   wherein the semiconductor layer comprises a low-concentration impurity region which overlaps with the control gate, does not overlap with the floating gate, and has the same conductivity type as a conductivity type of the pair of impurity regions.

2. The nonvolatile semiconductor memory device according to claim 1, wherein the first insulating layer comprises a layer in which a silicon oxide layer and a silicon nitride layer are sequentially stacked from the semiconductor layer side.

3. The nonvolatile semiconductor memory device according to claim 1, wherein a plurality of floating gates and control gates are arranged over the semiconductor layer.

4. The nonvolatile semiconductor memory device according to claim 1, wherein an edge of the floating gate in a channel length direction extends beyond an edge of the control gate in the channel length direction.

5. The nonvolatile semiconductor memory device according to claim 1, wherein an edge of the control gate in a channel length direction extends beyond an edge of the floating gate in the channel length direction.

6. The nonvolatile semiconductor memory device according to claim 1, wherein an edge of the floating gate in a channel width direction is provided over the semiconductor layer and an impurity region having a conductivity type which is different from a conductivity type of the pair of impurity regions.

7. The nonvolatile semiconductor memory device according to claim 1, wherein the first insulating layer comprises a silicon oxide layer and a silicon nitride layer, wherein the floating gate is in contact with the silicon nitride layer.

8. The nonvolatile semiconductor memory device according to claim 1, wherein the first insulating layer comprises a silicon oxide layer formed by a plasma treatment to the semiconductor layer and a silicon nitride layer formed by a plasma treatment to the silicon oxide layer.

9. The nonvolatile semiconductor memory device according to claim 1, wherein the second layer comprises metal oxide.

10. The nonvolatile semiconductor memory device according to claim 1, wherein the second layer comprises metal nitride.

11. A nonvolatile semiconductor memory device comprising:
a semiconductor layer including a channel forming region between a pair of impurity regions which are formed apart from each other;
a first insulating layer over the channel forming region;
a floating gate over the channel forming region with the first insulating layer interposed therebetween;
a second insulating layer over the floating gate; and
a control gate over the floating gate with the second insulating layer interposed therebetween,
wherein the floating gate includes at least a first layer which is in contact with the first insulating layer and a second layer formed over the first layer, and the first layer comprises germanium and oxygen,
wherein an edge of the first layer in a channel length direction and an edge of the second layer in the channel length direction are substantially aligned, and
wherein the semiconductor layer comprises a low-concentration impurity region which overlaps with the control gate, does not overlap with the floating gate, and has the same conductivity type as a conductivity type of the pair of impurity regions.

12. A nonvolatile semiconductor memory device according to claim 11, wherein the first insulating layer comprises a layer in which a silicon oxide layer and a silicon nitride layer are sequentially stacked from the semiconductor layer side.

13. A nonvolatile semiconductor memory device according to claim 11, wherein the semiconductor layer is an island-like semiconductor layer formed on an insulating surface.

14. The nonvolatile semiconductor memory device according to claim 11, wherein a plurality of floating gates and control gates are arranged over the semiconductor layer.

15. The nonvolatile semiconductor memory device according to claim 11, wherein an edge of the floating gate in the channel length direction extends beyond an edge of the control gate in the channel length direction.

16. The nonvolatile semiconductor memory device according to claim 11, wherein an edge of the control gate in the channel length direction extends beyond an edge of the floating gate in the channel length direction.

17. The nonvolatile semiconductor memory device according to claim 11, wherein an edge of the floating gate in a channel width direction is provided over the semiconductor layer and an impurity region having a conductivity type which is different from a conductivity type of the pair of impurity regions.

18. The nonvolatile semiconductor memory device according to claim 11, wherein the first insulating layer comprises a silicon oxide layer and a silicon nitride layer, wherein the floating gate is in contact with the silicon nitride layer.

19. The nonvolatile semiconductor memory device according to claim 11, wherein the first insulating layer comprises a silicon oxide layer formed by a plasma treatment to the semiconductor layer and a silicon nitride layer formed by a plasma treatment to the silicon oxide layer.

20. The nonvolatile semiconductor memory device according to claim 11, wherein the second layer comprises metal oxide.

21. The nonvolatile semiconductor memory device according to claim 11, wherein the second layer comprises metal nitride.

22. A nonvolatile semiconductor memory device comprising:
a substrate;
a semiconductor layer over the substrate, the semiconductor layer including a channel forming region between a pair of impurity regions which are formed apart from each other;
a first insulating layer over the semiconductor layer;
a floating gate over the channel forming region with the first insulating layer interposed therebetween;
a second insulating layer over the floating gate; and
a control gate over the floating gate with the second insulating layer interposed therebetween,
wherein the floating gate includes at least a first layer which is in contact with the first insulating layer and a second layer formed over the first layer, and the first layer comprises germanium and oxygen and has a thickness of greater than or equal to 1 nm and less than or equal to 20 nm,
wherein the semiconductor layer is an island-like semiconductor layer formed on the substrate,
wherein the first insulating layer covers the channel forming region and the pair of impurity regions, and
wherein the semiconductor layer comprises a low-concentration impurity region which overlaps with the control gate, does not overlap with the floating gate, and has the same conductivity type as a conductivity type of the pair of impurity regions.

23. A nonvolatile semiconductor memory device according to claim 22, wherein the first insulating layer comprises a layer in which a silicon oxide layer and a silicon nitride layer are sequentially stacked from the semiconductor layer side.

24. The nonvolatile semiconductor memory device according to claim 22, wherein a plurality of floating gates and control gates are arranged over the semiconductor layer.

25. The nonvolatile semiconductor memory device according to claim 22, wherein an edge of the floating gate in a channel length direction extends beyond an edge of the control gate in the channel length direction.

26. The nonvolatile semiconductor memory device according to claim 22, wherein an edge of the control gate in a channel length direction extends beyond an edge of the floating gate in the channel length direction.

27. The nonvolatile semiconductor memory device according to claim 22, wherein an edge of the floating gate in a channel width direction is provided over the semiconductor layer and an impurity region having a conductivity type which is different from a conductivity type of the pair of impurity regions.

28. The nonvolatile semiconductor memory device according to claim 22, wherein the first insulating layer comprises a silicon oxide layer and a silicon nitride layer, wherein the floating gate is in contact with the silicon nitride layer.

29. The nonvolatile semiconductor memory device according to claim 22, wherein the first insulating layer comprises a silicon oxide layer formed by a plasma treatment to the semiconductor layer and a silicon nitride layer formed by a plasma treatment to the silicon oxide layer.

30. The nonvolatile semiconductor memory device according to claim 22, wherein the second layer comprises metal oxide.

31. The nonvolatile semiconductor memory device according to claim 22, wherein the second layer comprises metal nitride.

* * * * *